US012604498B2

(12) United States Patent
Onuki et al.

(10) Patent No.: US 12,604,498 B2
(45) Date of Patent: Apr. 14, 2026

(54) MEMORY DEVICE

(71) Applicant: Semiconductor Energy Laboratory Co., Ltd., Atsugi (JP)

(72) Inventors: Tatsuya Onuki, Atsugi (JP); Kiyoshi Kato, Atsugi (JP); Tomoaki Atsumi, Hadano (JP); Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/624,513

(22) Filed: Apr. 2, 2024

(65) Prior Publication Data

US 2024/0250182 A1     Jul. 25, 2024

Related U.S. Application Data

(63) Continuation of application No. 17/261,665, filed as application No. PCT/IB2019/056433 on Jul. 29, 2019, now Pat. No. 11,961,916.

(30) Foreign Application Priority Data

Aug. 9, 2018    (JP) ................................. 2018-150387
Aug. 9, 2018    (JP) ................................. 2018-150595

(51) Int. Cl.
| | |
|---|---|
| *H10D 30/67* | (2025.01) |
| *H10B 12/00* | (2023.01) |
| *H10D 64/23* | (2025.01) |

(52) U.S. Cl.
CPC ......... *H10D 30/6755* (2025.01); *H10B 12/31* (2023.02); *H10D 30/6729* (2025.01);
(Continued)

(58) Field of Classification Search
CPC ......... H01L 29/41733; H01L 29/41775; H01L 29/42384; H01L 29/78648; H01L 25/0657;
(Continued)

(56) References Cited

U.S. PATENT DOCUMENTS

| | | | |
|---|---|---|---|
| 5,298,775 | A | 3/1994 | Ohya |
| 6,072,711 | A | 6/2000 | Kang |

(Continued)

FOREIGN PATENT DOCUMENTS

| | | |
|---|---|---|
| CN | 101174648 A | 5/2008 |
| DE | 102006049155 | 5/2008 |

(Continued)

OTHER PUBLICATIONS

International Search Report (Application No. PCT/IB2019/056433) Dated Oct. 1, 2019.

(Continued)

*Primary Examiner* — Shahed Ahmed
(74) *Attorney, Agent, or Firm* — Eric J. Robinson; Robinson Intellectual Property Law Office, P.C.

(57) ABSTRACT

A novel memory device is provided. The memory device includes a plurality of first wirings extending in a first direction, a plurality of memory element groups, and an oxide layer extending along a side surface of the first wiring. Each of the memory element groups includes a plurality of memory elements. Each of the memory elements includes a first transistor and a capacitor. A gate electrode of the first transistor is electrically connected to the first wiring. The oxide layer includes a region in contact with a semiconductor layer of the first transistor. A second transistor is provided between the adjacent memory element groups. A high power supply potential is supplied to one or both of a source electrode and a drain electrode of the second transistor.

10 Claims, 31 Drawing Sheets

(52) U.S. Cl.
 CPC ....... *H10D 30/673* (2025.01); *H10D 30/6757*
  (2025.01); *H10D 64/258* (2025.01)
(58) Field of Classification Search
 CPC . H01L 29/7869–78693; H01L 29/786–78696;
  H01L 27/12–13; H01L 28/40–92; H10B
  12/31; H10B 12/05; H10B 12/10; H10B
  12/00–50; G11C 11/4091; G11C 11/4094;
  G11C 11/4097; G11C 11/404; H10K
  10/46–491; H10D 30/6755; H10D
  30/6729; H10D 30/673; H10D 30/6757;
  H10D 64/258
 See application file for complete search history.

(56) References Cited

U.S. PATENT DOCUMENTS

| | | | |
|---|---|---|---|
| 6,091,622 | A | 7/2000 | Kang |
| 6,091,623 | A | 7/2000 | Kang |
| 6,091,624 | A | 7/2000 | Kang |
| 6,118,687 | A | 9/2000 | Kang |
| 6,125,051 | A | 9/2000 | Kang |
| 6,128,213 | A | 10/2000 | Kang |
| 6,335,893 | B1 | 1/2002 | Tanaka et al. |
| 6,418,043 | B1 | 7/2002 | Kang |
| 6,514,818 | B1 | 2/2003 | Kang |
| 6,535,435 | B2 | 3/2003 | Tanaka et al. |
| 6,898,109 | B2 | 5/2005 | Hirose et al. |
| 6,949,441 | B2 | 9/2005 | Kang |
| 7,002,866 | B2 | 2/2006 | Hirose et al. |
| 7,053,434 | B2 | 5/2006 | Kang |
| 7,910,986 | B2 | 3/2011 | Takaishi |
| 7,956,387 | B2 | 6/2011 | Schloesser |
| 8,614,916 | B2 | 12/2013 | Nagatsuka et al. |
| 8,754,409 | B2 | 6/2014 | Yamazaki et al. |
| 9,001,563 | B2 | 4/2015 | Atsumi et al. |
| 9,287,408 | B2 | 3/2016 | Yamazaki et al. |
| 9,443,563 | B2 | 9/2016 | Atsumi et al. |
| 9,548,395 | B2 | 1/2017 | Yamazaki et al. |
| 9,679,634 | B2 | 6/2017 | Takahashi |
| 9,818,472 | B2 | 11/2017 | Takahashi |
| 9,859,443 | B2 | 1/2018 | Yamazaki et al. |
| 9,966,473 | B2 | 5/2018 | Endo |
| 10,546,958 | B2 | 1/2020 | Endo |
| 10,573,374 | B2 | 2/2020 | Ishizu et al. |
| 11,450,674 | B2 * | 9/2022 | Moriwaki ............ H10D 84/859 |
| 2006/0028892 | A1 | 2/2006 | Kang |
| 2008/0121961 | A1 | 5/2008 | Schloesser |
| 2012/0107729 | A1 | 5/2012 | Blatchford et al. |
| 2012/0241739 | A1 | 9/2012 | Yamazaki et al. |
| 2012/0275214 | A1 | 11/2012 | Atsumi et al. |
| 2013/0246983 | A1 * | 9/2013 | Blatchford .............. G06F 30/00 |
| | | | 716/55 |
| 2014/0252353 | A1 | 9/2014 | Yamazaki et al. |
| 2015/0213842 | A1 | 7/2015 | Atsumi et al. |
| 2015/0325303 | A1 | 11/2015 | Hashimoto et al. |
| 2015/0380417 | A1 | 12/2015 | Yamazaki et al. |
| 2016/0172010 | A1 * | 6/2016 | Kato ................... G11C 29/028 |
| | | | 365/72 |
| 2017/0077308 | A1 | 3/2017 | Yamazaki et al. |
| 2017/0170326 | A1 * | 6/2017 | Tsubuku ............... H10D 86/60 |
| 2017/0271341 | A1 * | 9/2017 | Tanaka .................. H10B 12/50 |
| 2018/0114578 | A1 | 4/2018 | Ishizu et al. |
| 2020/0211628 | A1 | 7/2020 | Ishizu et al. |

FOREIGN PATENT DOCUMENTS

| | | | |
|---|---|---|---|
| EP | | 0449422 A | 10/1991 |
| JP | | 04-211164 A | 8/1992 |
| JP | | 11-306765 A | 11/1999 |
| JP | | 2008-078645 A | 4/2008 |
| JP | | 2009-010366 A | 1/2009 |
| JP | | 2012-216802 A | 11/2012 |
| JP | | 2012-256400 A | 12/2012 |
| JP | | 2012-256408 A | 12/2012 |
| JP | | 2014-007431 A | 1/2014 |
| JP | | 2014-039058 A | 2/2014 |
| JP | | 2014-132699 A | 7/2014 |
| JP | | 2015-216179 A | 12/2015 |
| JP | | 2015-216203 A | 12/2015 |
| JP | | 2016-213468 A | 12/2016 |
| JP | | 2017-120937 A | 7/2017 |
| JP | | 2017-162538 A | 9/2017 |
| JP | | 2018-073453 A | 5/2018 |
| JP | | 2018-133594 A | 8/2018 |
| JP | | 2019-106552 A | 6/2019 |
| KR | | 2003-0041817 A | 5/2003 |
| KR | | 2008-0023158 A | 3/2008 |
| KR | | 2012-0109396 A | 10/2012 |
| KR | | 2012-0122913 A | 11/2012 |
| TW | | 201244103 | 11/2012 |
| WO | | WO-1998/058382 | 12/1998 |
| WO | | WO-2018/073708 | 4/2018 |

OTHER PUBLICATIONS

Written Opinion (Application No. PCT/IB2019/056433) Dated Oct. 1, 2019.

Yamazaki.S et al., "Properties of crystalline In—Ga—Zn-oxide semiconductor and its transistor characteristics", JPN. J. Appl. Phys. (Japanese Journal of Applied Physics) , Mar. 31, 2014, vol. 53, No. 4S, pp. 04ED18-1-04ED18-10, The Japan Society of Applied Physics.

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Kato.K et al., "Evaluation of Off-State Current Characteristics of Transistor Using Oxide Semiconductor Material, Indium-Gallium-Zinc Oxide", JPN. J. Appl. Phys. (Japanese Journal of Applied Physics) , 2012, vol. 51, pp. 021201-1-021201-7, The Japan Society of Applied Physics.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Chinese Office Action (Application No. 201980051607.3), dated May 14, 2025.

* cited by examiner

100

<u>211_i</u> Memory Block

DLAT
GW_EN        GSA_EN        LSA_EN        WL_ADDR[7:0]
GR_EN        GEQ_ENB      LEQ_ENB

<u>211_i</u> Memory Block

FIG. 19

FIG. 25A
200A
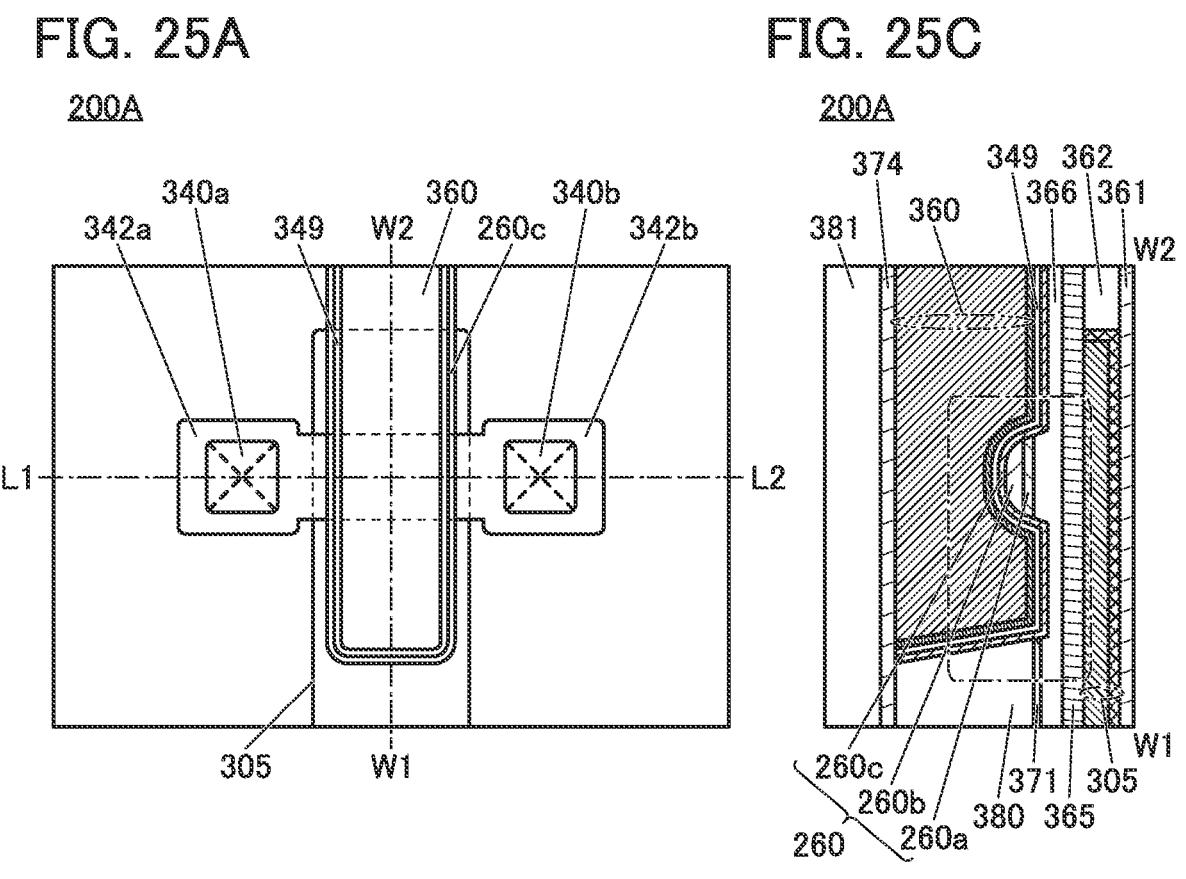
FIG. 25C
200A
FIG. 25B
200A
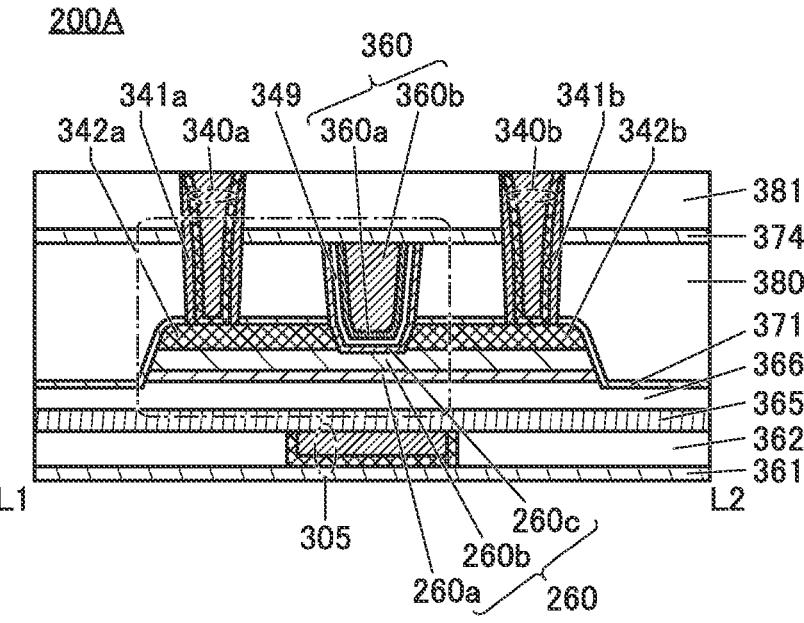

MEMORY DEVICE

TECHNICAL FIELD

One embodiment of the present invention relates to a memory device, a semiconductor device, or electronic devices using these devices.

Note that one embodiment of the present invention is not limited to the above technical field. One embodiment of the invention disclosed in this specification and the like relates to an object, a method, or a manufacturing method. Alternatively, one embodiment of the invention disclosed in this specification and the like relates to a process, a machine, manufacture, or a composition of matter.

In this specification and the like, a semiconductor device generally means a device that can function by utilizing semiconductor characteristics. A transistor and a semiconductor circuit are embodiments of semiconductor devices. A display device (e.g., a liquid crystal display device and a light-emitting display device), a projection device, a lighting device, an electro-optical device, a power storage device, a memory device, a semiconductor circuit, an imaging device, an electronic device, and the like sometimes include a semiconductor device. In addition, a display device, a projection device, a lighting device, an electro-optical device, a power storage device, a memory device, a semiconductor circuit, an imaging device, an electronic device, and the like can also be referred to as a semiconductor device.

BACKGROUND ART

As semiconductor thin films that can be used in transistors, silicon-based semiconductor materials have been widely known, but oxide semiconductors have been attracting attention as alternative materials. Examples of oxide semiconductors include not only single-component metal oxides, such as indium oxide and zinc oxide, but also multi-component metal oxides. Among the multi-component metal oxides, in particular, an In—Ga—Zn oxide (hereinafter also referred to as IGZO) has been actively studied.

From the studies on IGZO, in an oxide semiconductor, a CAAC (c-axis aligned crystalline) structure and an nc (nanocrystalline) structure, which are not single crystal nor amorphous, have been found (see Non-Patent Document 1 to Non-Patent Document 3). Non-Patent Document 1 and Non-Patent Document 2 also disclose a technique for fabricating a transistor using an oxide semiconductor having the CAAC structure is disclosed. Moreover, Non-Patent Document 4 and Non-Patent Document 5 disclose that a fine crystal is included even in an oxide semiconductor which has lower crystallinity than an oxide semiconductor having the CAAC structure or the nc structure.

In addition, a transistor including IGZO as an active layer has an extremely low off-state current (see Non-Patent Document 6), and an LSI and a display utilizing the transistor characteristics have been reported (see Non-Patent Document 7 and Non-Patent Document 8).

A variety of semiconductor devices utilizing a transistor including an oxide semiconductor in its channel formation region (hereinafter also referred to as an "OS transistor") have been proposed.

Patent Document 1 discloses an example of using an OS transistor for a memory cell (memory element) of a memory device. Since a current that flows between a source and a drain in the off state (also referred to as an "off-state current") is extremely low in the OS transistor, a storage capacitor used in the memory element can be made small or eliminated. With a small or no storage capacitor, a highly integrated memory device can be achieved.

REFERENCE

Patent Document

[Patent Document 1] Japanese Published Patent Application No. 2012-256400

Non-Patent Document

[Non-Patent Document 1] S. Yamazaki et al., "SID Symposium Digest of Technical Papers", 2012, volume 43, issue 1, p. 183-186
[Non-Patent Document 2] S. Yamazaki et al., "Japanese Journal of Applied Physics", 2014, volume 53, Number 4S, p. 04ED18-1-04ED18-10
[Non-Patent Document 3] S. Ito et al., "The Proceedings of AM-FPD'13 Digest of Technical Papers", 2013, p. 151-154
[Non-Patent Document 4] S. Yamazaki et al., "ECS Journal of Solid State Science and Technology", 2014, volume 3, issue 9, p. Q3012-Q3022
[Non-Patent Document 5] S. Yamazaki, "ECS Transactions", 2014, volume 64, issue 10, p. 155-164
[Non-Patent Document 6] K. Kato et al., "Japanese Journal of Applied Physics", 2012, volume 51, p. 021201-1-021201-7
[Non-Patent Document 7] S. Matsuda et al., "2015 Symposium on VLSI Technology Digest of Technical Papers", 2015, p. T216-T217
[Non-Patent Document 8] S. Amano et al., "SID Symposium Digest of Technical Papers", 2010, volume 41, issue 1, p. 626-629

SUMMARY OF THE INVENTION

Problems to be Solved by the Invention

An object of one embodiment of the present invention is to provide a novel memory device or semiconductor device. Another object of one embodiment of the present invention is to provide a memory device or a semiconductor device having high reliability. Another object of one embodiment of the present invention is to provide a memory device or a semiconductor device having a high integration density. Another object of one embodiment of the present invention is to provide a memory device or a semiconductor device having high operating speed. Another object of one embodiment of the present invention is to provide a memory device or a semiconductor device with reduced power consumption.

Note that the description of the above-described plurality of objects does not preclude the existence of each object. In one embodiment of the present invention, there is no need to achieve all the objects. Objects other than those listed above will be apparent from the description of the specification, the drawings, the claims, and the like, and such objects could be objects of one embodiment of the present invention.

Means for Solving the Problems

One embodiment of the present invention is a memory device including a plurality of first wirings extending in a first direction, a plurality of memory element groups, and an oxide layer extending along a side surface of the first wiring. Each of the memory element groups includes a plurality of memory elements. Each of the memory elements includes a transistor and a capacitor. A gate electrode of the transistor is electrically connected to the first wiring. The oxide layer includes a region in contact with a semiconductor layer of the transistor. The shortest distance from the gate electrode of the transistor included in the memory element positioned in an end portion of the memory element group to the gate electrode of the transistor included in the memory element positioned in an end portion of the adjacent memory element group is less than or equal to 3.5 μm.

Alternatively, one embodiment of the present invention is a memory device including a plurality of first wirings extending in a first direction, a plurality of oxide layers, a first memory element group, and a second memory element group. The plurality of first wirings include a region overlapping with the first memory element group, and a region overlapping with the second memory element group. One of the plurality of oxide layers includes a region extending along a side surface of one of the first wirings. The first memory element group and the second memory element group include a plurality of memory elements. Each of the plurality of memory elements includes a transistor and a capacitor. In each of the plurality of memory elements, a gate electrode of the transistor is electrically connected to one of the plurality of first wirings, and a semiconductor layer of the transistor includes a region in contact with one of the plurality of oxide layers. A shortest distance from the gate electrode of the transistor included in the memory cell positioned in an end portion of the first memory element group to the gate electrode of the transistor included in the memory cell positioned in an end portion of the second memory element group is less than or equal to 3.5 μm.

The shortest distance may be less than or equal to 2.3 μm. In the above embodiment of the present invention, a plurality of second wirings extending in a second direction may be provided, and one of a source electrode and a drain electrode of the transistor may be electrically connected to one of the plurality of second wirings. In this case, the other of the source electrode and the drain electrode of the transistor is electrically connected to the capacitor.

Note that the oxide layer may include a region overlapping with the first wiring with an insulating layer therebetween. In some cases, the oxide layer contains one or both of indium and zinc. The semiconductor layer of the transistor preferably contains at least one of indium and zinc.

In the above embodiment, a plurality of third wirings extending in the first direction may be provided. One of the plurality of third wirings preferably includes a region overlapping with one of the plurality of first wirings.

Another embodiment of the present invention is a memory device including a plurality of first wirings extending in a first direction, a plurality of oxide layers, a first memory element group, a second memory element group, and a first region. The plurality of first wirings include a region overlapping with the first memory element group, a region overlapping with the second memory element group, and a region overlapping with the first region. One of the plurality of oxide layers includes a region extending along a side surface of one of the first wirings. The first memory element group and the second memory element group include a plurality of memory elements. Each of the plurality of memory elements includes a first transistor and a capacitor. In each of the plurality of memory elements, a gate of the first transistor is electrically connected to one of the plurality of first wirings, and a semiconductor layer of the first transistor includes a region in contact with one of the plurality of oxide layers. The first region includes a plurality of second transistors. In each of the plurality of second transistors, a gate electrode is electrically connected to one of the plurality of first wirings, and one or both of a source electrode and a drain electrode are electrically connected to a fourth wiring. The memory device has a function of supplying a high power supply potential to the fourth wiring.

Effect of the Invention

According to one embodiment of the present invention, a novel memory device or semiconductor device can be provided. Alternatively, according to one embodiment of the present invention, a memory device or a semiconductor device having high reliability can be provided. Alternatively, according to one embodiment of the present invention, a memory device or a semiconductor device having a high integration density can be provided. Alternatively, according to one embodiment of the present invention, a memory device or a semiconductor device having high operating speed can be provided. Alternatively, according to one embodiment of the present invention, a memory device or a semiconductor device with reduced power consumption can be provided.

Note that the description of these effects does not preclude the existence of other effects. In one embodiment of the present invention, there is no need to achieve all these effects. Effects other than these will be apparent from and can be derived from the description of the specification, the drawings, the claims, and the like.

BRIEF DESCRIPTION OF THE DRAWINGS

FIG. 19 is a diagram illustrating operation of writing data to memory cells.

FIG. 25A to FIG. 25C are diagrams illustrating an example of a transistor.

FIG. 30A to FIG. 30C are diagrams illustrating electronic devices.

MODE FOR CARRYING OUT THE INVENTION

Figure 1:
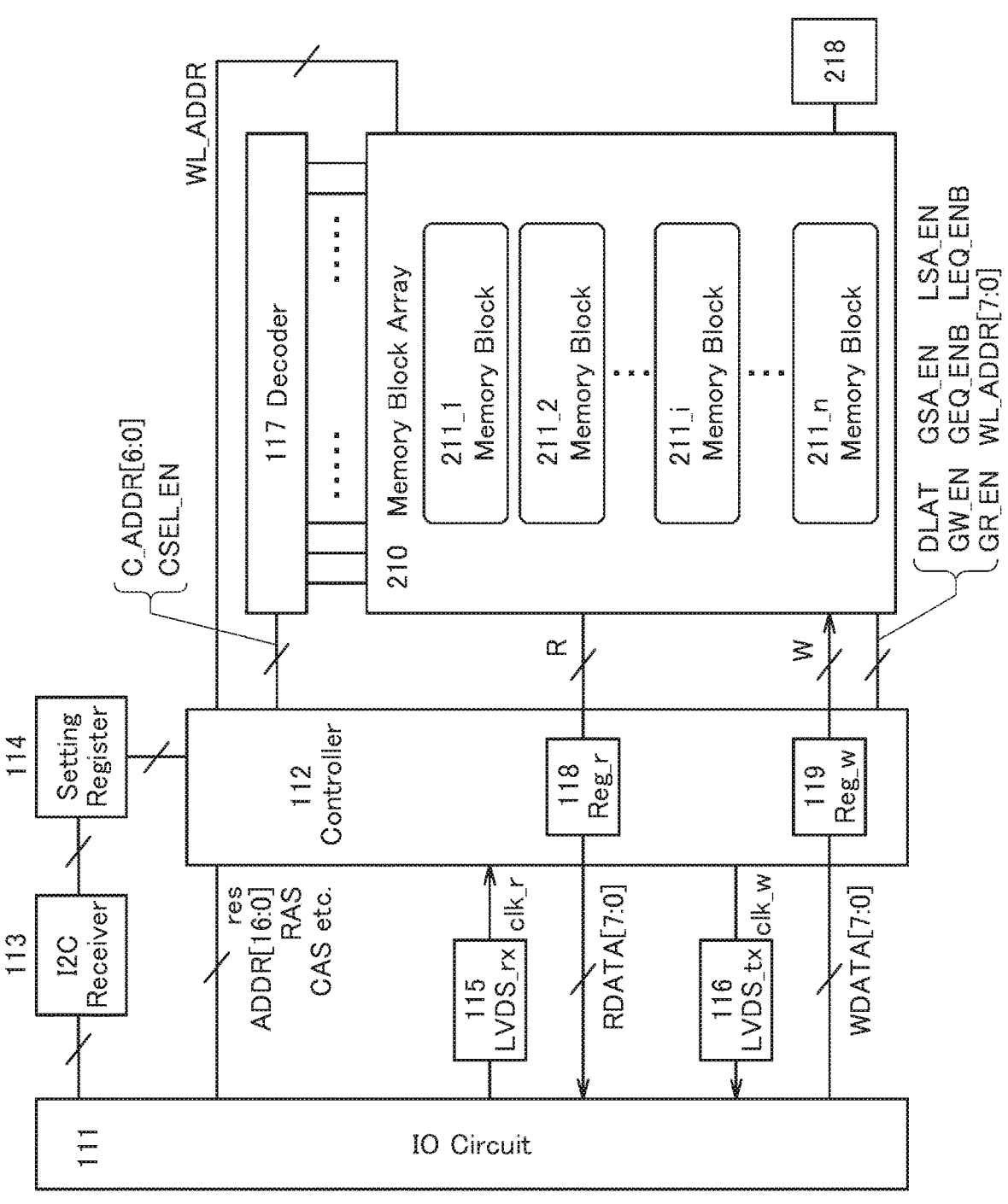
FIG. 1 is a diagram illustrating a configuration example of a memory device.

Embodiments of the present invention will be described in detail with reference to the drawings. Note that the present invention is not limited to the following description, and it is readily appreciated by those skilled in the art that modes and details can be modified in various ways without departing from the spirit and the scope of the present invention. Thus, the present invention should not be construed as being limited to the description in the following embodiments.

Note that in the structures of the present invention described below, the same portions or portions having similar functions are denoted by the same reference numerals in different drawings, and description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification, a high power supply potential and a low power supply potential are sometimes referred to as an H level (also referred to as "VDD" or an "H potential") and an L level (also referred to as "VSS" or an "L potential"), respectively.

Note that a voltage refers to a potential difference between two points, and a potential refers to electrostatic energy (electric potential energy) of a unit charge at a given point in an electrostatic field. In general, a difference between a potential of one point and a reference potential (e.g., a ground potential) is merely called potential or voltage, and potential and voltage are used as synonyms in many cases. Therefore, in this specification and the like, potential is interchangeable with voltage and voltage is interchangeable with potential unless explicitly stated.

In this specification, the embodiments described below can be combined as appropriate. In addition, in the case where a plurality of structure examples are described in one embodiment, the structure examples can be combined as appropriate.

In this specification and the like, a metal oxide means an oxide of metal in a broad sense. Metal oxides are classified into an oxide insulator, an oxide conductor (including a transparent oxide conductor), an oxide semiconductor, and the like. For example, a metal oxide used in a semiconductor layer of a transistor is called an oxide semiconductor in some cases. In the case where an OS transistor is mentioned, the OS transistor can also be referred to as a transistor including a metal oxide or an oxide semiconductor. In this specification and the like, a metal oxide containing nitrogen is also referred to as a metal oxide in some cases.

Unless otherwise specified, transistors described in this specification and the like are enhancement (normally-off) n-channel field-effect transistors. Thus, the threshold voltage (also referred to as "Vth") is higher than 0 V.

Embodiment 1

In this embodiment, a memory device of one embodiment of the present invention will be described.

Memory Device 100

FIG. 1 is a block diagram illustrating a configuration example of a memory device 100 that is one embodiment of the present invention.

The memory device 100 includes an input/output circuit 111 (IO Circuit), a control circuit 112 (Controller), an I2C receiver 113 (I2C Receiver), a setting register 114 (Setting Register), an LVDS circuit 115 (transfer circuit LVDS_rx), an LVDS circuit 116 (transfer circuit LVDS_tx), a decoder 117 (Decoder), a memory block array 210 (Memory Block Array), and a negative voltage generator circuit 218.

The control circuit 112 includes a register 118 (Reg_r) and a register 119 (Reg_w). The memory block array 210 includes n (n is an integer greater than or equal to 1) memory blocks 211 (Memory Block). In this specification and the like, a first memory block 211 is referred to as a memory block 211_1, and an i-th (i is an integer greater than or equal to 1 and less than or equal to n) memory block 211 is referred to as a memory block 211_i.

The input/output circuit 111 has a function of delivering signals from/to an external device. Operating conditions and the like of the memory device 100 are determined by setting parameters stored in the setting register 114. The setting parameters are written into the setting register 114 through the input/output circuit 111 and the I2C receiver 113. Note that the I2C receiver 113 may be omitted depending on the purpose, the usage, or the like.

Examples of the setting parameters include information specifying execution intervals of refresh operations, timing of circuit operation, and the like. The control circuit 112 has a function of processing the setting parameters and a command signal from the outside and determining the operating mode of the memory device 100. The control circuit 112 has a function of generating a variety of control signals and controlling the operation of the whole memory device 100.

The control circuit 112 is supplied with a reset signal res, address signals ADDR[16:0], a row address identification signal RAS (Row Address Strobe), a column address identification signal CAS (Column Address Strobe), a writing control signal WE (Write Enable), a clock signal clk_r for data reading, write data WDATA[7:0], and the like from the outside through the input/output circuit 111. The clock signal clk_r for data reading is supplied to the control circuit 112 through the LVDS circuit 115.

A clock signal clk_w for data writing and read data RDATA[7:0] are supplied to the input/output circuit 111 from the control circuit 112. The clock signal clk_w for data writing is supplied to the input/output circuit 111 through the LVDS circuit 116. The LVDS circuit 115 and the LVDS circuit 116 are transfer circuits that operate in accordance with the LVDS (Low voltage differential signaling) standard. Note that one or both of the LVDS circuit 115 and the LVDS circuit 116 may be omitted depending on the purpose, the usage, or the like.

The write data WDATA[7:0] are transferred in synchronization with the clock signal clk_w for data writing and retained in the register 119 in the control circuit 112. The control circuit 112 has a function of supplying data retained in the register 119 to the memory block array 210.

Data read from the memory block array 210 is retained as the read data RDATA[7:0] in the register 118 in the control circuit 112. The control circuit 112 has a function of transferring the read data RDATA[7:0] to the input/output circuit 111 in synchronization with the clock signal clk_r for data reading.

The control circuit 112 has a function of outputting column address signals C_ADDR[6:0], a column selection enable signal CSEL_EN, a data latch signal DLAT, a global writing enable signal GW_EN, a global reading enable signal GR_EN, a global sense amplifier enable signal GSA_EN, a global equalization enable signal GEQ_ENB, a local sense amplifier enable signal LSA_EN, a local equalization enable signal LEQ_ENB, word line address selection signals WL_ADDR[7:0], and the like.

The column address signals C_ADDR and the column selection enable signal CSEL_EN are supplied to the decoder 117.

Memory Block

Figure 2A:
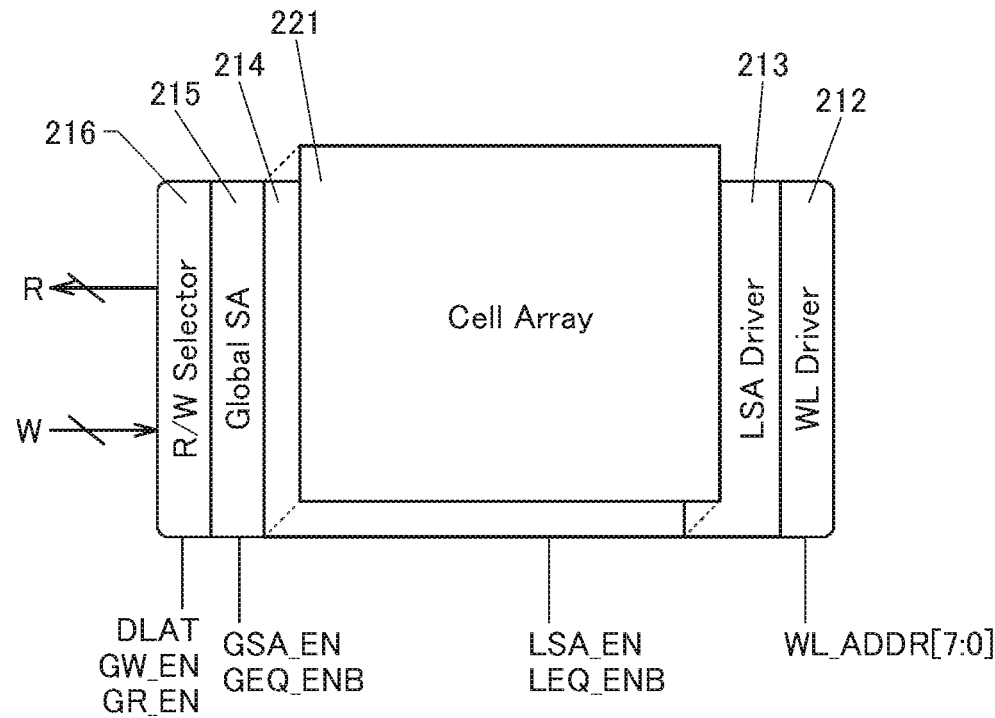
FIG. 2A and FIG. 2B are diagrams illustrating a configuration example of a memory block.
Figure 2B:
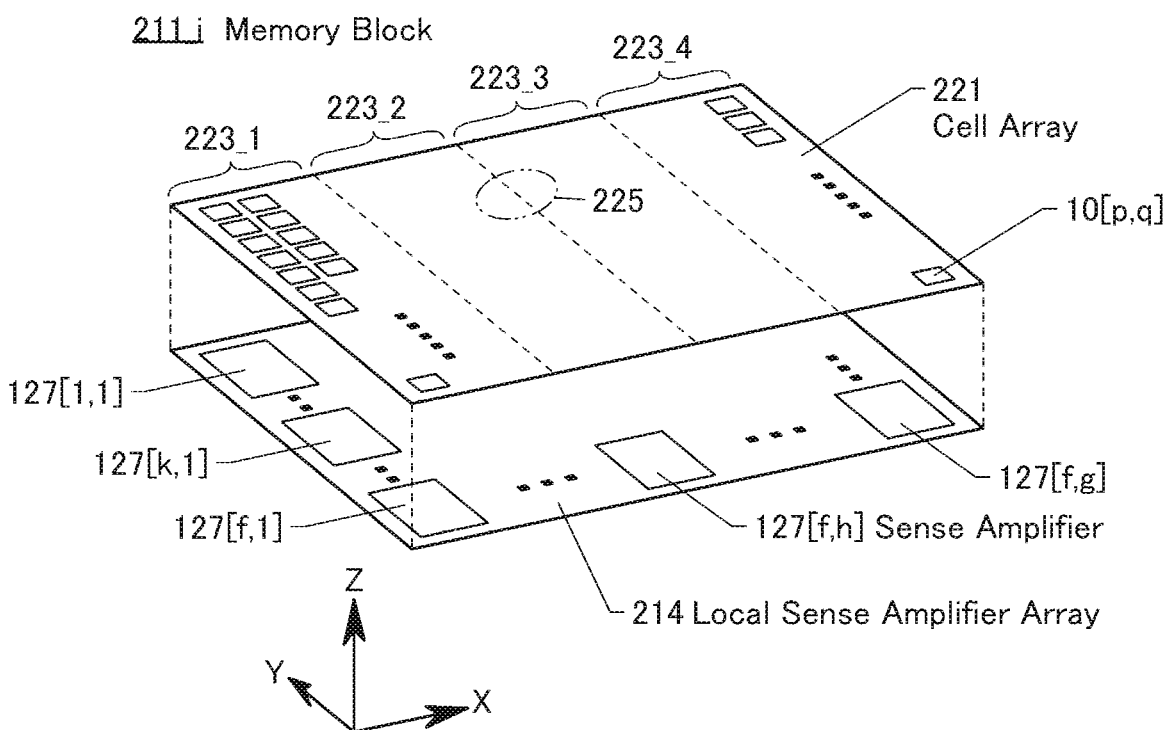

FIG. 2A is a block diagram illustrating a configuration example of the memory block 211_i. FIG. 2B is a perspective block diagram illustrating a configuration example of a local sense amplifier array 214 (Local Sense Amplifier Array) and a cell array 221 (Cell Array) included in the memory block 211_i. Arrows indicating the X direction, the Y direction, and the Z direction are illustrated in FIG. 2B and the like. The X direction, the Y direction, and the Z direction are directions orthogonal to each other.

The memory block 211_i includes a word line driver 212 (WL Driver), a local sense amplifier driver 213 (LSA Driver), the local sense amplifier array 214, a global sense amplifier 215 (Global SA), a read/write selector 216 (R/W Selector), and the cell array 221.

The data latch signal DLAT, the global writing enable signal GW_EN, and the global reading enable signal GR_EN are supplied to the read/write selector 216. The global sense amplifier enable signal GSA_EN and the global equalization enable signal GEQ_ENB are supplied to the global sense amplifier 215. The local sense amplifier enable signal LSA_EN and the local equalization enable signal LEQ_ENB are supplied to the local sense amplifier array 214. The word line address selection signals WL_ADDR[7:0] are supplied to the word line driver 212.

The local sense amplifier array 214 includes a plurality of sense amplifiers 127 (Sense Amplifier) arranged in a matrix of f rows and g columns (f and g are each an integer greater than or equal to 1). In this specification and the like, the sense amplifier 127 in the first row and the first column is denoted by a sense amplifier 127[1,1]. In addition, the sense amplifier 127 in the k-th row and the h-th column (k is an integer greater than or equal to 1 and less than or equal to f and h is an integer greater than or equal to 1 and less than or equal to g) is denoted by a sense amplifier 127[k,h].

The cell array 221 is provided over the local sense amplifier array 214 to overlap the local sense amplifier array 214. Providing the cell array 221 to overlap the local sense amplifier array 214 enables the wiring length of the bit line to be reduced.

The cell array 221 includes a plurality of memory cells 10 arranged in a matrix of p rows and q columns (p and q are each an integer greater than or equal to 1). In this specification and the like, the memory cell 10 in the first row and the first column is denoted by a memory cell 10[1,1]. Moreover, the memory cell in the j-th row and the t-th column (j is an integer greater than or equal to 1 and less than or equal to p and t is an integer greater than or equal to 1 and less than or equal to q) is denoted by a memory cell 10[j,t]. The memory cell 10 functions as a memory element.

The cell array 221 also includes a plurality of word lines WL and a plurality of wirings BGL that extend in the X direction (the row direction), a plurality of bit lines BL that extend in the Y direction (the column direction), and a plurality of bit lines BLB that extend in the Y direction (the column direction) (not illustrated in FIG. 2B). Note that in this specification and the like, for example, the j-th (j is an integer greater than or equal to 1 and less than or equal to p) word line WL is denoted by a word line WL[j].

One memory cell 10 is electrically connected to any one of the word lines WL that extend in the X direction (the row direction). One memory cell 10 is electrically connected to any one of the wirings BGL that extend in the X direction (the row direction). One memory cell 10 is electrically connected to any one of the bit lines BL or any one of the bit lines BLB.

The cell array 221 consists of a plurality of sub cell arrays 223. FIG. 2B illustrates an example where the cell array 221 consists of four sub cell arrays 223. FIG. 2B shows a sub cell array 223_1 to a sub cell array 223_4 as the four sub cell arrays 223.

The plurality of sub cell arrays 223 are each composed of a plurality of memory cells 10. Th sub cell array can therefore be referred to as a memory element group.

Figure 3:
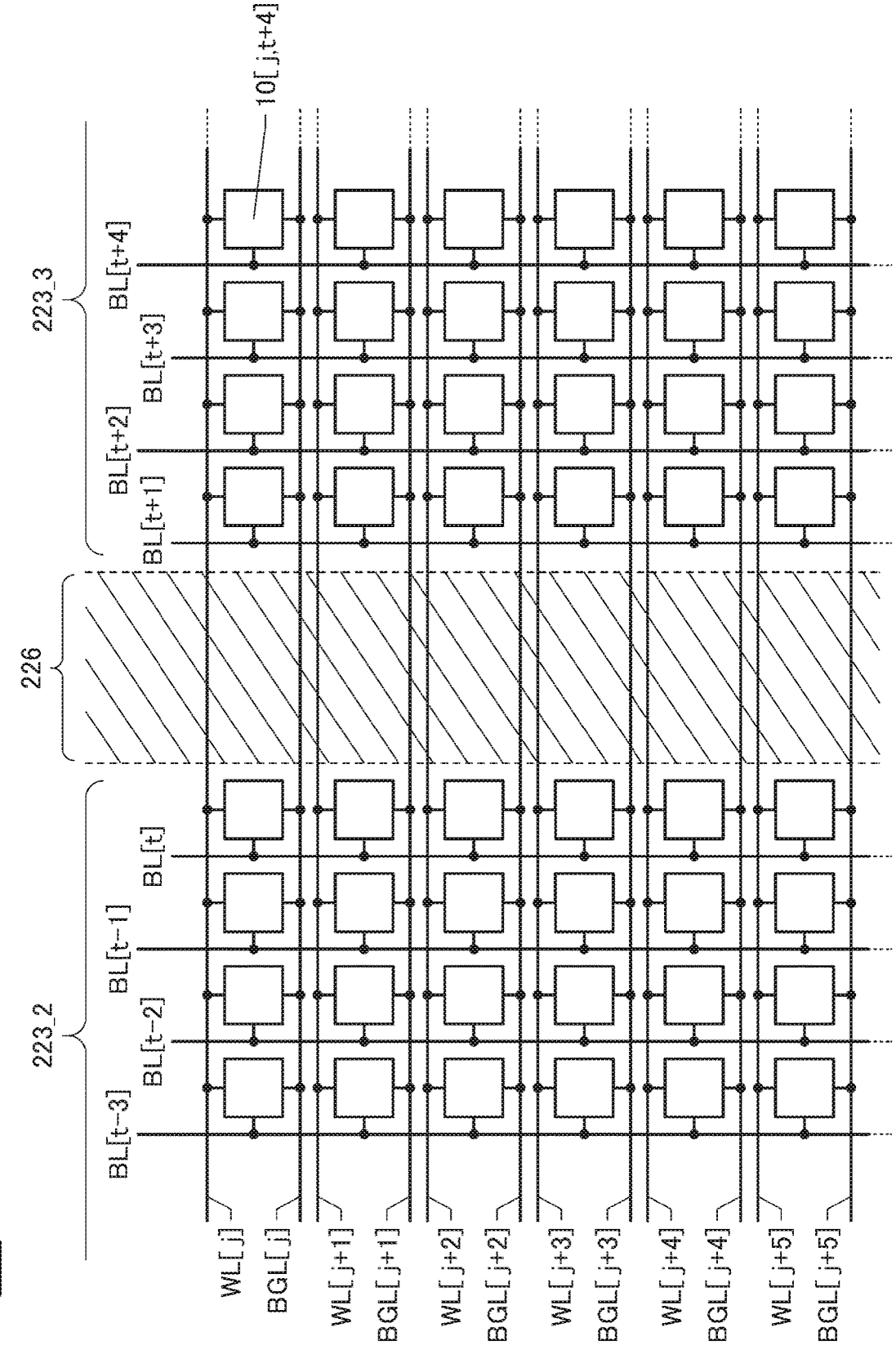
FIG. 3 is an enlarged view of part of a cell array.

An adjoining region 226 is positioned between the sub cell array 223_1 and the sub cell array 223_2, between the sub cell array 223_2 and the sub cell array 223_3, and between the sub cell array 223_3 and the sub cell array 223_4. FIG. 3 is an enlarged view of a region 225 illustrated in FIG. 2B. The region 225 includes part of the sub cell array 223_2, part of the sub cell array 223_3, and part of the adjoining region 226 adjacent to both of them.

The adjoining region 226 is a region for electrically connecting the word line WL to a wiring in an upper layer or a lower layer. For example, when a wiring that runs parallel to the word line WL is provided in a layer above the word line WL and is made electrically connected to the word line WL in the adjoining region 226, the wiring resistance of the word line WL can be made substantially small.

Figures 4A, 4B:
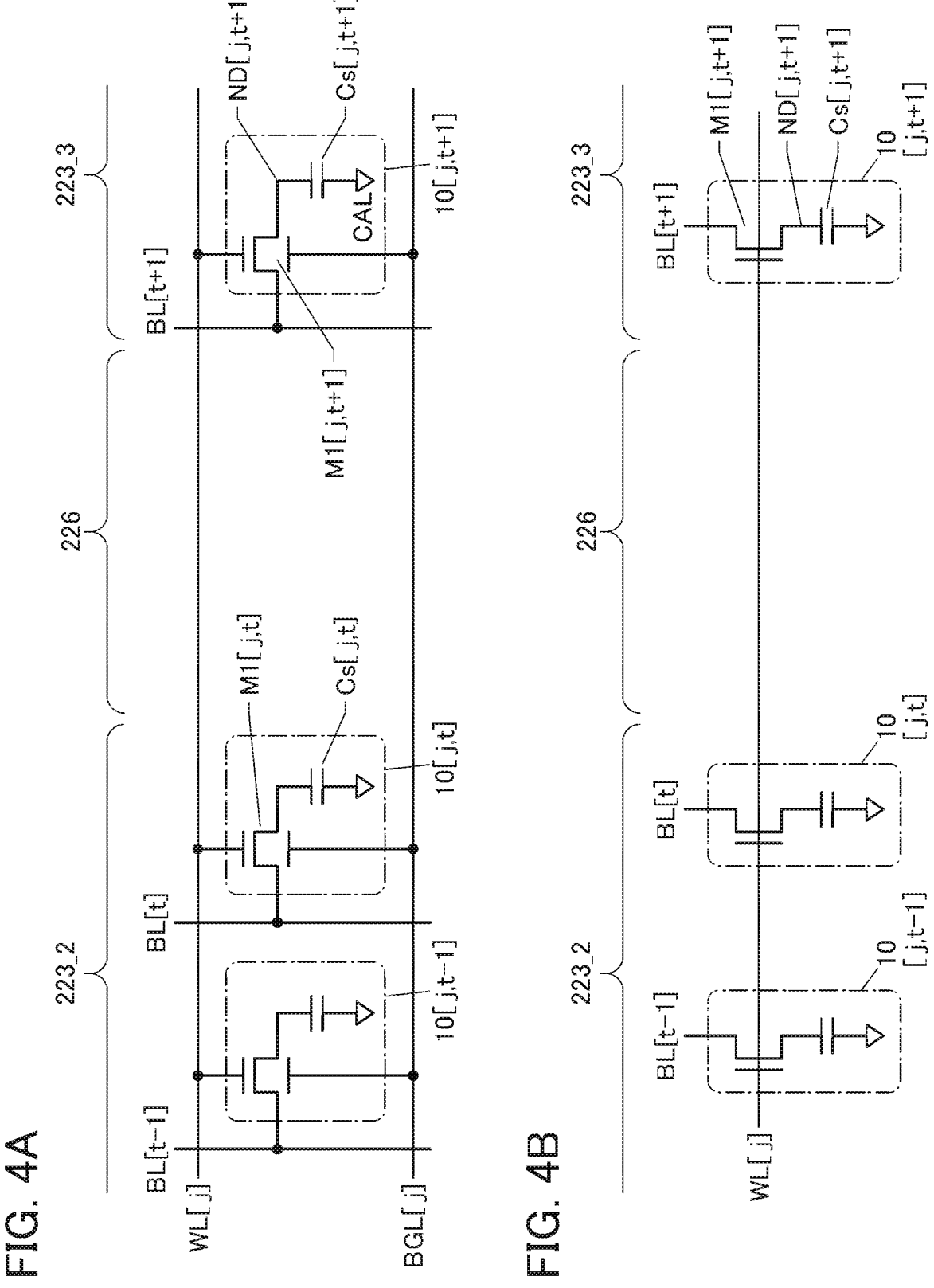
FIG. 4A and FIG. 4B are diagrams illustrating a circuit configuration example of a memory cell.

FIG. 4A illustrates a circuit configuration example of the memory cell 10[j,t−1], the memory cell 10[j,t], and the memory cell 10[j,t−1] that are electrically connected to the word line WL[j]. The memory cell 10 includes a transistor M1 and a storage capacitor Cs. The storage capacitor Cs serves as a storage capacitor. FIG. 4A shows a transistor including a back gate (a four-terminal transistor, which is also referred to as a "four-terminal element") as an example of the transistor M1.

One of a source and a drain of the transistor M1 is electrically connected to one electrode of the storage capacitor Cs. The other of the source and the drain of the transistor M1 is electrically connected to the bit line BL (or the bit line BLB). A gate of the transistor M1 is electrically connected to the word line WL. The back gate of the transistor M1 is electrically connected to the wiring BGL. The other electrode of the storage capacitor Cs is electrically connected to a wiring CAL. A node where the one of the source and the drain of the transistor M1 and the one electrode of the storage capacitor Cs are electrically connected to each other is referred to as a node ND.

In an actual transistor, a gate and a back gate are provided to overlap each other with a channel formation region of a semiconductor layer positioned therebetween. Both the gate and the back gate can function as a gate. Thus, in the case where one of them is referred to as a "back gate", the other is referred to as a "gate" or a "front gate" in some cases. There is also a case where one of them is referred to as a "first gate" and the other is referred to as a "second gate".

The potential of the back gate may be the same as the potential of the gate, or may be a ground potential or a given potential. By changing the potential of the back gate independently of that of the gate, the threshold voltage of the transistor can be changed.

When the back gate is provided and the gate and the back gate are made to have the same potential, a region in the semiconductor layer where carriers flow is enlarged in the film-thickness direction; accordingly, the amount of carrier transfer is increased. As a result, the on-state current of the transistor is increased and the field-effect mobility is increased.

Thus, a transistor that has a high on-state current with respect to its occupied area can be provided. That is, the area occupied by the transistor can be small for a required on-state current. Consequently, a semiconductor device having a high degree of integration can be achieved.

The wiring BGL functions as a wiring for applying a potential to the back gate of the transistor M1. By applying a given potential to the wiring BGL, the threshold voltage of the transistor M1 can be increased or decreased.

Data writing and reading are performed by applying a high-level potential (e.g., 3.3 V) to the word line WL to turn on the transistor M1 so that the bit line BL and the node ND are electrically connected to each other. After the data writing ends, a low-level potential is applied to the word line WL to turn off the transistor M1. The low-level potential may be, for example, a reference potential or a negative potential. In this specification and the like, the negative potential refers to a potential lower than the reference potential. Thus, when the reference potential is 0 V, the negative potential is lower than 0 V. The expression "negative potential is high" or "high negative potential" means that the potential difference between the reference potential and the negative potential is large. The expression "negative potential is low" or "low negative potential" means that the potential difference between the reference potential and the negative potential is small.

The wiring CAL functions as a wiring for applying a predetermined potential to the other electrode of the storage capacitor Cs. A fixed potential is preferably applied to the wiring CAL.

The memory cell 10 shown in this embodiment is a DRAM (Dynamic Random Access Memory)-type memory element.

In this specification and the like, the transistor M1 included in the memory cell 10[j,t] is sometimes denoted by a transistor M1[j,t]. Moreover, in this specification and the like, the storage capacitor Cs included in the memory cell 10[j,t] is sometimes denoted by a storage capacitor Cs[j,t]. The circuit diagram in FIG. 4A can be represented as FIG. 4B.

An oxide semiconductor, which is a type of metal oxide, is preferably used for a semiconductor layer where a channel of the transistor M1 is formed. In this specification and the like, a transistor including an oxide semiconductor in a semiconductor layer where a channel is formed is also referred to as an "OS transistor".

For example, as the oxide semiconductor, a metal oxide containing any one of indium, an element M (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like), and zinc can be used. In particular, the oxide semiconductor is preferably a metal oxide containing indium, gallium, and zinc.

An OS transistor has a characteristic of an extremely low off-state current. The use of an OS transistor as the transistor M1 enables the leakage current (leak current) of the transistor M1 to be extremely low. That is, with the use of the transistor M1, written data can be retained for a long time. Thus, the frequency of refresh operation for the memory element can be decreased. Alternatively, refresh operation for the memory element can be omitted. Owing to an extremely low leakage current, a memory element that retains multilevel data or analog data can be easily achieved.

In this specification and the like, a DRAM using an OS transistor is referred to as a DOSRAM (Dynamic Oxide Semiconductor Random Access Memory).

Figure 5A:
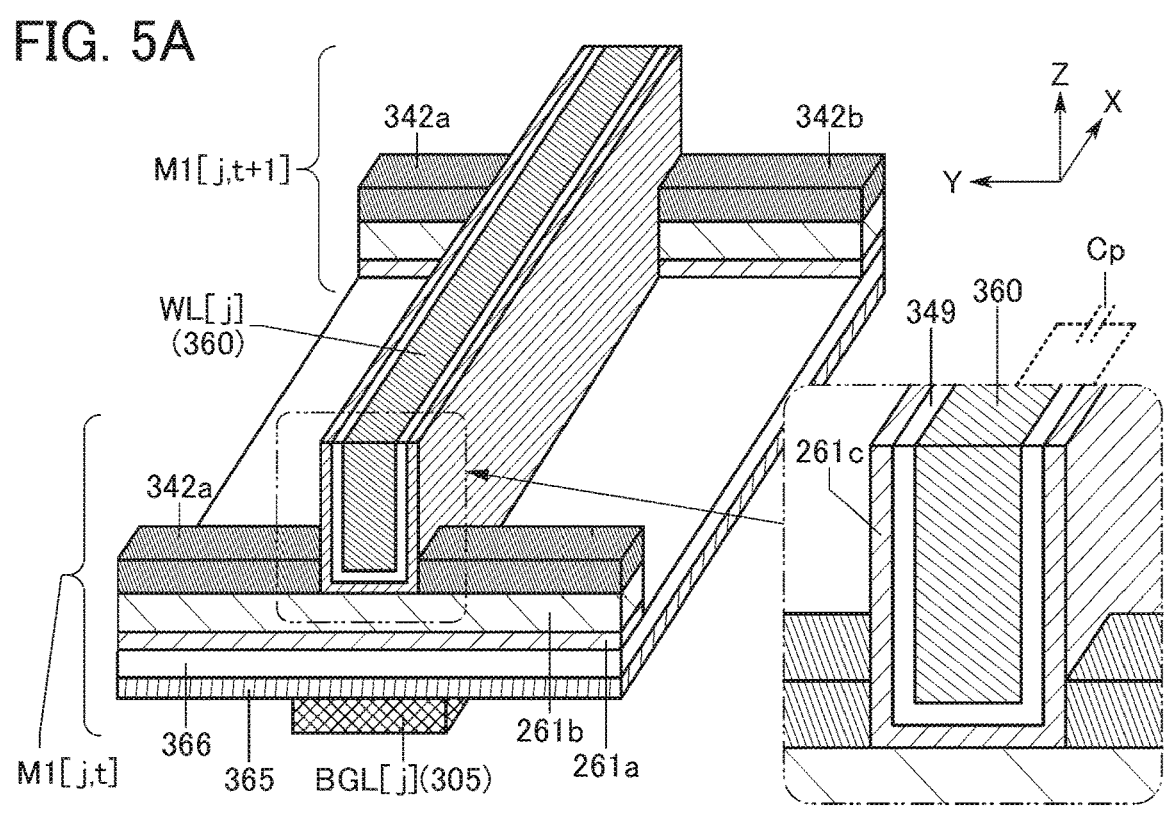
FIG. 5A to FIG. 5C are diagrams illustrating a structure example of two adjacent transistors.
Figure 5B:
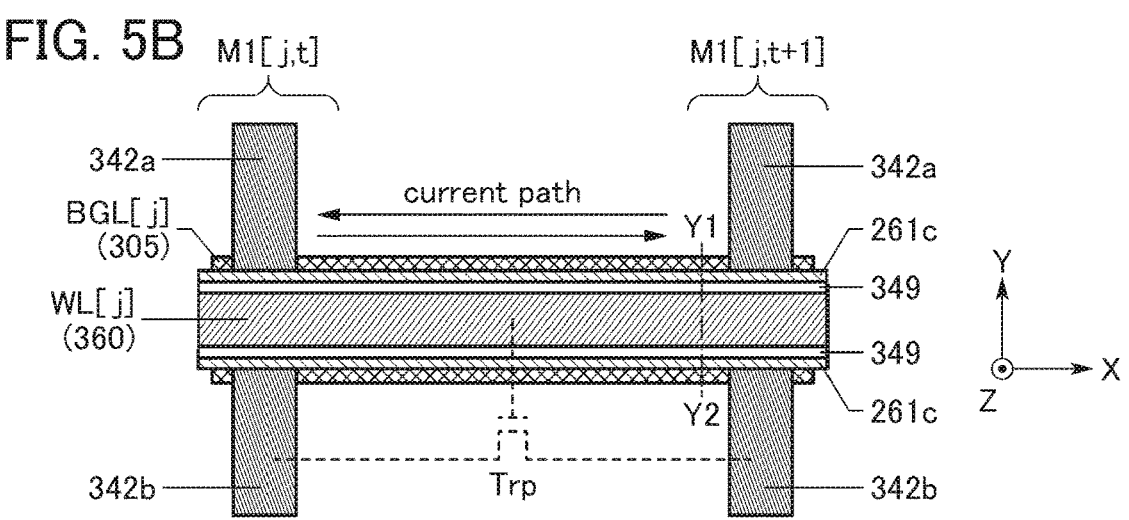

FIG. 5A and FIG. 5B illustrate a structure example of the transistor M1[j,t] and the transistor M1[j,t+1]. FIG. 5A is a perspective view of the transistor M1[j,t] and the transistor M1[j,t+1], and FIG. 5B is a top view thereof. Note that some components are not illustrated for easy understanding of the diagrams.

The transistor M1[j,t] includes an oxide layer 261 (an oxide layer 261a, an oxide layer 261b, and an oxide layer 261c). The oxide layer 261 functions as a semiconductor layer. A conductive layer 342 (a conductive layer 342a and a conductive layer 342b) is provided over the oxide layer 261b. One of the conductive layer 342a and the conductive layer 342b functions as a source electrode, and the other functions as a drain electrode.

A conductive layer 360, an insulating layer 349, and the oxide layer 261c are provided between the conductive layer 342a and the conductive layer 342b. The insulating layer 349 includes a region overlapping a side surface of the conductive layer 360 and a region overlapped by a bottom surface of the conductive layer 360. The oxide layer 261c includes a region overlapping the side surface of the conductive layer 360 with the insulating layer 349 therebetween and a region overlapped by the bottom surface of the conductive layer 360 with the insulating layer 349 therebetween. The oxide layer 261c also includes a region in contact with the oxide layer 261b.

In the conductive layer 360, the region overlapping the oxide layer 261c functions as a gate electrode.

An insulating layer 366 is provided under the oxide layer 261a, and an insulating layer 365 is provided under the insulating layer 366. A conductive layer 305 is provided under the insulating layer 365. The conductive layer 305 is positioned to be overlapped by the conductive layer 360. The conductive layer 305 functions as the wiring BGL[j]. The conductive layer 305 also functions as a back gate electrode of the transistor M1[j,t]. Supplying a negative voltage to the conductive layer 305 can increase Vth of the transistor M1, thereby preventing the transistor M1 from being normally-on.

The conductive layer 360 functions as the word line WL[j]. The conductive layer 360 also functions as a gate electrode of the transistor M1[j,t]. The insulating layer 349 functions as a gate insulating layer of the transistor M1[j,t]. The transistor M1[j,t+1] has the same structure as the transistor M1[j,t]. Thus, the conductive layer 360 functions as a gate electrode of the transistor M1[j,t+1]. Moreover, the insulating layer 349 functions as a gate insulating layer of the transistor M1[j,t+1]. Note that the transistor structure will be described later in detail.

Parasitic Transistor Trp and Parasitic Capacitor Cp

In the above structure, the oxide layer 261c is overlapped by the word line WL[j] with the insulating layer 349 therebetween, and the oxide layer 261c is in contact with the oxide layer 261b of the transistor M1[j,t] and the oxide layer 261b of the transistor M1[j,t+1]. Thus, a parasitic transistor Trp may be formed between the transistor M1[j,t] and the transistor M1[j,t+1]. When the parasitic transistor Trp is formed, the oxide layer 261b of the transistor M1[j,t] and the oxide layer 261b of the transistor M1[j,t+1] are electrically connected to each other, so that a leakage path (current path) is likely to be generated along the word line WL[j] (see FIG. 5B).

Furthermore, when the parasitic transistor Trp is formed, a parasitic capacitor Cp including the word line WL[j] as one electrode and the oxide layer 261c as the other electrode (a parasitic node NDp) is formed. The parasitic capacitor Cp corresponds to the gate capacitance of the parasitic transistor Trp (see FIG. 5A).

Figure 5C:
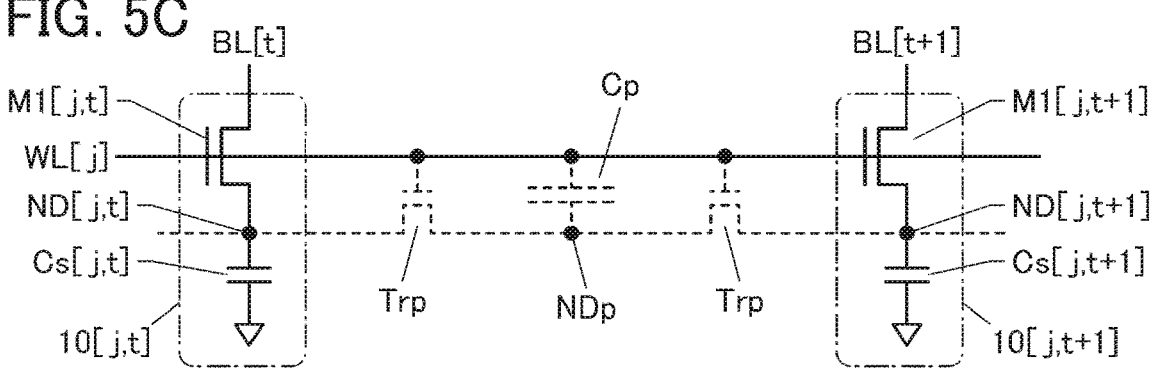

FIG. 5C is a circuit diagram illustrating the memory cell 10[j,t], the memory cell 10[j,t+1], the parasitic transistor Trp, and the parasitic capacitor Cp. Note that in this embodiment, a negative voltage is always supplied to the wiring BGL[j]. Thus, in circuit diagrams and the like shown below, the wiring BGL[j] is not illustrated in some cases for easy understanding of the diagrams. For example, the wiring BGL is omitted in FIG. 5C.

FIG. 5C shows that the parasitic transistor Trp is divided into two parts. In FIG. 5C, the parasitic transistor Trp and the parasitic capacitor Cp are shown by dashed lines.

The field-effect mobility of the parasitic transistor Trp is significantly lower than the field-effect mobility of the transistor M1. For that reason, when the speed of writing data to the memory cell 10 is high (when the operating frequency is high), the influence of the above-described leakage path is small. In contrast, when the speed of writing data to the memory cell 10 is low (when the operating frequency is low, e.g., when the operating frequency is 10 MHz or lower), the influence of the leakage path is significant, which might cause insufficient data writing to the memory cell 10.

Operation of Writing Data to Memory Cell 10

Figures 6A, 6B:
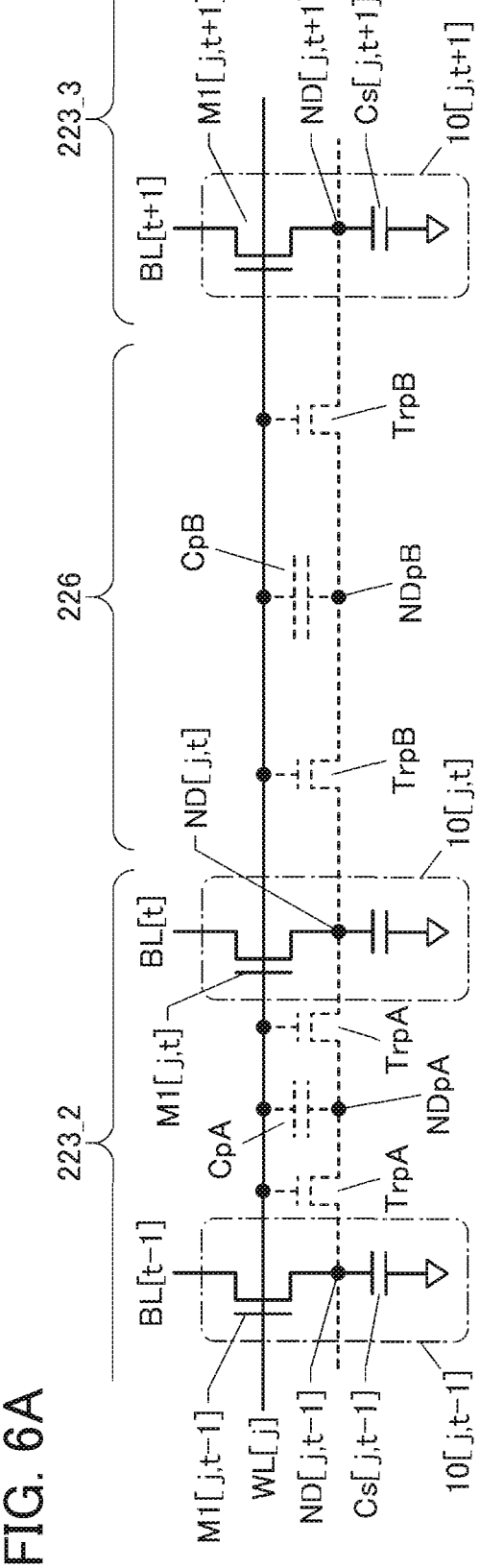
FIG. 6A and FIG. 6B are diagrams illustrating operation of writing data to memory cells.

Next, the operation of writing data to the memory cell 10[j,t] in the case where the operating frequency is low will be described. FIG. 6A is a circuit diagram illustrating the memory cell 10[j,t−1], the memory cell 10[j,t], the memory cell 10[j,t−1], parasitic transistors Trp, and parasitic capacitors Cp. The memory cell 10[j,t−1] and the memory cell 10[j,t] are memory cells included in the sub cell array 223_2, and the memory cell 10[j,t+1] is a memory cell included in the sub cell array 223_3.

In FIG. 6A, the parasitic transistor, the parasitic capacitor, and the parasitic node formed between the memory cell 10[j,t−1] and the memory cell 10[j,t] are shown as a parasitic transistor TrpA, a parasitic capacitor CpA, and a parasitic node NDpA. Moreover, the parasitic transistor, the parasitic capacitor, and the parasitic node formed between the memory cell 10[j,t] and the memory cell 10[j,t+1] are shown as a parasitic transistor TrpB, a parasitic capacitor CpB, and a parasitic node NDpB.

In this embodiment, as data written to the memory cell 10, a potential corresponding to "0" is higher than or equal to 0 V and lower than 0.6 V, and a potential corresponding to "1" is higher than or equal to 0.6 V and lower than or equal to 1.2 V. The storage capacitance Cs is 3.5 fF, the parasitic capacitance CpA is 1.0 fF, and the parasitic capacitance CpB is 3.0 fF. A potential WLH supplied to the word line WL to turn on the transistor M1 (bring the transistor M1 into conduction) is 3.3 V, and a potential WLL supplied to the word line WL to turn off the transistor M1 (bring the transistor M1 out of conduction) is 0 V. In addition, Vth of the parasitic transistor TrpA and the parasitic transistor TrpB is 1.5 V.

Figure 7A:
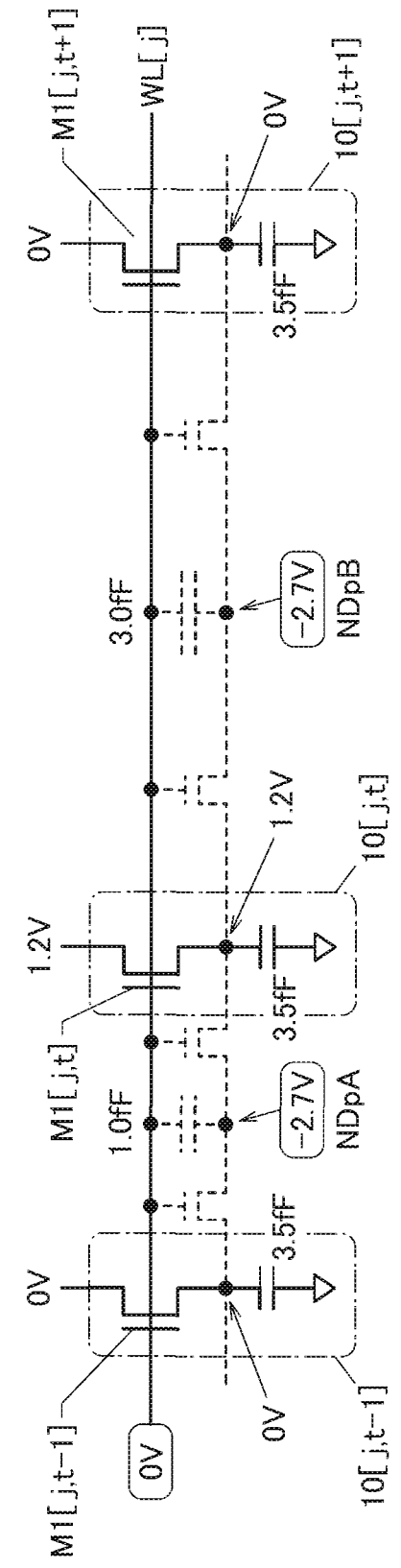
FIG. 7A and FIG. 7B are diagrams illustrating operation of writing data to memory cells.
Figure 7B:
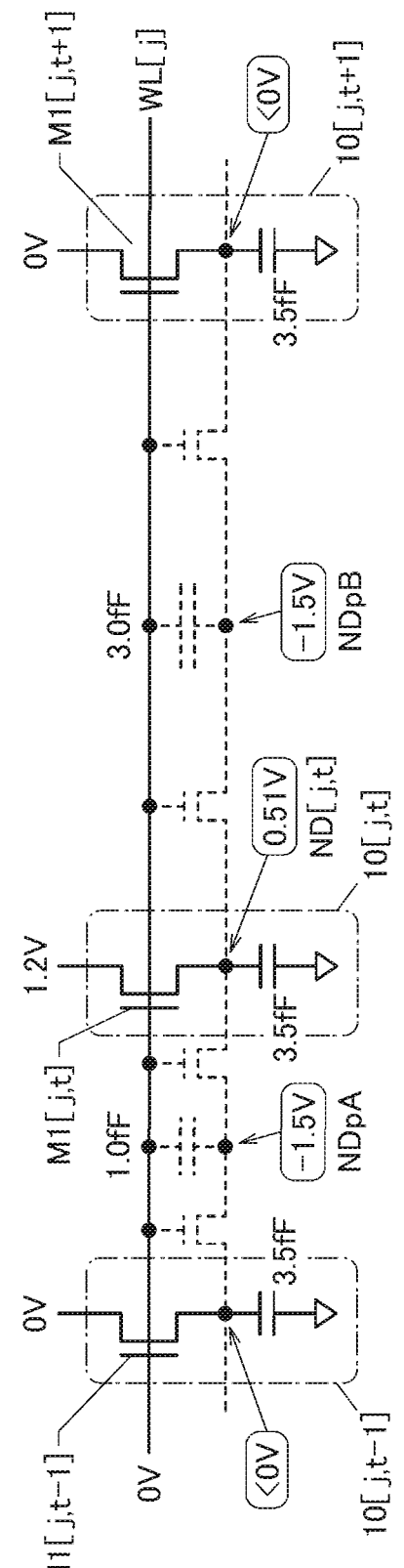
Figure 8:
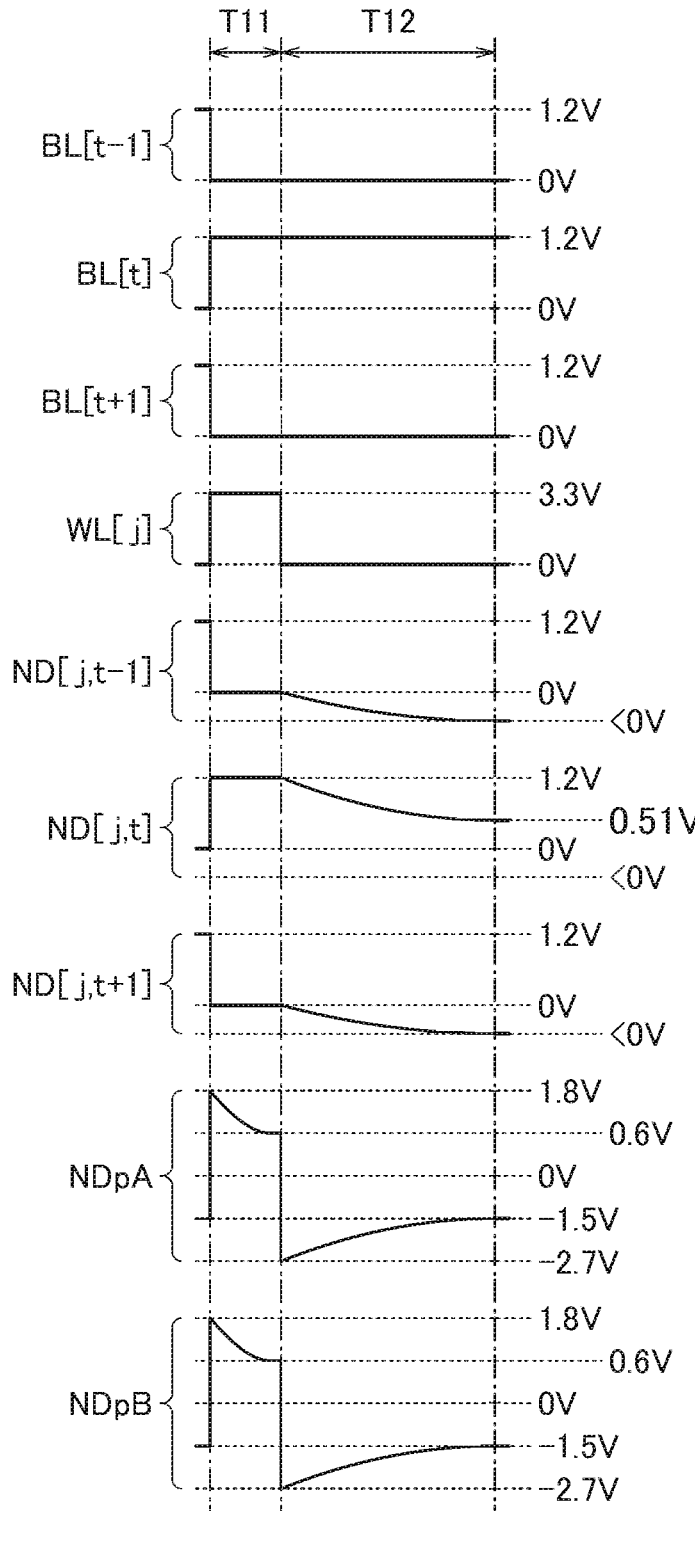
FIG. 8 is a timing chart showing operation of writing data to memory cells.

The case where "0", "1", and "0" are written to the memory cell 10[j,t−1], the memory cell 10[j,t], and the memory cell 10[j,t+1], respectively, is described with reference to FIG. 6B, FIG. 7A, FIG. 7B, and FIG. 8. FIG. 8 is a timing chart for showing the data writing operation. Note that reference numerals are sometimes omitted in the diagrams for visibility of the diagrams. The reference numerals that are not shown in FIG. 6B, FIG. 7A, and FIG. 7B can be understood by referring FIG. 6A and the like. Moreover, a potential that varies is shown to be enclosed by a black line.

First, in a period T11, 0 V is supplied to the bit line BL[t−1] and the bit line BL[t+1], and 1.2 V is supplied to the bit line BL[t]. The potential WLH (3.3 V) is supplied to the word line WL[j]. Thus, the transistor M1[j,t−1], the transistor M1[j,t], and the transistor M1[j,t+1] are turned on, whereby 0 V is written to the node ND[j,t−1] and the node ND[j,t+1] and 1.2 V is written to the node ND[j,t] (see FIG. 6B and FIG. 8).

As described above, the field-effect mobility of the parasitic transistor Trp is much lower than the field-effect mobility of the transistor M1. When the potentials of the parasitic node NDpA and the parasitic node NDpB just before the period T11 are −1.5 V, charge transfer just after the potential of the word line WL[j] is changed from 0 V to 3.3 V does not catch up, and the potentials of the parasitic node NDpA and the parasitic node NDpB become −1.5 V+3.3 V=1.8 V. After that, the potentials of both the parasitic node NDpA and the parasitic node NDpB become 0.6 V.

Next, in a period T12, the potential WLL (0 V) is supplied to the word line WL[j], so that the transistor M1[j,t−1], the transistor M1[j,t], and the transistor M1[j,t+1] are turned off. FIG. 7A illustrates a state just after the transistor M1[j,t−1], the transistor M1[j,t], and the transistor M1[j,t−1] are turned off (a state just after the period T12 starts). As described above, the field-effect mobility of the parasitic transistor Trp is much lower than the field-effect mobility of the transistor M1. Thus, charge transfer just after the potential of the word line WL[j] is changed from 3.3 V to 0 V does not catch up, and the potentials of the parasitic node NDpA and the parasitic node NDpB become 0.6 V–3.3 V=–2.7 V.

The state where the potential of the word line WL[j] is 0 V and the potentials of the parasitic node NDpA and the parasitic node NDpB are –2.7 V means that 2.7 V is applied to gates of the parasitic transistor TrpA and the parasitic transistor TrpB. Thus, the parasitic transistor TrpA and the parasitic transistor TrpB are turned on.

When the parasitic transistor TrpA and the parasitic transistor TrpB are on, charge transfer (charge redistribution) occurs between the node ND[j,t–1], the node ND[j,t], the node ND[j,t+1], the parasitic node NDpA, and the parasitic node NDpB. The charge transfer continues until the potentials of the parasitic node NDpA and the parasitic node NDpB become –1.5 V.

The potentials of the node ND[j,t–1], the node ND[j,t], and the node ND[j,t+1] after the completion of the charge transfer are determined by the electrostatic capacitances of the storage capacitor Cs, the parasitic capacitor CpA, and the parasitic capacitor CpB. In this circuit configuration, the potentials of the node ND[j,t–1] and the node ND[j,t+1] after the completion of the charge transfer become lower than 0 V, and the potential of the node ND[j,t] becomes 0.51 V (see FIG. 7B and FIG. 8).

When the potential of the node ND is lower than 0 V at the time of data reading, data stored in the memory cell 10 is identified as "0". Also when the potential of the node ND is 0.51 V at the time of data reading, data stored in the memory cell 10 is identified as "0". This means that data is properly written to the memory cell 10[j,t–1] and the memory cell 10[j,t+1], whereas data is not properly written to the memory cell 10[j,t].

In other words, at the time of data reading, data "0" written to the memory cell 10[j,t–1] and the memory cell 10[j,t+1] can be read as "0"; however, data "1" written to the memory cell 10[j,t] is read as "0".

Figure 9A:
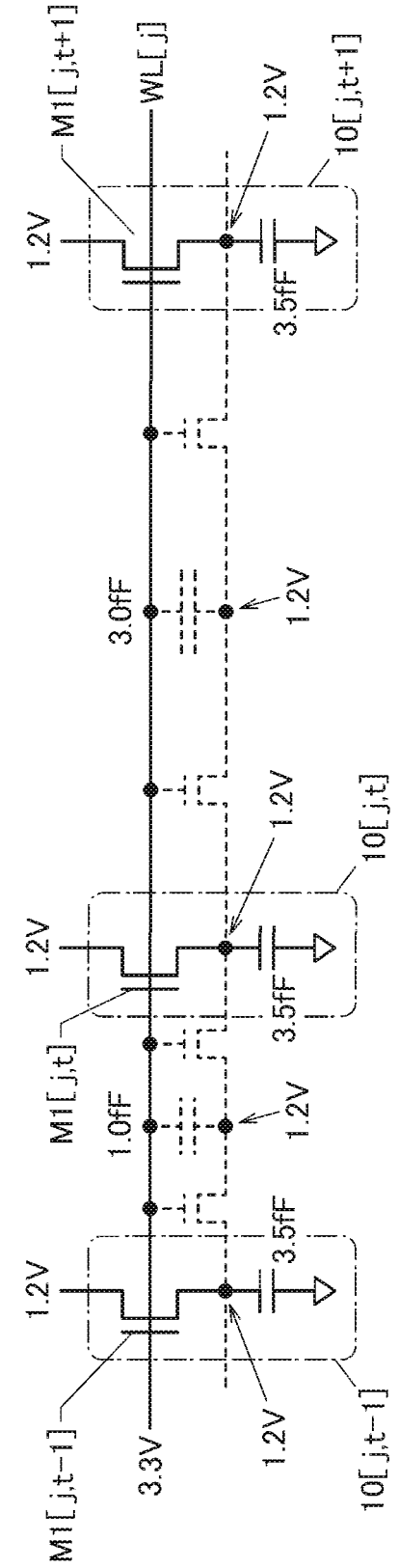
FIG. 9A and FIG. 9B are diagrams illustrating operation of writing data to memory cells.
Figure 9B:
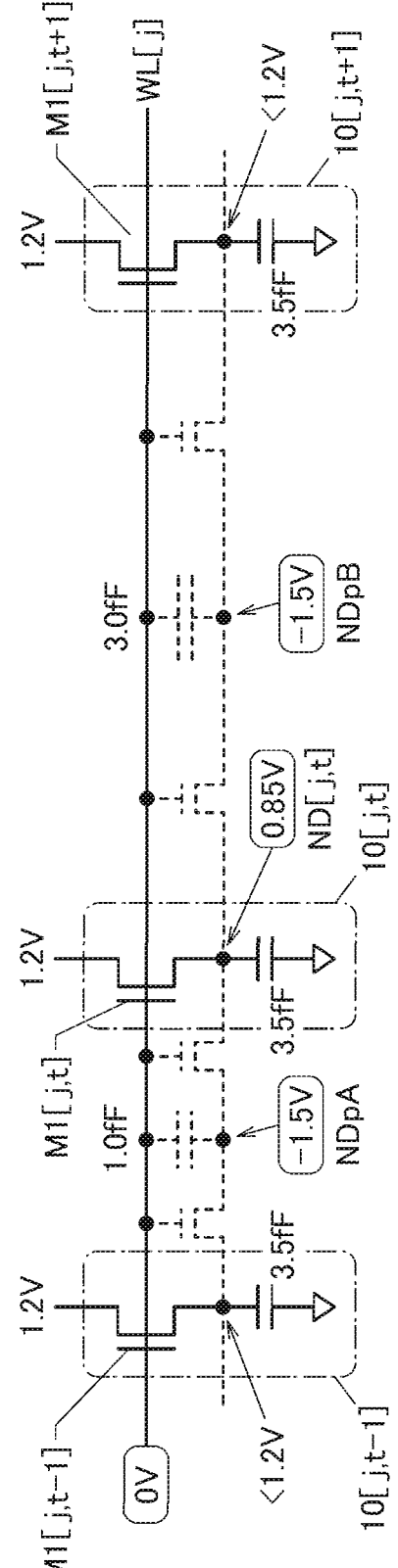
Figure 10:
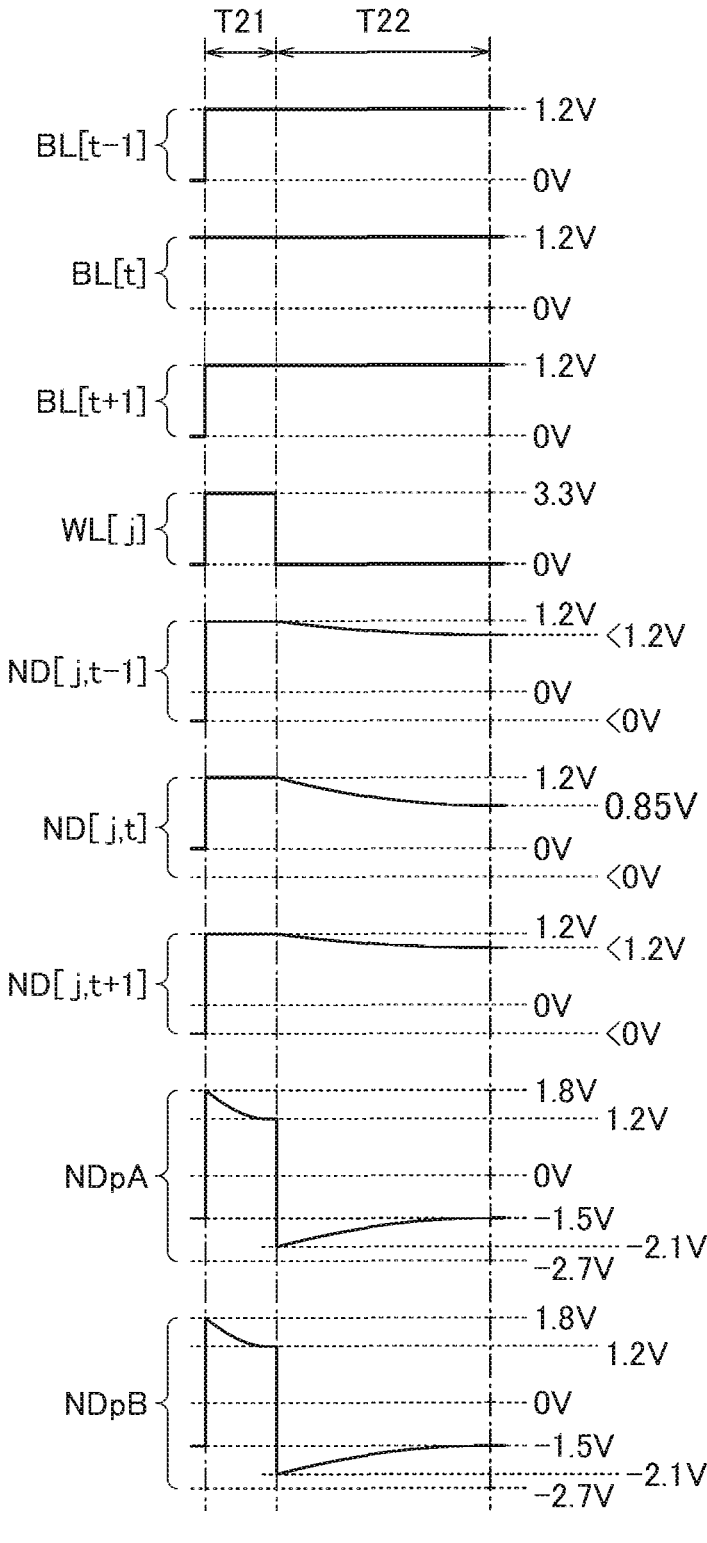
FIG. 10 is a timing chart showing operation of writing data to memory cells.

Next, the case where "1" is written to the memory cell 10[j,t–1], the memory cell 10[j,t], and the memory cell 10[j,t+1] is described with reference to FIG. 9A, FIG. 9B, and FIG. 10. As in the case of FIG. 6B, FIG. 7A, and FIG. 7B, the reference numerals that are not shown in FIG. 9A and FIG. 9B can be understood by referring FIG. 6A and the like. FIG. 10 is a timing chart for showing the data writing operation.

First, in a period T21, 1.2 V is supplied to the bit line BL[t–1], the bit line BL[t], and the bit line BL[t+1], and 3.3 V is supplied to the word line WL[j]. Thus, the transistor M1[j,t–1], the transistor M1[j,t], and the transistor M1[j,t+1] are turned on, whereby 1.2 V is written to the node ND[j, t–1], the node ND[j,t], and the node ND[j,t+1] (see FIG. 9A and FIG. 10).

As described above, when the potentials of the parasitic node NDpA and the parasitic node NDpB just before the period T21 are –1.5 V, the potentials of the parasitic node NDpA and the parasitic node NDpB become 1.8 V just after the potential of the word line WL[j] is changed from 0 V to 3.3 V. After that, the potentials of both the parasitic node NDpA and the parasitic node NDpB become 1.2 V.

Next, in a period T22, 0 V is supplied to the word line WL[j], so that the transistor M1[j,t–1], the transistor M1[j,t], and the transistor M1[j,t+1] are turned off. As described above, the potentials of the parasitic node NDpA and the parasitic node NDpB become 1.2 V–3.3V=–2.1 V just after the potential of the word line WL[j] is changed from 3.3 V to 0 V.

Then, charge transfer (charge redistribution) occurs between the node ND[j,t–1], the node ND[j,t], the node ND[j,t+1], the parasitic node NDpA, and the parasitic node NDpB until the potentials of the parasitic node NDpA and the parasitic node NDpB become –1.5 V.

The potentials of the node ND[j,t–1], the node ND[j,t], and the node ND[j,t+1] after the completion of the charge transfer are determined by the electrostatic capacitances of the storage capacitor Cs, the parasitic capacitor CpA, and the parasitic capacitor CpB. In this circuit configuration, the potential of the node ND[j,t] becomes 0.85 V (see FIG. 9B and FIG. 10). The potential of the node ND[j,t–1] after the completion of the charge transfer becomes higher than or equal to 0.86 V (see FIG. 12) and lower than 1.2 V owing to the influence of the node ND[j,t–2]. The potential of the node ND[j,t+1] after the completion of the charge transfer becomes higher than or equal to 0.86 V and lower than 1.2 V owing to the influence of the node ND[j,t+2].

As above, all the potentials of the node ND[j,t–1], the node ND[j,t], and the node ND[j,t+1] are higher than or equal to 0.6 V. Thus, the data written as data "1" can be properly read as the data "1".

Figure 11A:
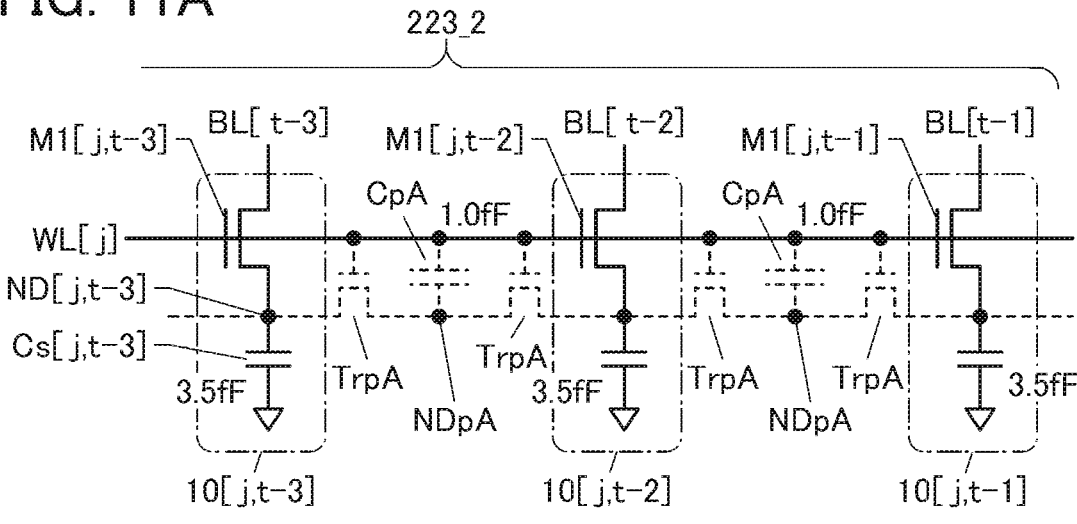
FIG. 11A to FIG. 11C are diagrams illustrating operation of writing data to memory cells.

Next, similar writing operation in the sub cell array 223 is described. FIG. 11A is a circuit diagram illustrating the memory cell 10[j,t–3], the memory cell 10[j,t–2], the memory cell 10[j,t–1], the parasitic transistors TrpA, and the parasitic capacitors CpA. The memory cell 10[j,t–3], the memory cell 10[j,t–2], and the memory cell 10[j,t–1] are memory cells included in the sub cell array 223_2.

The electrostatic capacitance of the parasitic capacitor CpA formed between the memory cell 10[j,t–3] and the memory cell 10[j,t–2], and the electrostatic capacitance of the parasitic capacitor CpA formed between the memory cell 10[j,t–2] and the memory cell 10[j,t–1] are both 1.0 fF.

Figure 11B:
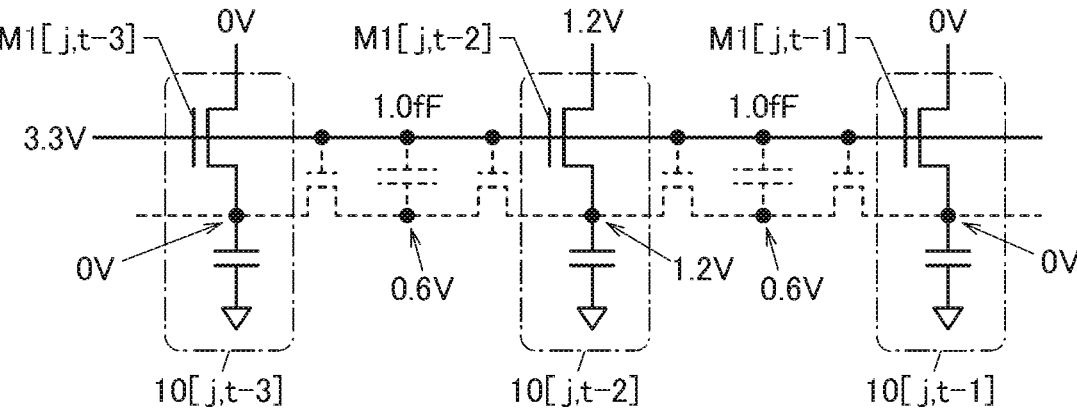
Figure 11C:
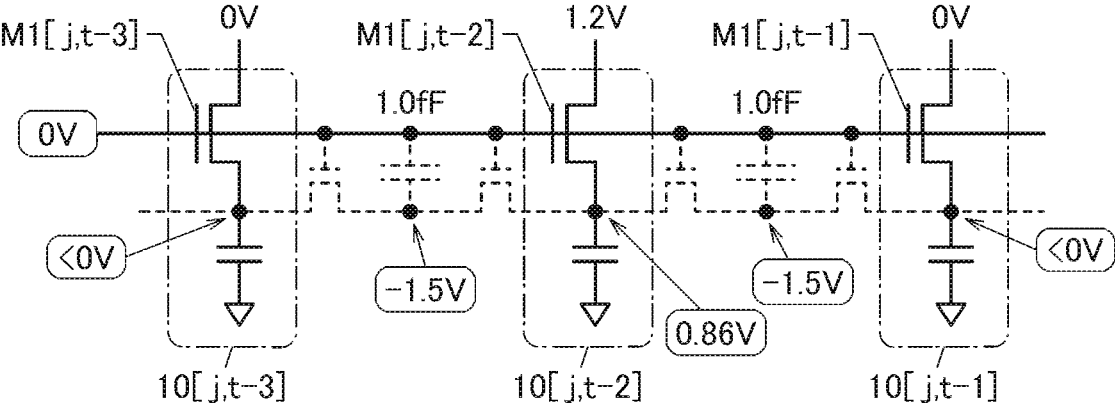
Figure 12:
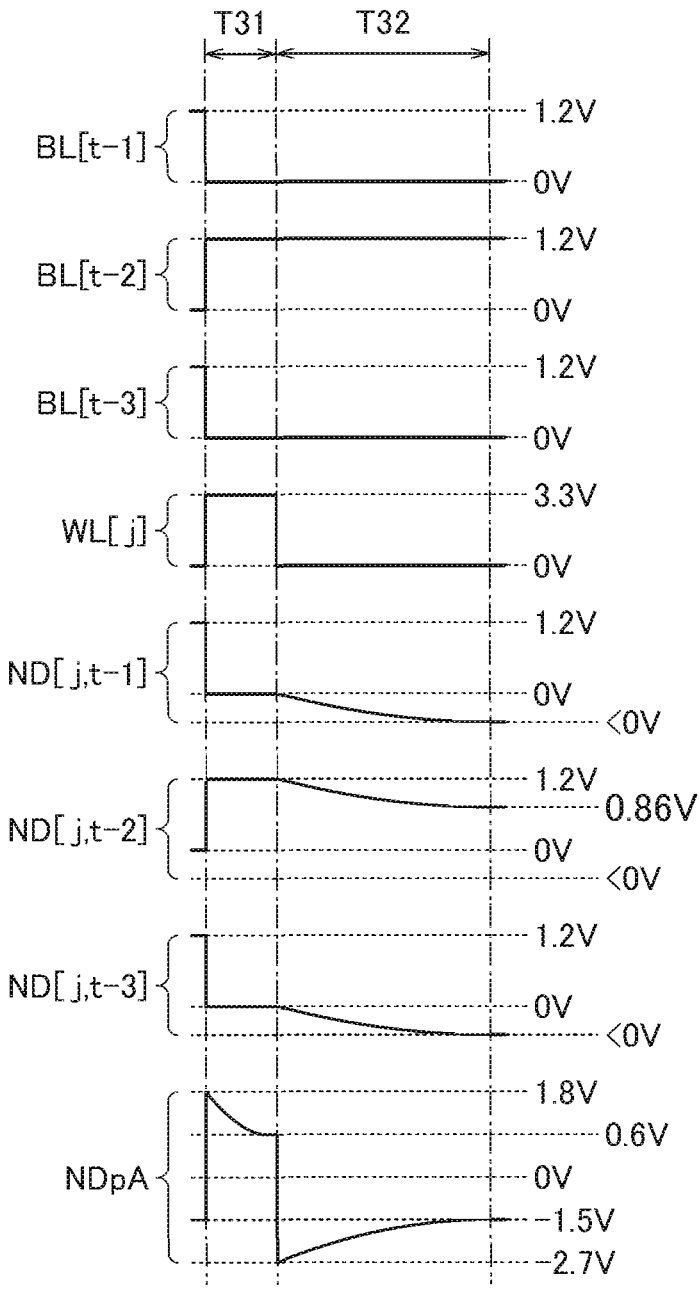
FIG. 12 is a timing chart showing operation of writing data to memory cells.

The case where "0", "1", and "0" are written to the memory cell 10[j,t–3], the memory cell 10[j,t–2], and the memory cell 10[j,t–1], respectively, is described with reference to FIG. 11B, FIG. 11C, and FIG. 12. Note that reference numerals are sometimes omitted in the diagrams for visibility of the diagrams. The reference numerals that are not shown in FIG. 11B and FIG. 11C can be understood by referring FIG. 11A and the like. FIG. 12 is a timing chart for showing the data writing operation.

First, in a period T31, 0 V is supplied to the bit line BL[t–3] and the bit line BL[t–1], and 1.2 V is supplied to the bit line BL[t–2]. Moreover, 3.3 V is supplied to the word line WL[j]. Thus, the transistor M1[j,t–3], the transistor M1[j, t–2], and the transistor M1[j,t–1] are turned on, whereby 0 V is written to the node ND[j,t–3] and the node ND[j,t–1] and 1.2 V is written to the node ND[j,t–2] (see FIG. 11B and FIG. 12).

As mentioned in the description of the period T11, when the potential of the parasitic node NDpA just before the period T31 is –1.5 V, the potential of the parasitic node NDpA becomes –1.5 V+3.3 V=1.8 V just after the potential of the word line WL[j] is changed from 0 V to 3.3 V. After that, as shown in FIG. 11B, the potentials of both two parasitic nodes NDpA become 0.6 V.

Next, in a period T32, 0 V is supplied to the word line WL[j], so that the transistor M1[j,t–3], the transistor M1[j, t–2], and the transistor M1[j,t–1] are turned off. As described above, the potential of the parasitic node NDpA just after 0 V is supplied to the word line WL[j] (just after the period T32 starts) becomes –2.7 V. After that, the potential of the parasitic node NDpA becomes –1.5 V owing to charge redistribution.

In this circuit configuration, the electrostatic capacitance of the parasitic capacitor CpA formed between the memory cell 10[j,t–3] and the memory cell 10[j,t–2], and the electrostatic capacitance of the parasitic capacitor CpA formed between the memory cell 10[j,t−2] and the memory cell 10[j,t−1] are both 1.0 fF. Thus, in this circuit configuration, the potentials of the node ND[j,t−3] and the node ND[j,t−1] after the completion of the charge transfer become lower than 0 V, and the potential of the node ND[j,t−2] becomes 0.86 V (see FIG. 11C and FIG. 12).

As described above, when the potential of the node ND is lower than 0 V at the time of data reading, data stored in the memory cell 10 is identified as "0". When the potential of the node ND is 0.86 V at the time of data reading, data stored in the memory cell 10 is identified as "1".

Thus, the data written to the memory cell 10[j,t−3], the memory cell 10[j,t−2], and the memory cell 10[j,t−1] are found to be properly written.

As above, in the memory cell 10 positioned in an end portion of the sub cell array 223, a writing error is likely to occur because of parasitic capacitance generated in the adjoining region 226 adjacent to the sub cell array 223. In other words, reducing the parasitic capacitance of the adjoining region 226 can suppress occurrence of writing errors.

The parasitic capacitance generated at the word line WL between the adjacent memory cells 10 changes in proportion to the length of the word line WL between the adjacent memory cells 10. Thus, the parasitic capacitance can be reduced by decreasing the length of the word line WL between the adjacent memory cells 10.

Figure 13A:
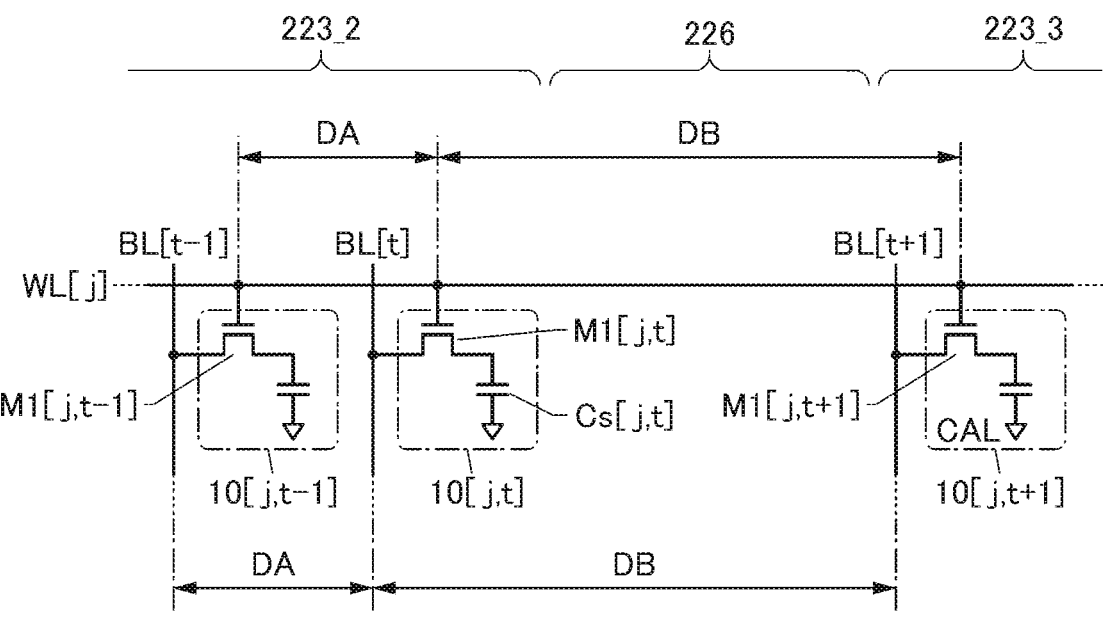
FIG. 13A and FIG. 13B are diagrams showing the relation between the distance between adjacent sub cell arrays and a retention potential of a node ND.

As illustrated in FIG. 13A, the length of the word line WL[j] from the gate electrode of the transistor M1[j,t−1] included in the memory cell 10[j,t−1] in the sub cell array to the gate electrode of the transistor M1[j,t] included in the memory cell 10[j,t] in the same sub cell array is referred to as a distance DA.

The length of the word line WL[j] from the gate electrode of the transistor M1[j,t] included in the memory cell 10[j,t] positioned in an end portion of the sub cell array to the gate electrode of the transistor M1[j,t+1] included in the memory cell 10[j,t+1] positioned in an end portion of the adjacent sub cell array is referred to as a distance DB. The distance DB can be said to be the shortest distance between the adjacent sub cell arrays.

In general, in the cell array, the transistors and the capacitors included in the memory cells 10, the wirings connected to the memory cells 10, and the like are arranged at regular intervals. Hence, the distance DA can be said to be the shortest distance between the bit line BL[t−1] and the bit line BL[t], which are adjacent in the sub cell array. Similarly, the distance DB can be said to be the shortest distance from the bit line BL[t], which is positioned in the end portion of the sub cell array, to the bit line BL[t+1], which is positioned in the end portion of the adjacent sub cell array.

Figure 13B:
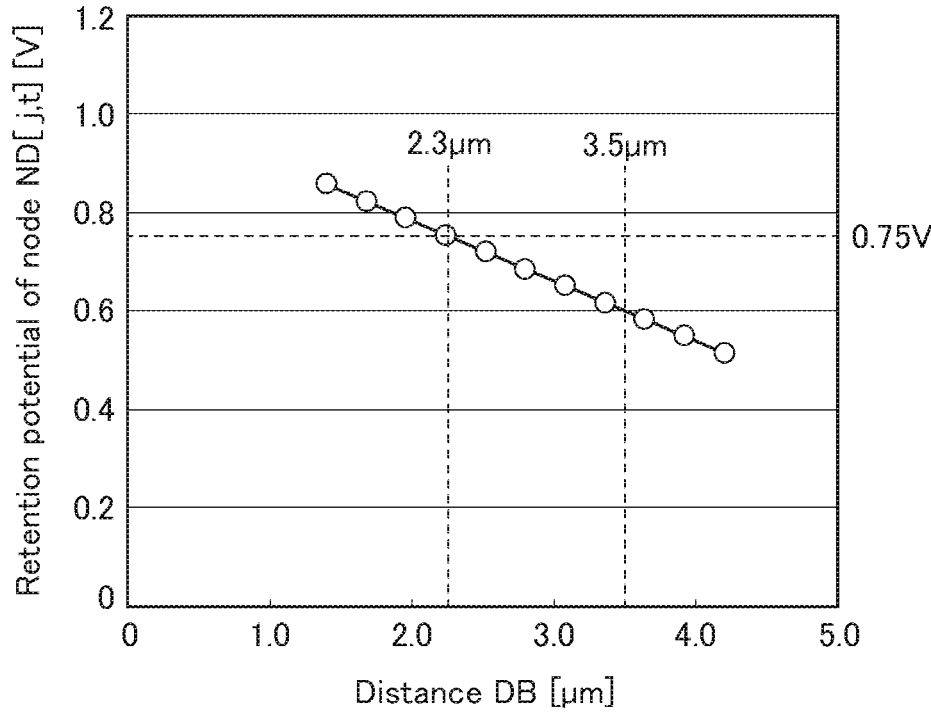

The parasitic capacitance CpA is proportional to the distance DA, and the parasitic capacitance CpB is proportional to the distance DB. FIG. 13B is a graph obtained by calculating the relation between the distance DB and the retention potential of the node ND[j,t] when the above-described data writing operation is performed. The graph shown in FIG. 13B is calculated given that the electrostatic capacitance of the storage capacitor Cs is 3.5 fF, the electrostatic capacitance of the parasitic capacitor CpA is 1.0 fF, and the distance DA is 1.4 μm.

As described above, when "1" is written to the node ND[j,t] and "1" is read from the node ND[j,t], the retention potential of the node ND[j,t] needs to be 0.6 V or higher. It is found from FIG. 13B that the distance DB needs to be 3.5 μm or less in order that the retention potential of the node ND[j,t] to which "1" has been written is 0.6 V or higher.

To make the operation of the memory device 100 more stable, the retention potential of the node ND[j,t] to which "1" has been written is preferably 0.75 V or higher. It is found from FIG. 13B that the distance DB needs to be 2.3 μm or less in order that the retention potential of the node ND[j,t] is 0.75 V or higher.

The distance DB is preferably 1 time or more and 3.5 times or less, further preferably 1 time or more and 2.3 times or less the distance DA.

Making the distance DB closer to the distance DA can reduce writing errors in the memory device 100. Making the distance DB closer to the distance DA can improve the reliability of the memory device 100.

Figures 14A, 14B:
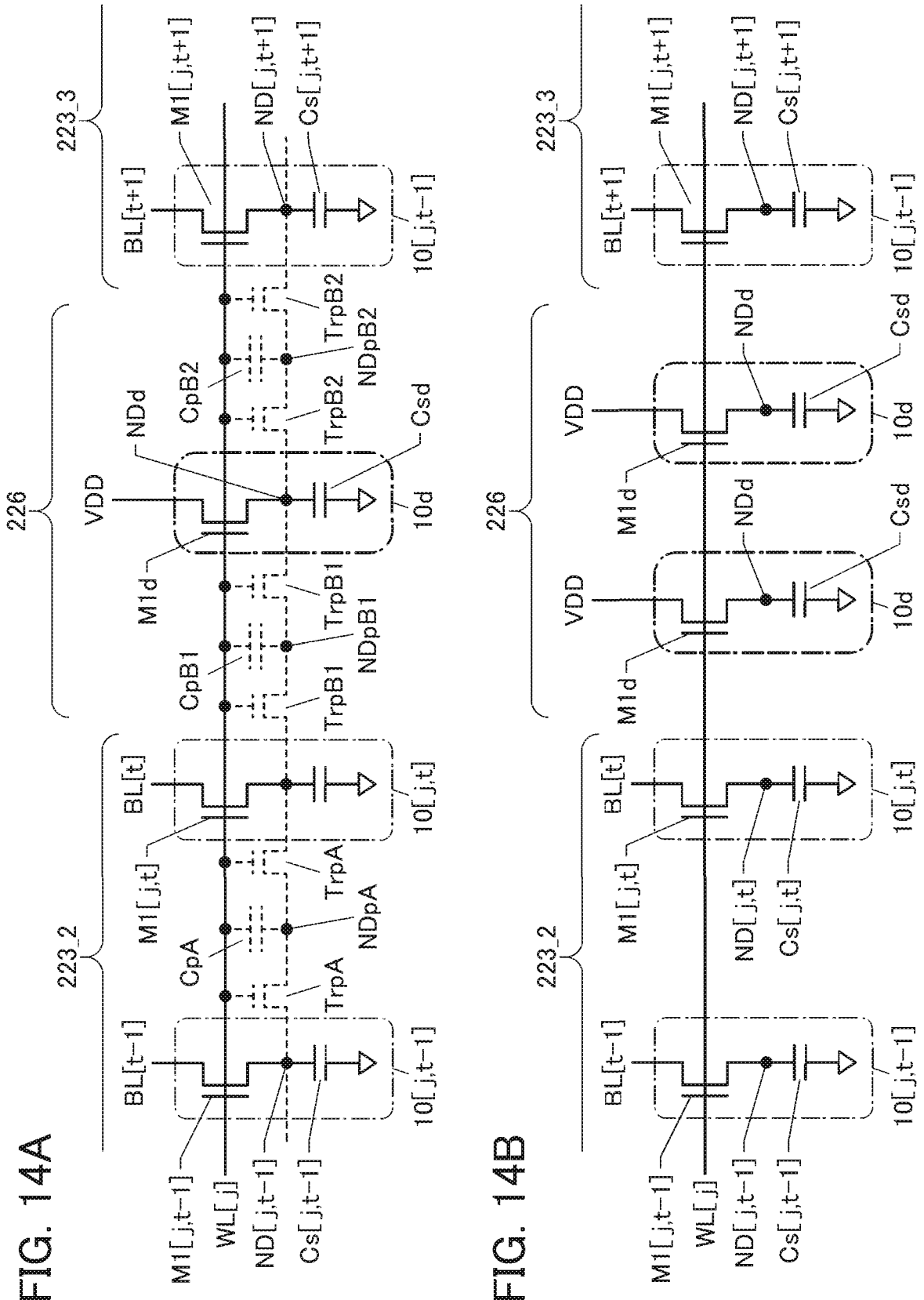
FIG. 14A and FIG. 14B are diagrams each illustrating a circuit configuration example of a dummy memory cell.

As illustrated in FIG. 14A, a dummy memory cell 10d may be provided in the adjoining region 226. The dummy memory cell 10d includes a transistor M1d and a storage capacitor Csd. One of a source and a drain of the transistor M1d is electrically connected to one electrode of the storage capacitor Csd through a node NDd. The other electrode of the storage capacitor Csd is electrically connected to the wiring CAL. A gate of the transistor M1d is electrically connected to the word line WL[j]. The other of the source and the drain of the transistor M1d is supplied with VDD (1.2 V in this embodiment).

When one dummy memory cell 10d is provided in the adjoining region 226, the parasitic capacitor CpB can be divided into a parasitic capacitor CpB1 and a parasitic capacitor CpB2. When one dummy memory cell 10d is provided in the middle of the word line WL[j] in a region overlapping the adjoining region 226, the parasitic capacitor CpB can be halved. Similarly, the parasitic transistor TrpB can be divided into a parasitic transistor TrpB1 and a parasitic transistor TrpB2. The parasitic node NDpB can be divided into a parasitic node NDpB1 and a parasitic node NDpB2.

Figures 15A, 15B:
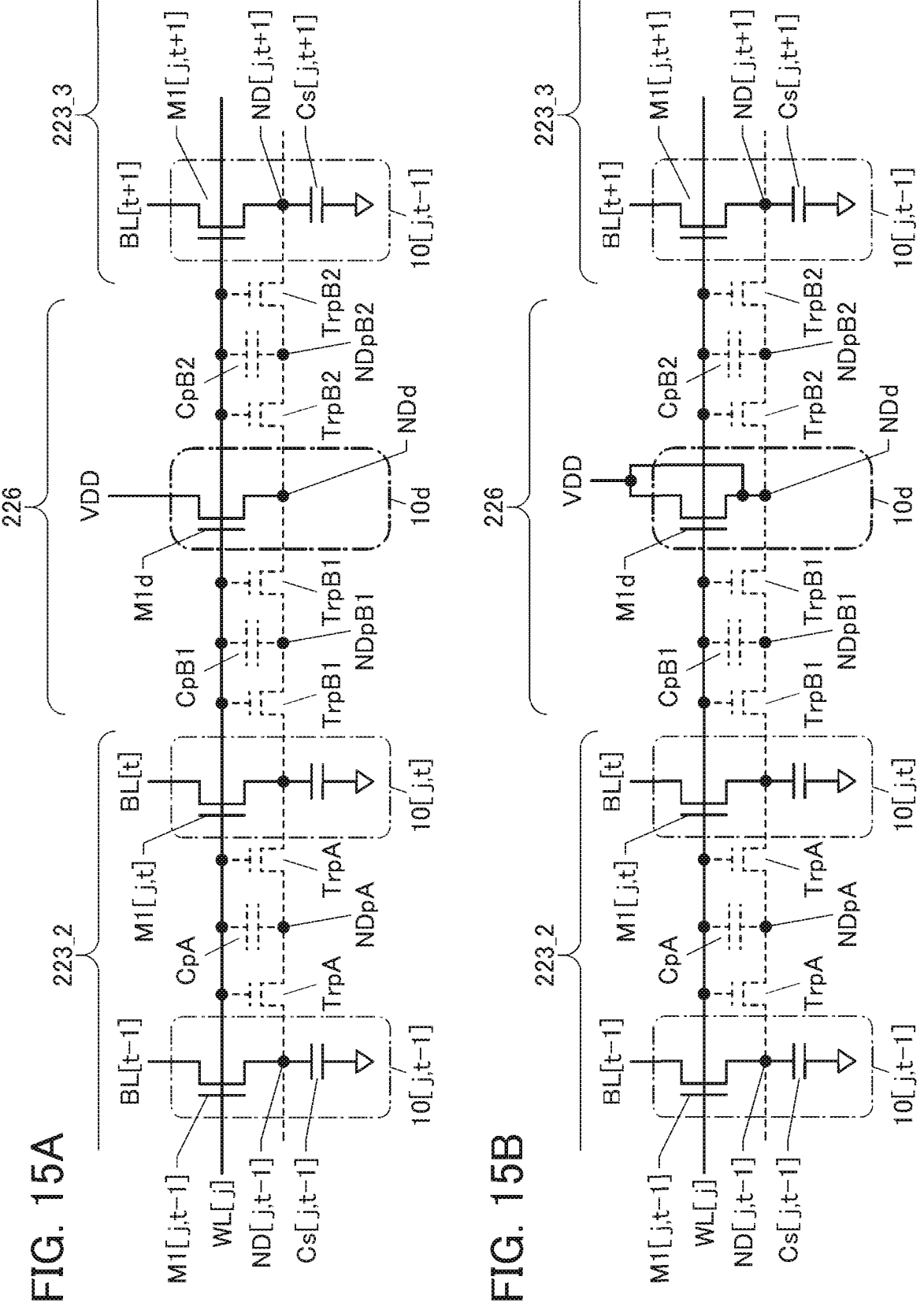
FIG. 15A and FIG. 15B are diagrams each illustrating a circuit configuration example of a dummy memory cell.

Alternatively, as illustrated in FIG. 14B, a plurality of dummy memory cells 10d may be provided in the adjoining region 226. As illustrated in FIG. 15A, the node NDd may be in a floating state without providing the storage capacitor Csd in the dummy memory cell 10d. As illustrated in FIG. 15B, VDD may be supplied to the source and the drain of the transistor M1d without providing the storage capacitor Csd in the dummy memory cell 10d.

Providing the dummy memory cell 10d in the adjoining region 226 can reduce writing errors in the memory device 100. Providing the dummy memory cell 10d in the adjoining region 226 can improve the reliability of the memory device 100.

Figure 16A:
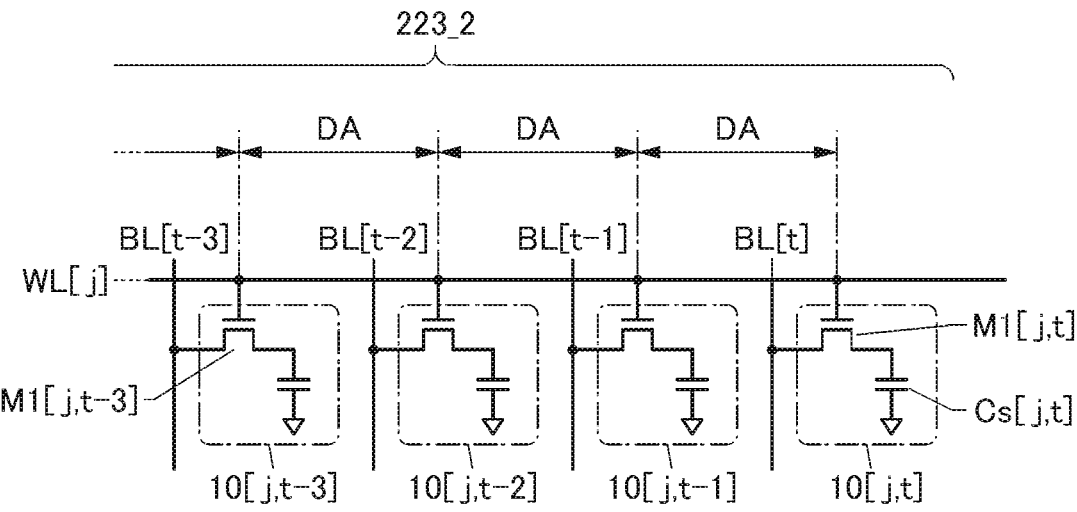
FIG. 16A and FIG. 16B are diagrams showing the relation between a memory cell pitch and a retention potential of the node ND.

As illustrated in FIG. 16A, the distance DA can be regarded as the pitch (arrangement interval) of the memory cells 10 arranged in a matrix.

Figure 16B:
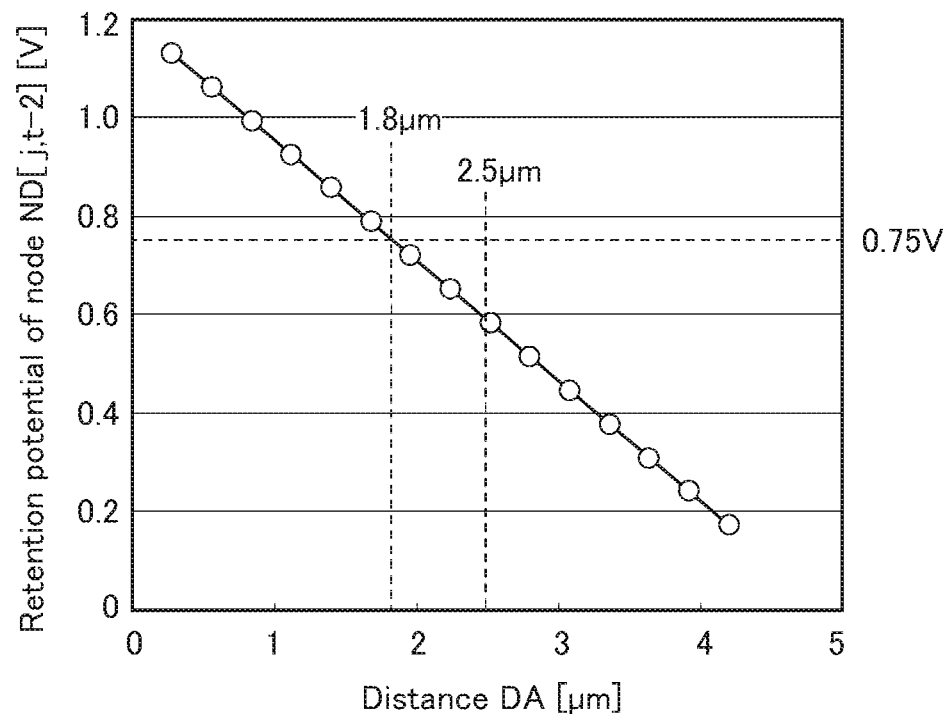

FIG. 16B is a graph obtained by calculating the relation between the distance DA and the retention potential of the node ND[j,t−2] when the electrostatic capacitance of the storage capacitor Cs is 3.5 fF. It is found from FIG. 16B that the distance DA needs to be 2.5 μm or less in order that the retention potential of the node ND[j,t−2] to which "1" has been written is 0.6 V or higher. It is also found that the distance DA needs to be 1.8 μm or less in order that the retention potential of the node ND[j,t−2] to which "1" has been written is 0.75 V or higher.

In other words, the pitch of the memory cells 10 arranged in a matrix needs to be 2.5 μm or less in order that the retention potential of the node ND[j,t−2] to which "1" has been written is 0.6 V or higher. The pitch of the memory cells 10 arranged in a matrix needs to be 1.8 μm or less in order that the retention potential of the node ND[j,t−2] to which "1" has been written is 0.75 V or higher.

Setting the pitch of the memory cells 10 arranged in a matrix to 2.5 μm or less, preferably 1.8 μm or less can reduce writing errors in the memory device 100. Setting the pitch of the memory cells 10 arranged in a matrix to 2.5 μm or less, preferably 1.8 μm or less can improve the reliability of the memory device 100.

Figure 17A:
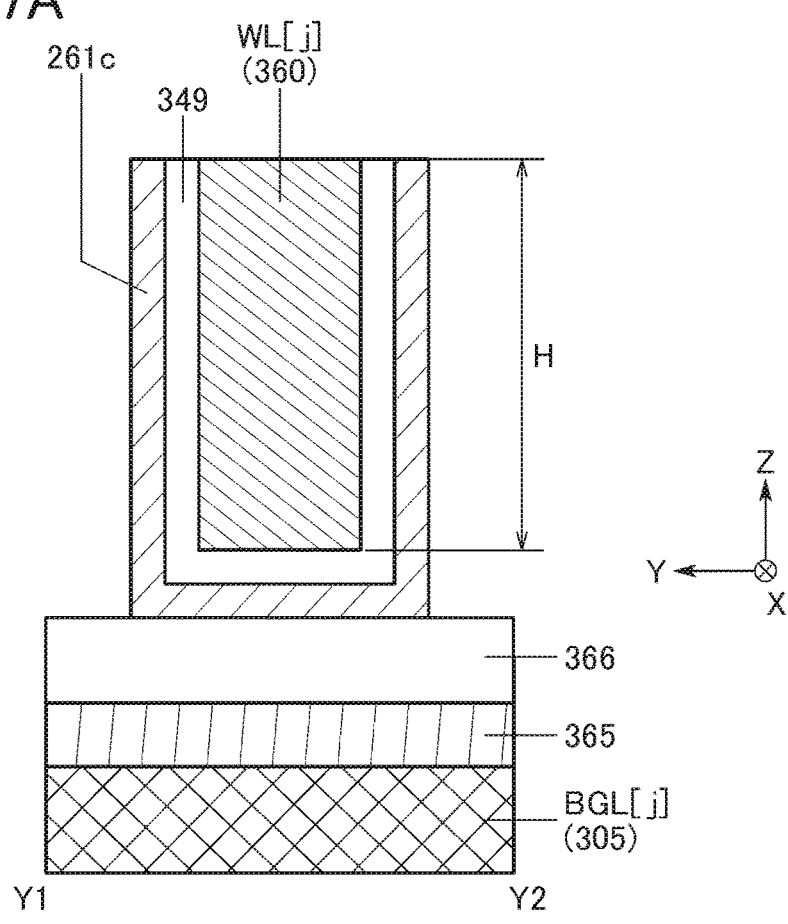
FIG. 17A and FIG. 17B are diagrams showing the relation between the height of a word line and a retention potential of the node ND.

FIG. 17A is a cross-sectional view of the Y1-Y2 portion indicated by the dashed-dotted line in FIG. 5B. The electrostatic capacitances of the parasitic capacitor CpA and the parasitic capacitor CpB are proportional to the area where the word line WL[j] and the oxide layer 261c overlap each other. When the wiring BGL[j] is supplied with the negative voltage, carriers are less likely to be generated in the oxide layer 261c overlapped by the bottom surface of the word line WL[j]. Thus, when the distance DA and the distance DB are fixed, reducing the height H of the word line WL[j] shown in FIG. 5B can reduce the electrostatic capacitances of the parasitic capacitor CpA and the parasitic capacitor CpB.

Figure 17B:
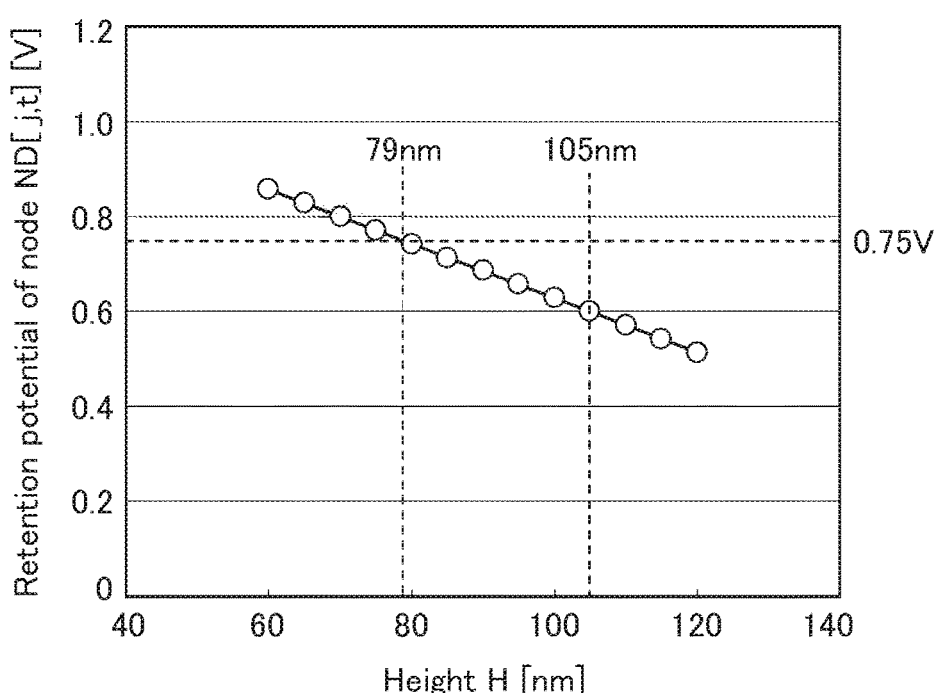

FIG. 17B is a graph showing the relation between the height H of the word line WL[j] and the retention potential of the node ND[j,t] when the above-described data writing operation is performed. The graph shown in FIG. 17B is calculated given that the electrostatic capacitance of the storage capacitor Cs is 3.5 fF, the electrostatic capacitance of the parasitic capacitor CpA when the height H is 120 nm is 1.0 fF, the electrostatic capacitance of the parasitic capacitor CpB when the height H is 120 nm is 3.0 fF, the distance DA is 1.4 μm, and the distance DB is 4.2 μm.

It is found from FIG. 17B that the height H needs to be 105 nm or less in order that the retention potential of the node ND[j,t] to which "1" has been written is 0.6 V or higher. It is also found that the height H needs to be 79 nm or less in order that the retention potential of the node ND[j,t] to which "1" has been written is 0.75 V or higher.

Reducing (lowering) the height H of the word line WL[j] can reduce writing errors in the memory device 100. Reducing the height H of the word line WL[j] can improve the reliability of the memory device 100.

By increasing Vth of the parasitic transistor Trp, the amount of charge transferred between the node ND and the parasitic node NDp can be reduced. Thus, a decrease in the retention potential of the node ND can be reduced.

For example, when a material with a small electron affinity is used for the oxide layer 261c, Vth of the parasitic transistor Trp can be increased. In this case, the electron affinity of the oxide layer 261c is preferably smaller than the electron affinity of the oxide layer 261b. When the electron affinity of the oxide layer 261c is smaller than the electron affinity of the oxide layer 261b, Vth of the parasitic transistor Trp can be made higher than Vth of the transistor M1.

For example, when an In-M-Zn oxide (the element M is one or more kinds selected from gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is used for the oxide layer 261b, the atomic ratio of the element M to In in a metal oxide used for the oxide layer 261c is preferably greater than the atomic ratio of the element M to In in the metal oxide used for the oxide layer 261b. Alternatively, an M-Zn oxide or an M oxide is preferably used as the metal oxide used for the oxide layer 261c.

Increasing Vth of the parasitic transistor Trp can reduce writing errors in the memory device 100. Consequently, the memory device 100 can have higher reliability.

Alternatively, the potential WLH and the potential WLL, which are supplied to the word line WL, may be lowered without changing the potential difference between the potential WLH and the potential WLL. This can reduce writing errors in the memory device 100.

Figures 18A, 18B:
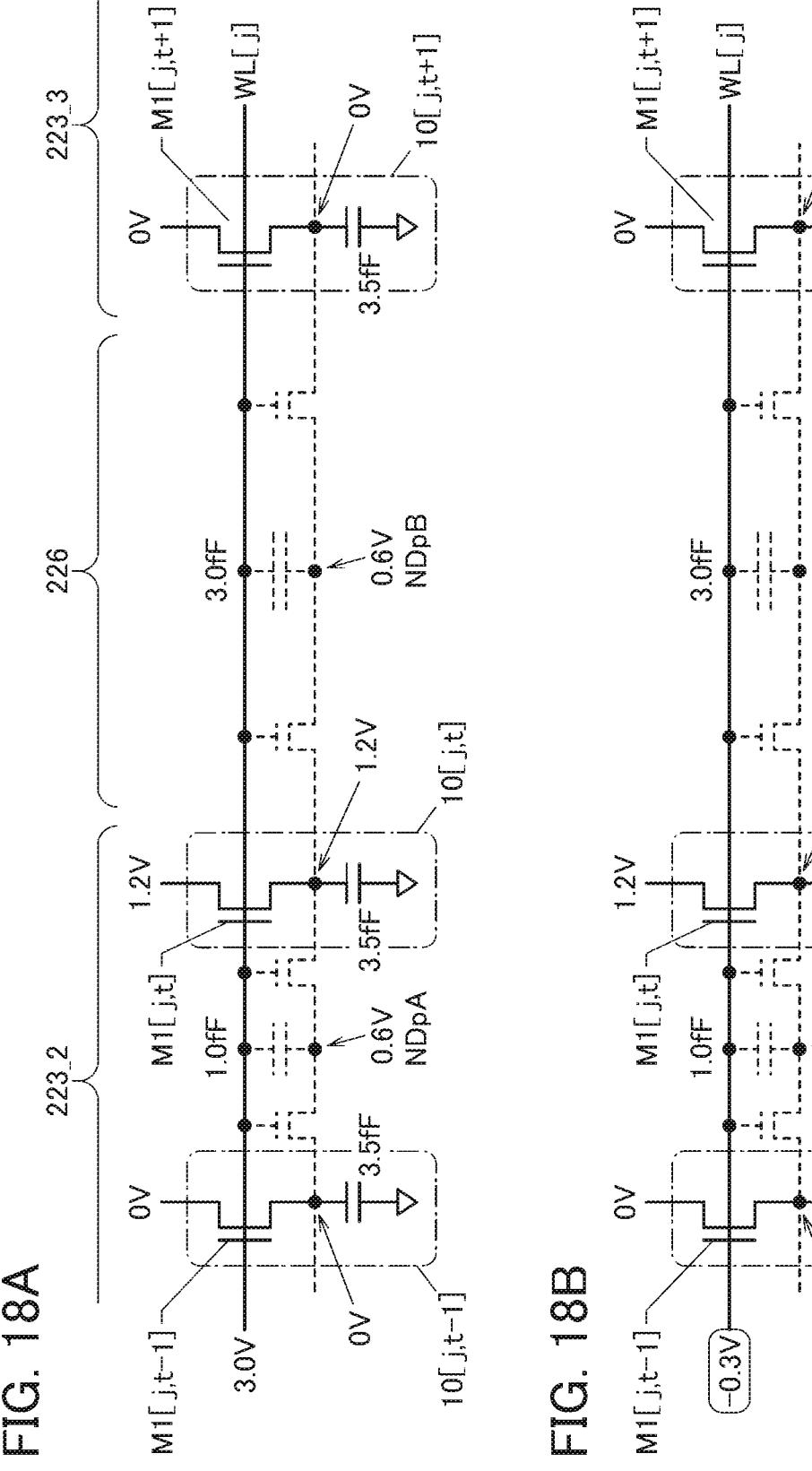
FIG. 18A and FIG. 18B are diagrams illustrating operation of writing data to memory cells.
Figure 19:
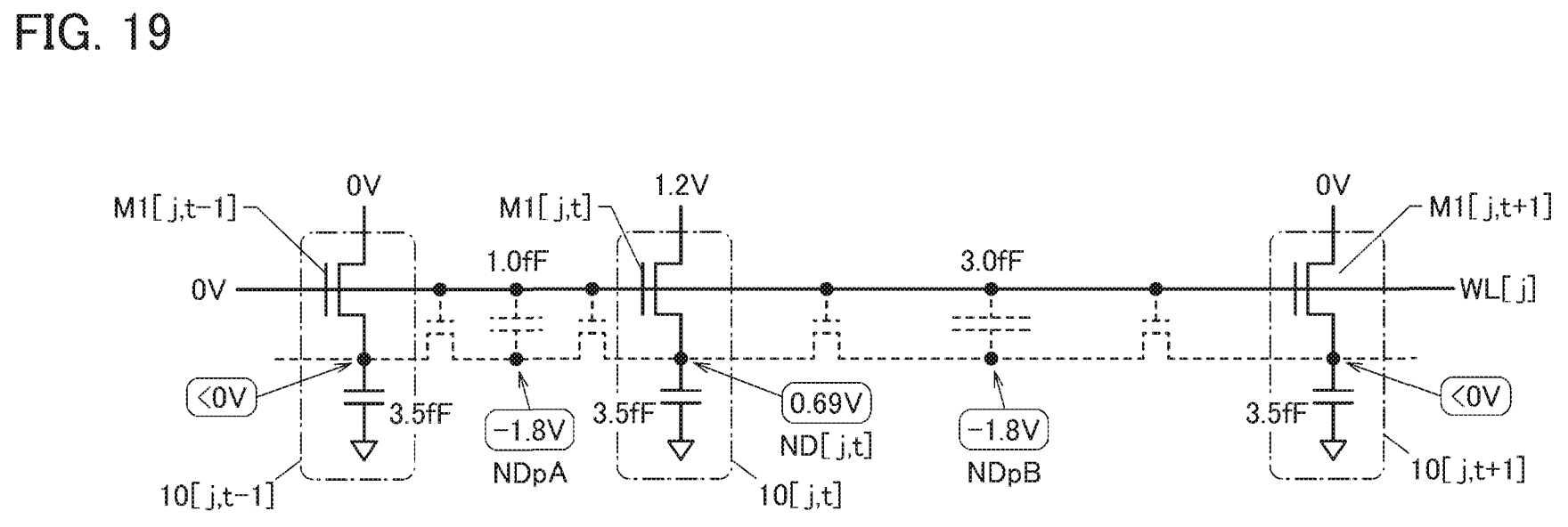
Figure 20:
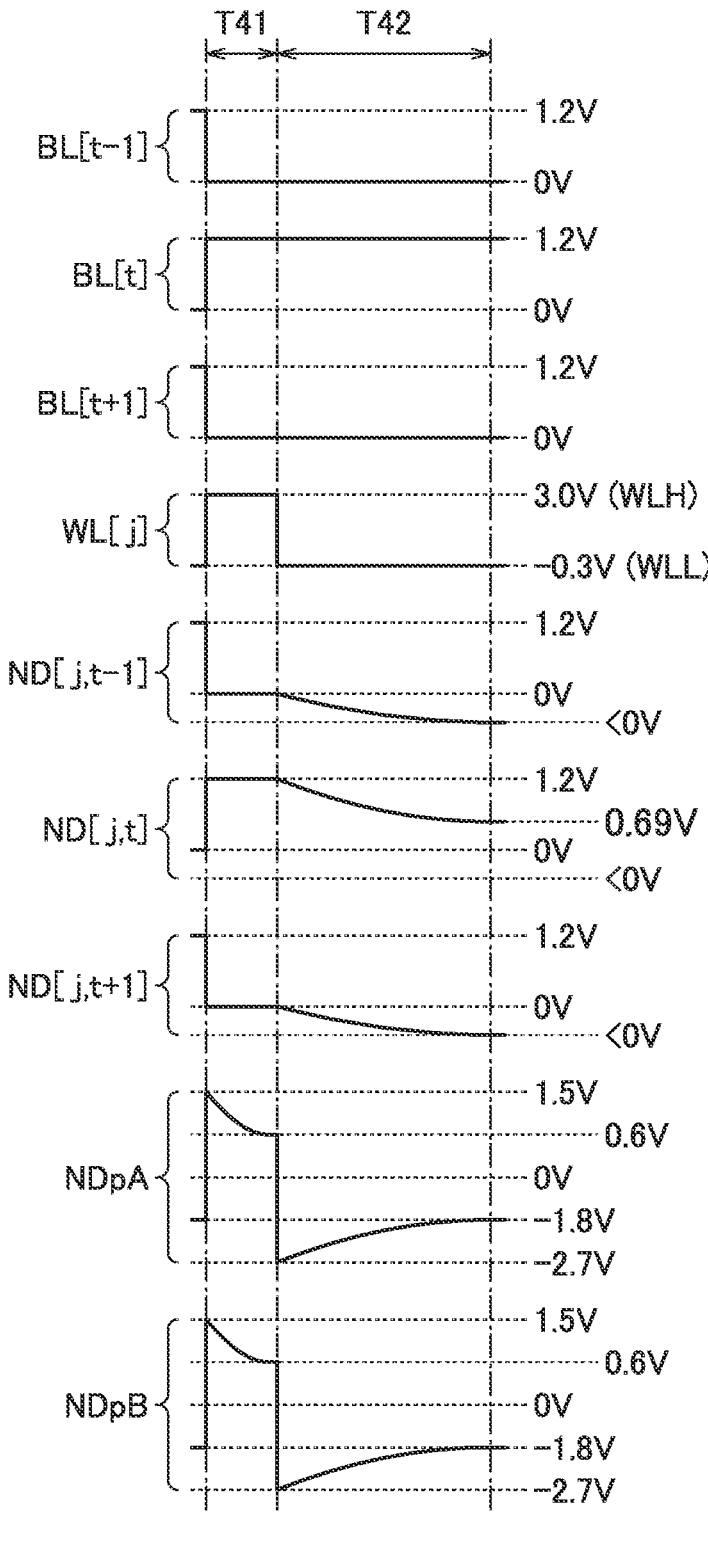
FIG. 20 is a timing chart showing operation of writing data to memory cells.

The description will be made on the operation of writing data to the memory cell 10[j,t] when the storage capacitance Cs is 3.5 fF, the parasitic capacitance CpA is 1.0 fF, the parasitic capacitance CpB is 3.0 fF, the potential WLH is 3.0 V, and the potential WLL is −0.3 V. The case where "0", "1", and "0" are written to the memory cell 10[j,t−1], the memory cell 10[j,t], and the memory cell 10[j,t+1], respectively, is described with reference to FIG. 18A, FIG. 18B, FIG. 19, and FIG. 20. FIG. 20 is a timing chart for showing the data writing operation. FIG. 18A, FIG. 18B, and FIG. 19 are circuit diagrams corresponding to FIG. 6A. In FIG. 18A, FIG. 18B, and FIG. 19, some reference numerals are omitted for visibility of the diagrams. The reference numerals that are not shown in FIG. 18A, FIG. 18B, and FIG. 19 can be understood by referring FIG. 6A and the like.

First, in a period T41, 0 V is supplied to the bit line BL[t−1] and the bit line BL[t+1], and 1.2 V is supplied to the bit line BL[t]. The potential WLH (3.0 V) is supplied to the word line WL[j]. Thus, the transistor M1[j,t−1], the transistor M1[j,t], and the transistor M1[j,t+1] are turned on, whereby 0 V is written to the node ND[j,t−1] and the node ND[j,t+1] and 1.2 V is written to the node ND[j,t].

When the potentials of the parasitic node NDpA and the parasitic node NDpB just before the period T41 are −1.8 V, the potentials of the parasitic node NDpA and the parasitic node NDpB become 1.5 V just after the potential of the word line WL[j] is changed from −0.3 V to 3.0 V. After that, the potentials of both the parasitic node NDpA and the parasitic node NDpB become 0.6 V (see FIG. 18A and FIG. 20).

Next, in a period T42, the potential WLL (+0.3 V) is supplied to the word line WL[j], so that the transistor M1[j,t−1], the transistor M1[j,t], and the transistor M1[j,t+1] are turned off. FIG. 18B illustrates a state just after the transistor M1[j,t−1], the transistor M1[j,t], and the transistor M1[j,t+1] are turned off (a state just after the period T42 starts). As described above, charge transfer just after the potential of the word line WL[j] is changed from 3.0 V to −0.3 V does not catch up, and the potentials of the parasitic node NDpA and the parasitic node NDpB become 0.6 V−3.3 V=−2.7 V.

The state where the potential of the word line WL[j] is −0.3 V and the potentials of the parasitic node NDpA and the parasitic node NDpB are −2.7 V means that 2.4 V is applied to the gates of the parasitic transistor TrpA and the parasitic transistor TrpB. Thus, the parasitic transistor TrpA and the parasitic transistor TrpB are turned on.

When the parasitic transistor TrpA and the parasitic transistor TrpB are on, charge transfer (charge redistribution) occurs between the node ND[j,t−1], the node ND[j,t], the node ND[j,t+1], the parasitic node NDpA, and the parasitic node NDpB. Since the potential of the word line WL[j] is −0.3 V, the charge transfer continues until the potentials of the parasitic node NDpA and the parasitic node NDpB become −1.8 V.

The potentials of the node ND[j,t−1], the node ND[j,t], and the node ND[j,t+1] after the completion of the charge transfer are determined by the electrostatic capacitances of the storage capacitor Cs, the parasitic capacitor CpA, and the parasitic capacitor CpB. In this circuit configuration, the potentials of the node ND[j,t−1] and the node ND[j,t+1] after the completion of the charge transfer become lower than 0 V, and the potential of the node ND[j,t] becomes 0.69 V (see FIG. 19 and FIG. 20).

Since the potential of the node ND[j,t] is higher than or equal to 0.6 V, the data written to the node ND[j,t] can be read as "1". Consequently, lowering the potential WLH and the potential WLL enables data to be written properly to the memory cell 10.

When the potential WLH and the potential WLL are lowered, the amount of charge transferred between the parasitic node NDpA and the parasitic node NDpB is reduced, and a decrease in the potentials of the node ND[j,t−1], the node ND[j,t], and the node ND[j,t+1] can be reduced.

Lowering the potential WLH and the potential WLL can reduce writing errors in the memory device 100. Lowering the potential WLH and the potential WLL can improve the reliability of the memory device 100.

When the potential WLH and the potential WLL are further lowered, writing errors in the memory device 100 can be further reduced. For example, when the potential WLH is set to 2.8 V and the potential WLL is set to +0.5 V, the potential of the node ND[j,t] to which data "1" has been written can be 0.8 V.

Meanwhile, in order to turn on the transistor M1 surely, the potential WLH needs to be higher than or equal to a potential obtained by adding Vth of the transistor M1 to a potential supplied to the bit line BL. For example, when Vth of the transistor M1 is 0.5 V, since data "1" is 1.2 V in this embodiment, the potential WLH needs to be higher than or equal to 1.7 V.

When the potential difference between the potential WLH and the potential WLL is made small, an effect equivalent to that when the potential WLH and the potential WLL are lowered can be obtained.

This embodiment can be implemented in an appropriate combination with the structures described in the other embodiments and the like.

Embodiment 2

This embodiment will describe the relation between the time of retaining data written to the memory cell 10 and the leak current (leakage current) of the storage capacitor Cs.

Figure 21A:
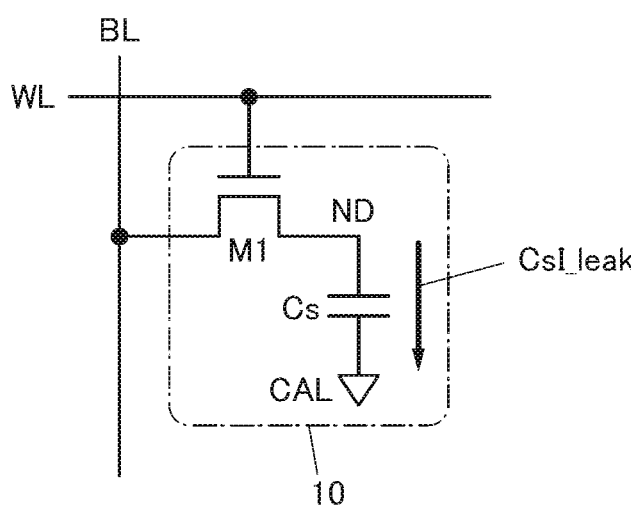
FIG. 21A and FIG. 21B are diagrams showing the relation between data retention time and leak current of a capacitor.

FIG. 21A illustrates a circuit configuration example of the memory cell 10. The memory cell 10 includes the transistor M1 and the storage capacitor Cs.

One of the source and the drain of the transistor M1 is electrically connected to one electrode of the storage capacitor Cs. The other of the source and the drain of the transistor M1 is electrically connected to one bit line BL. The gate of the transistor M1 is electrically connected to the word line WL. A node where the one of the source and the drain of the transistor M1 and the one electrode of the storage capacitor Cs are electrically connected to each other is referred to as the node ND.

The wiring CAL functions as a wiring for applying a predetermined potential to the other electrode of the storage capacitor Cs. A fixed potential (e.g., 0 V) is preferably applied to the wiring CAL.

Data writing is performed by applying a high-level potential to the word line WL to turn on the transistor M1 so that the bit line BL and the node ND are electrically connected to each other. After the data writing ends, a low-level potential (e.g., 0 V or a negative potential) is applied to the word line WL to turn off the transistor M1. The data written to the memory cell 10 is held in the node ND as charge.

As described in the above embodiment, an OS transistor is preferably used as the transistor M1. An OS transistor has a characteristic of an extremely low off-state current. The use of an OS transistor as the transistor M1 enables the leakage current of the transistor M1 to be extremely low. Thus, data written to the node ND can be retained for a long time.

For long-term retention of data written to the node ND, it is also important to reduce a leakage current that flows from one electrode to the other electrode of the storage capacitor Cs (also referred to as "CsI_leak").

Figure 21B:
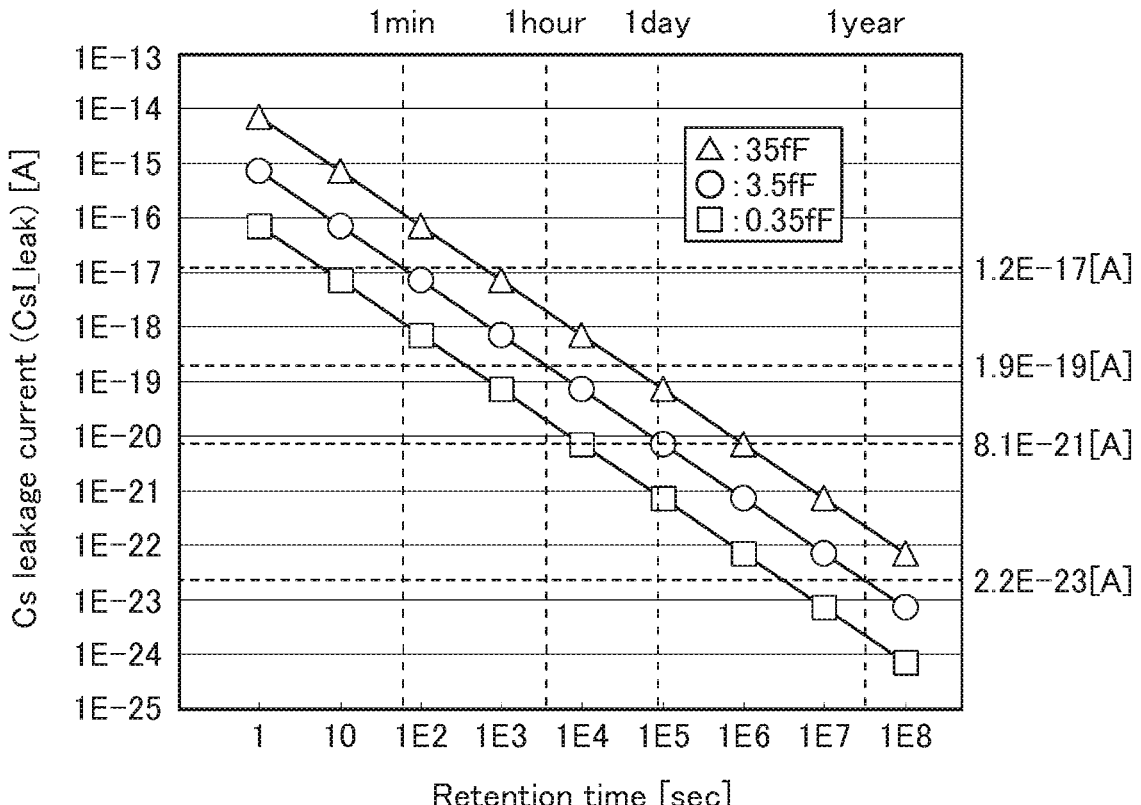

FIG. 21B is a graph showing the relation between the time of retaining data written to the node ND and CsI_leak when the capacitance of the storage capacitor Cs is 35 fF, 3.5 fF, and 0.35 fF. Note that in this embodiment, the retention time refers to the time it takes until the potential of the node ND decreases by 0.2 V.

It is found from FIG. 21B that, for example, when the capacitance of the storage capacitor Cs is 3.5 fF, CsI_leak needs to be $1.2 \times 10^{-17}$ A or lower to achieve a retention time of one minute. Similarly, it is found that CsI_leak needs to be $1.9 \times 10^{-19}$ A or lower to achieve a retention time of one hour. Similarly, it is found that CsI_leak needs to be $8.1 \times 10^{-21}$ A or lower to achieve a retention time of one day. Similarly, it is found that CsI_leak needs to be $2.2 \times 10^{-23}$ A or lower to achieve a retention time of one year.

A tenfold increase in the capacitance of the storage capacitor Cs enables the allowable current for CsI_leak to increase tenfold. For example, when the capacitance of the storage capacitor Cs is 35 fF, CsI_leak for achieving a retention time of one hour is $1.9 \times 10^{-18}$ A or lower.

When the capacitance of the storage capacitor Cs is reduced by a factor of 10, the allowable current for CsI_leak also needs to be reduced by a factor of 10. For example, when the capacitance of the storage capacitor Cs is 0.35 fF, CsI_leak needs to be $1.9 \times 10^{-20}$ A or lower to achieve a retention time of one hour.

This embodiment can be implemented in an appropriate combination with the structures described in the other embodiments and the like.

Embodiment 3

The input/output circuit 111, the control circuit 112, the I2C receiver 113, the setting register 114, the LVDS circuit 115, the LVDS circuit 116, the decoder 117, the memory block array 210, the negative voltage generator circuit 218, the word line driver 212, the local sense amplifier driver 213, the sense amplifier 127, the global sense amplifier 215, the read/write selector 216, and the like, which have been described in the above embodiment, are sometimes required to have high current driving capability and/or high operating speed. In such a case, Si transistor are preferably used as transistors included in these circuits. Moreover, an OS transistor is preferably used as the transistor included in the memory cell 10.

OS transistors and Si transistors can be stacked. Accordingly, an integrated circuit including OS transistors can be provided over an integrated circuit including Si transistors. Stacking a variety of circuits can achieve a reduction in size of the memory device 100. In other words, the area occupied by the memory device 100 can be reduced.

For example, in the memory device 100, an integrated circuit including the memory cells 10 may be provided over an integrated circuit including the sense amplifiers 127. Stacking a variety of circuits can achieve a reduction in size of the memory device 100. Thus, the size of a semiconductor device including the memory device 100 can be reduced. In other words, the area occupied by the memory device 100 can be reduced. Consequently, the area occupied by the semiconductor device including the memory device 100 can be reduced.

Structure Example of Memory Device

Figure 22:
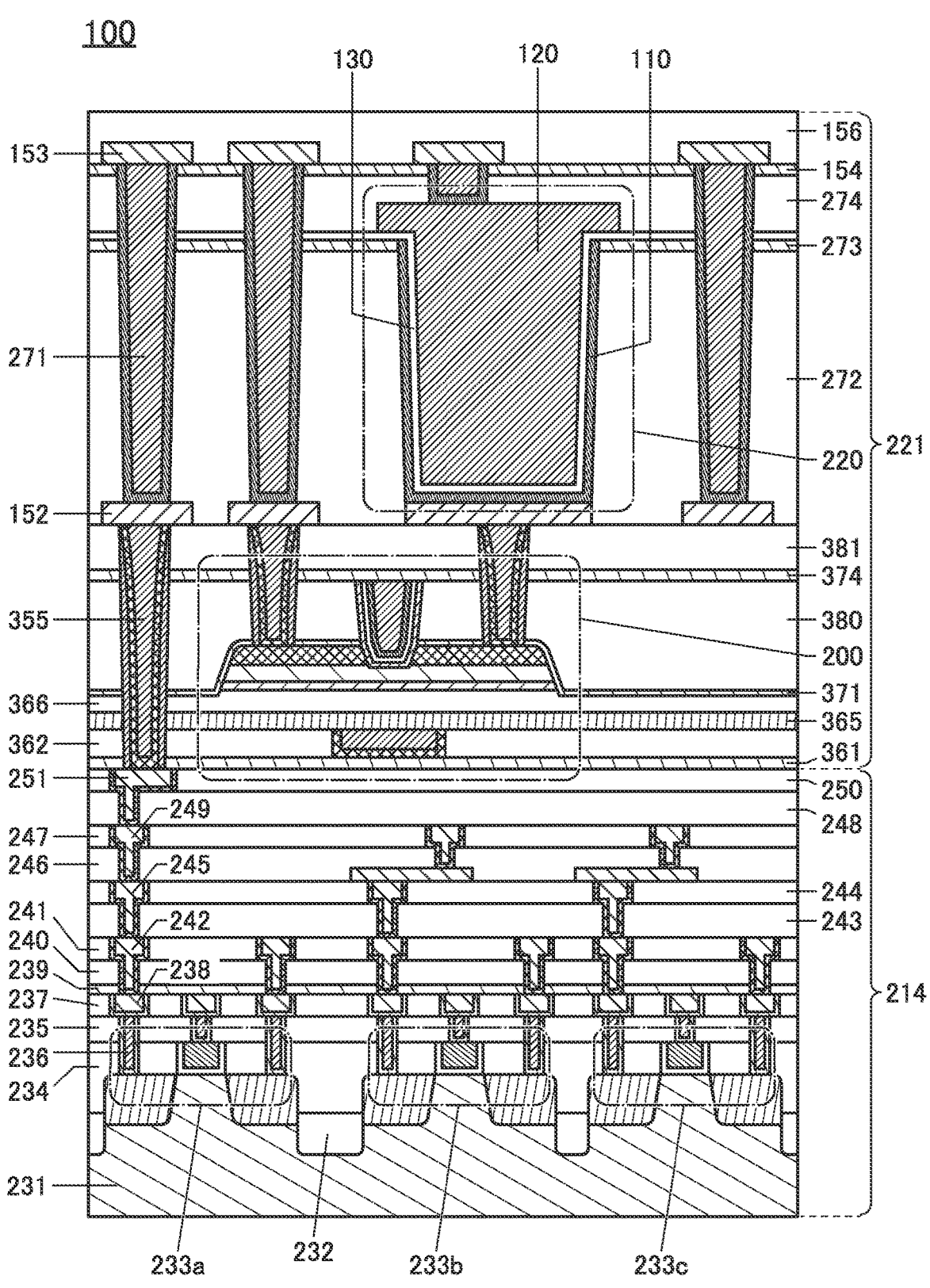
FIG. 22 is a cross-sectional view of a memory device.

FIG. 22 illustrates a cross section of part of the memory device 100. In the memory device 100 illustrated in FIG. 22, the local sense amplifier array 214 and the cell array 221 are stacked over a substrate 231. Note that the circuits other than the cell array 221 are provided on the substrate 231 like the local sense amplifier array 214. FIG. 22 illustrates the case where a single crystal semiconductor substrate (e.g., a single crystal silicon substrate) is used as the substrate 231. A source, a drain, and a channel of a transistor included in the local sense amplifier array 214 are formed in part of the substrate 231. The cell array 221 includes thin film transistors (e.g., OS transistors).

Local Sense Amplifier Array 214

In FIG. 22, the local sense amplifier array 214 includes a transistor 233a, a transistor 233b, and a transistor 233c on the substrate 231. FIG. 22 illustrates cross sections of the transistor 233a, the transistor 233b, and the transistor 233c in the channel length direction.

As described above, the channels of the transistor 233a, the transistor 233b, and the transistor 233c are formed in part of the substrate 231. When the integrated circuit is required to operate at high speed, a single crystal semiconductor substrate is preferably used as the substrate 231.

The transistor 233a, the transistor 233b, and the transistor 233c are electrically isolated from each other by an element isolation layer 232. The element isolation layer can be formed by a LOCOS (Local Oxidation of Silicon) method, an STI (Shallow Trench Isolation) method, or the like.

An insulating layer 234, an insulating layer 235, and an insulating layer 237 are provided over the transistor 233a, the transistor 233b, and the transistor 233c, and an electrode 238 is embedded in the insulating layer 237. The electrode 238 is electrically connected to one of a source and a drain of the transistor 233a through a contact plug 236.

An insulating layer 239, an insulating layer 240, and an insulating layer 241 are provided over the electrode 238 and the insulating layer 237, and an electrode 242 is embedded in the insulating layer 239, the insulating layer 240, and the insulating layer 241. The electrode 242 is electrically connected to the electrode 238.

An insulating layer 243 and an insulating layer 244 are provided over the electrode 242 and the insulating layer 241, and an electrode 245 is embedded in the insulating layer 243 and the insulating layer 244. The electrode 245 is electrically connected to the electrode 242.

An insulating layer 246 and an insulating layer 247 are provided over the electrode 245 and the insulating layer 244, and an electrode 249 is embedded in the insulating layer 246 and the insulating layer 247. The electrode 249 is electrically connected to the electrode 245.

An insulating layer 248 and an insulating layer 250 are provided over the electrode 249 and the insulating layer 247, and an electrode 251 is embedded in the insulating layer 248 and the insulating layer 250. The electrode 251 is electrically connected to the electrode 249.

Cell Array 221

The cell array 221 is provided over the local sense amplifier array 214. In FIG. 22, the cell array 221 includes a transistor 200 and a capacitor 220. FIG. 22 illustrates a cross section of the transistor 200 in the channel length direction. The transistor 200 is a transistor including a back gate.

For example, the transistor 200 corresponds to the transistor M1, and the capacitor 220 corresponds to the storage capacitor Cs.

An oxide semiconductor, which is a type of metal oxide, is preferably used for a semiconductor layer of the transistor 200. That is, it is preferable to use an OS transistor as the transistor 200.

The transistor 200 is provided over an insulating layer 361. An insulating layer 362 is provided over the insulating layer 361. The back gate of the transistor 200 is embedded in the insulating layer 362. An insulating layer 371 and an insulating layer 380 are provided over the insulating layer 362. A gate of the transistor 200 is embedded in the insulating layer 380.

An insulating layer 374 and an insulating layer 381 are provided over the insulating layer 380. An electrode 355 is embedded in the insulating layer 361, the insulating layer 362, the insulating layer 365, the insulating layer 366, the insulating layer 371, the insulating layer 380, the insulating layer 374, and the insulating layer 381. The electrode 355 is electrically connected to the electrode 251. The electrode 355 can function as a contact plug.

An electrode 152 is provided over the insulating layer 381. The electrode 152 is electrically connected to the electrode 355. An insulating layer 272, an insulating layer 273, and an insulating layer 130 are provided over the insulating layer 381 and the electrode 152.

The capacitor 220 includes an electrode 110 positioned in an opening formed in the insulating layer 272 and the insulating layer 273, an insulating layer 130 over the electrode 110 and the insulating layer 273, and an electrode 120 over the insulating layer 130. In the opening formed in the insulating layer 272 and the insulating layer 273, at least part of the electrode 110, at least part of the insulating layer 130, and at least part of the electrode 120 are positioned.

The electrode 110 functions as a lower electrode of the capacitor 220, the electrode 120 functions as an upper electrode of the capacitor 220, and the insulating layer 130 functions as a dielectric of the capacitor 220. In the capacitor 220, the upper electrode and the lower electrode face each other with the dielectric positioned therebetween on the side surface as well as the bottom surface of the opening in the insulating layer 272 and the insulating layer 273; thus, the electrostatic capacitance per unit area can be increased. Accordingly, the deeper the opening is, the larger the electrostatic capacitance of the capacitor 220 can be. Increasing the electrostatic capacitance per unit area of the capacitor 220 in this manner can promote miniaturization or higher integration of a semiconductor device.

The shape of the opening formed in the insulating layer 272 and the insulating layer 273 when seen from above may be a quadrangular shape, a polygonal shape other than a quadrangular shape, a polygonal shape with rounded corners, or a circular shape such as an elliptical shape.

An insulating layer 274 and an insulating layer 154 are provided over the insulating layer 130 and the electrode 120. An electrode 271 is embedded in the insulating layer 272, the insulating layer 273, the insulating layer 130, the insulating layer 274, and the insulating layer 154. The electrode 271 is electrically connected to the electrode 152. The electrode 271 can function as a contact plug. An electrode 153 is provided over the insulating layer 154. The electrode 153 is electrically connected to the electrode 271.

An insulating layer 156 is provided over the insulating layer 154 and the electrode 153.

Variation Example 1

Figure 23:
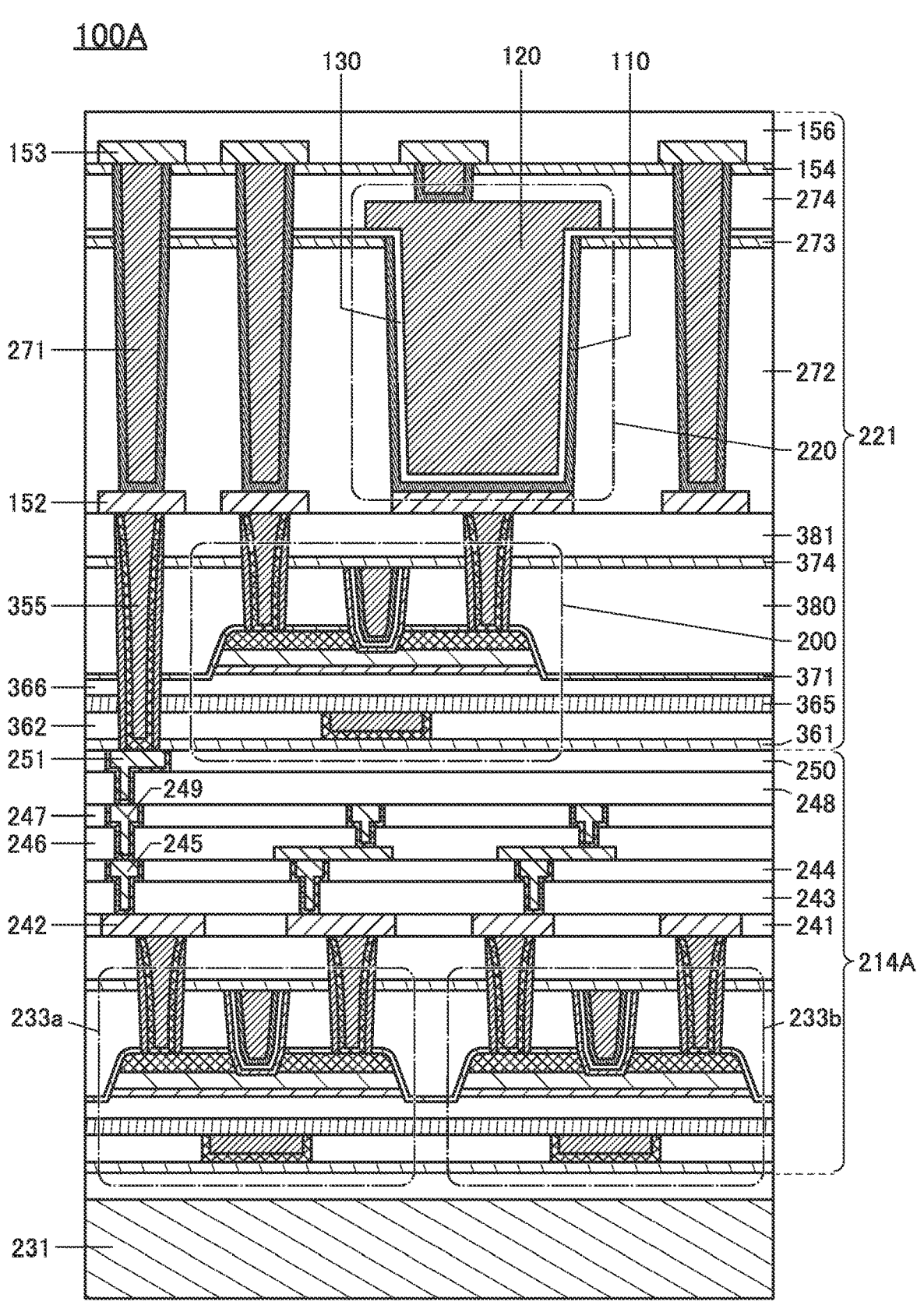
FIG. 23 is a cross-sectional view of a memory device.

FIG. 23 illustrates a memory device 100A that is a variation example of the memory device 100. In the memory device 100A, a local sense amplifier array 214A and the cell array 221 are provided to overlap each other. In the local sense amplifier array 214A, OS transistors are used as transistors included in the local sense amplifier array 214, such as the transistor 233a and the transistor 233b. Using OS transistors as all the transistors included in the memory device 100 enables the memory device 100 to be a single-polarity integrated circuit.

Variation Example 2

Figure 24:
FIG. 24 is a cross-sectional view of a memory device.
Figure 24:

FIG. 24 illustrates a memory device 100B that is a variation example of the memory device 100A. When all transistors included in the memory device 100B are OS transistors, the local sense amplifier array 214A and the cell array 221 can be formed over the substrate 231 through the same process. Thus, the productivity of the semiconductor device can be increased. Moreover, the manufacturing cost of the semiconductor device can be reduced.

When a substrate having high thermal conductivity, such as a silicon substrate, is used as the substrate 231, the cooling efficiency of the semiconductor device can be increased compared to the case of using an insulating substrate or the like. Consequently, the semiconductor device can have higher reliability.

Materials

Substrate

There is no particular limitation on a material used for the substrate. An insulator substrate, a semiconductor substrate, or a conductor substrate is used, for example.

Examples of the insulator substrate include a glass substrate, a quartz substrate, a sapphire substrate, a stabilized zirconia substrate (e.g., an yttria-stabilized zirconia substrate), and a resin substrate.

Examples of the semiconductor substrate include a semiconductor substrate using silicon, germanium, or the like as a material and a compound semiconductor substrate including silicon carbide, silicon germanium, gallium arsenide, indium phosphide, zinc oxide, or gallium oxide. A semiconductor substrate in which an insulator region is included in the above semiconductor substrate, for example, an SOI (Silicon On Insulator) substrate or the like may be used.

As described above, when the integrated circuit is required to operate at high speed, a single crystal semiconductor substrate is preferably used as the substrate.

Examples of the conductor substrate include a graphite substrate, a metal substrate, an alloy substrate, and a conductive resin substrate. Other examples are a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, any of these substrates provided with an element may be used. Examples of the element provided for the substrate include a capacitor, a resistor, a switching element, a light-emitting element, and a memory element. A semiconductor substrate on which a semiconductor element such as a strained transistor or a FIN-type transistor is provided, or the like can be used. That is, the substrate is not limited to a simple supporting substrate and may be a substrate where a device such as another transistor is formed.

Insulating Layer

Examples of materials used for an insulating layer include an oxide, a nitride, an oxynitride, a nitride oxide, a metal oxide, a metal oxynitride, and a metal nitride oxide, each of which has an insulating property.

As scaling down and high integration of the transistor progress, for example, a problem such as leakage current may arise because of a thinner gate insulating layer. When a high-k material is used for an insulating layer functioning as a gate insulating layer, the driving voltage of the transistor can be lowered while the physical thickness of the gate insulating layer is kept. In contrast, when a material with low dielectric constant is used as an insulator functioning as an interlayer insulating layer, parasitic capacitance generated between wirings can be reduced. Thus, a material is preferably selected in accordance with the function of an insulating layer.

Examples of insulators with high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of insulators with low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

In the case where an OS transistor is used as the transistor, the transistor can have stable electrical characteristics by being surrounded by insulating layers having a function of inhibiting transmission of oxygen and impurities such as hydrogen (e.g., the insulating layer 361 and the insulating layer 374). As the insulator having a function of inhibiting transmission of oxygen and impurities such as hydrogen, a single layer or a stack of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used, for example. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, aluminum titanium nitride, titanium nitride, silicon nitride oxide, or silicon nitride can be used.

The insulating layer functioning as the gate insulating layer is preferably an insulator including a region containing oxygen released by heating. For example, when a structure is employed in which silicon oxide or silicon oxynitride including a region containing oxygen released by heating is in contact with a semiconductor layer 260, oxygen vacancies included in the semiconductor layer 260 can be compensated for.

Note that in this specification and the like, a nitride oxide refers to a compound that includes more nitrogen than oxygen. An oxynitride refers to a compound that includes more oxygen than nitrogen. The content of each element can be measured by Rutherford backscattering spectrometry (RBS), for example.

When an oxide semiconductor, which is one kind of metal oxide, is used for the semiconductor layer, the hydrogen concentration in the insulating layer is preferably lowered in order to prevent an increase in the hydrogen concentration in the semiconductor layer. Specifically, the hydrogen concentration in the insulating layer is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$ in secondary ion mass spectrometry (SIMS). It is particularly preferable to lower the hydrogen concentration in the insulating layer in contact with the semiconductor layer.

When an oxide semiconductor, which is one kind of metal oxide, is used for the semiconductor layer, the nitrogen concentration in the insulating layer is preferably lowered in order to prevent an increase in the nitrogen concentration in the semiconductor layer. Specifically, the nitrogen concentration in the insulating layer is lower than or equal to $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$ in SIMS.

It is preferred that at least a region of the insulating layer in contact with the semiconductor layer have few defects and typically have as few signals observed by electron spin resonance (ESR) spectroscopy as possible. An example of the signals is an E' center observed at a g-factor of 2.001. Note that the E' center is due to the dangling bond of silicon. For example, in the case where a silicon oxide layer or a silicon oxynitride layer is used as the insulating layer, a silicon oxide layer or a silicon oxynitride layer whose spin density due to the E' center is lower than or equal to $3 \times 10^{17}$ spins/cm$^3$, preferably lower than or equal to $5 \times 10^{16}$ spins/cm$^3$ is used.

In addition to the above-described signal, a signal due to nitrogen dioxide (NO$_2$) may be observed. The signal is divided into the following three signals according to the N nuclear spin: a signal observed at a g-factor of greater or equal to 2.037 and less than or equal to 2.039 (referred to as a first signal), a signal observed at a g-factor of greater than or equal to 2.001 and less than or equal to 2.003 (referred to as a second signal), and a signal observed at a g-factor of greater than or equal to 1.964 and less than or equal to 1.966 (referred to as a third signal).

For example, as the insulating layer, it is suitable to use an insulating layer whose spin density of a signal due to nitrogen dioxide (NO$_2$) is higher than or equal to $1 \times 10^{17}$ spins/cm$^3$ and lower than $1 \times 10^{18}$ spins/cm$^3$.

Note that nitrogen oxide (NO$_x$) including nitrogen dioxide (NO$_2$) forms a state in the insulating layer. The state is positioned in the energy gap of the oxide semiconductor layer. Thus, when nitrogen oxide (NO$_x$) is diffused into the interface between the insulating layer and the oxide semiconductor layer, an electron may be trapped by the state on the insulating layer side. As a result, the trapped electron remains in the vicinity of the interface between the insulating layer and the oxide semiconductor layer; hence, the threshold voltage of the transistor is shifted in the positive direction. Accordingly, the use of a film with a low nitrogen oxide content as the insulating layer and the insulating layer can reduce a shift in the threshold voltage of the transistor.

As an insulating layer that releases a small amount of nitrogen oxide (NO$_x$), a silicon oxynitride layer can be used, for example. The silicon oxynitride layer is a film that releases more ammonia than nitrogen oxide (NO$_x$) in thermal desorption spectroscopy (TDS); the typical released amount of ammonia is greater than or equal to $1 \times 10^{18}$/cm$^3$ and less than or equal to $5 \times 10^{19}$/cm$^3$. Note that the released amount of ammonia is the total amount in the range of the heat treatment temperature in TDS from 50° C. to 650° C. or from 50° C. to 550° C.

Since nitrogen oxide (NO$_x$) reacts with ammonia and oxygen in heat treatment, the use of an insulating layer that releases a large amount of ammonia reduces nitrogen oxide (NO$_x$).

At least one of the insulating layers in contact with the oxide semiconductor layer is preferably formed using an insulating layer from which oxygen is released by heating. Specifically, it is preferable to use an insulating layer in which the amount of released oxygen converted into oxygen atoms is $1.0 \times 10^{18}$ atoms/cm$^3$ or more, $1.0 \times 10^{19}$ atoms/cm$^3$ or more, or $1.0 \times 10^{20}$ atoms/cm$^3$ or more in TDS performed with heat treatment where the surface temperature of the insulating layer is higher than or equal to 100° C. and lower than or equal to 700° C., preferably higher than or equal to 100° C. and lower than or equal to 500° C. Note that in this specification and the like, oxygen released by heating is also referred to as "excess oxygen".

Furthermore, an insulating layer containing excess oxygen can also be formed by performing treatment for adding oxygen to an insulating layer. The treatment for adding oxygen can be performed by heat treatment, plasma treatment, or the like in an oxidizing atmosphere. Alternatively, oxygen may be added by an ion implantation method, an ion doping method, a plasma immersion ion implantation method, or the like. Examples of a gas used in the treatment for adding oxygen include an oxygen gas such as $^{16}$O$_2$ or $^{18}$O$_2$ and a gas containing oxygen, such as a nitrous oxide gas or an ozone gas. Note that in this specification, the treatment for adding oxygen is also referred to as "oxygen doping treatment". The oxygen doping treatment may be performed while the substrate is heated.

For the insulating layer, a heat-resistant organic material such as polyimide, an acrylic-based resin, a benzocyclobutene-based resin, polyamide, or an epoxy-based resin can be used. Other than the above organic materials, it is also possible to use a low dielectric constant material (a low-k material), a siloxane-based resin, PSG (phosphosilicate glass), BPSG (borophosphosilicate glass), or the like. Note that the insulating layer may be formed by stacking a plurality of insulating layers formed of these materials.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. In addition, the organic group may include a fluoro group.

There is no particular limitation on the method for forming the insulating layer. Note that a baking step is necessary in some cases depending on a material used for the insulating layer. In this case, when the baking step of the insulating layer also serves as another heat treatment step, the transistor can be manufactured efficiently.

There is no particular limitation on the method for forming the insulating layer. Note that a baking step is necessary in some cases depending on a material used for the insulating layer. In this case, when the baking step of the insulating layer also serves as another heat treatment step, the transistor can be manufactured efficiently.

Conductive Layer

For the conductive layer, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a semiconductor having high electrical conductivity, typified by polycrystalline silicon containing an impurity element such as phosphorus, or silicide such as nickel silicide may be used.

Moreover, a stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide semiconductor, which is a kind of metal oxide, is used for the semiconductor layer, a stacked-layer structure in which a material containing the above metal element and a conductive material containing oxygen are combined is preferably used for the conductive layer functioning as the gate electrode. In this case, a conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductive layer functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide in which a channel is formed can be trapped in some cases. Alternatively, hydrogen entering from an external insulator or the like can be trapped in some cases.

For the conductive material used for a contact plug or the like, a conductive material with high embeddability, such as tungsten or polysilicon, can be used, for example. A conductive material with high embeddability and a barrier layer (a diffusion prevention layer) such as a titanium layer, a titanium nitride layer, or a tantalum nitride layer may be used in combination.

Semiconductor Layer

For the semiconductor layer, a single crystal semiconductor, a polycrystalline semiconductor, a microcrystalline semiconductor, an amorphous semiconductor, or the like can be used alone or in combination. As a semiconductor material, silicon, germanium, or the like can be used, for example. Alternatively, a compound semiconductor such as silicon germanium, silicon carbide, gallium arsenide, an oxide semiconductor, or a nitride semiconductor, an organic semiconductor, or the like can be used.

In the case of using an organic semiconductor for the semiconductor layer, a low molecular organic material having an aromatic ring, a $\pi$-electron conjugated conductive polymer, or the like can be used. For example, rubrene, tetracene, pentacene, perylenediimide, tetracyanoquinodimethane, polythiophene, polyacetylene, polyparaphenylene vinylene, or the like can be used.

Note that semiconductor layers may be stacked. In the case of stacking semiconductor layers, semiconductors having different crystal states may be used or different semiconductor materials may be used.

The band gap of an oxide semiconductor, which is one kind of metal oxide, is greater than or equal to 2 eV; thus, the use of the oxide semiconductor for the semiconductor layer can achieve a transistor with an extremely low off-state current. Specifically, the off-state current per micrometer of channel width at room temperature (typically 25° C.) at a voltage between a source and a drain of 3.5 V can be lower than $1\times10^{-20}$ A, lower than $1\times10^{-22}$ A, or lower than $1\times10^{-24}$ A. That is, the on/off ratio can be greater than or equal to 20 digits. In addition, a transistor using an oxide semiconductor for the semiconductor layer (an OS transistor) has high withstand voltage between its source and drain. Thus, a transistor with high reliability can be provided. A transistor with high output voltage and high withstand voltage can be provided. A memory device with high reliability can be provided. A memory device with high output voltage and high withstand voltage can be provided.

A crystalline Si transistor tends to have relatively high mobility compared with the OS transistor. On the other hand, the crystalline Si transistor has difficulty in achieving an extremely low off-state current such as one in the OS transistor. Thus, it is important that the semiconductor material used for the semiconductor layer be properly selected depending on the purpose and the usage. For example, depending on the purpose and the usage, the OS transistor and the crystalline Si transistor and the like may be used in combination.

In the case where an oxide semiconductor layer is used as the semiconductor layer, the oxide semiconductor layer is preferably formed by a sputtering method. The oxide semiconductor layer is preferably formed by a sputtering method, in which case the density of the oxide semiconductor layer can be increased. When the oxide semiconductor layer is formed by a sputtering method, a rare gas (typically argon), oxygen, or a mixed gas of a rare gas and oxygen is used as a sputtering gas. In addition, increasing the purity of a sputtering gas is necessary. For example, as an oxygen gas or a rare gas used as a sputtering gas, a gas that is highly purified to have a dew point of −60° C. or lower, preferably −100° C. or lower is used. When the highly purified sputtering gas is used for the deposition, entry of moisture or the like into the oxide semiconductor layer can be prevented as much as possible.

Furthermore, when the oxide semiconductor layer is formed by a sputtering method, moisture in a deposition chamber of a sputtering apparatus is preferably removed as much as possible. For example, with an adsorption vacuum evacuation pump such as a cryopump, the deposition chamber is preferably evacuated to be a high vacuum state (to a degree of approximately $5 \times 10^{-7}$ Pa to $1 \times 10^{-4}$ Pa). In particular, the partial pressure of gas molecules corresponding to $H_2O$ (gas molecules corresponding to m/z=18) in the deposition chamber in the standby mode of the sputtering apparatus is preferably lower than or equal to $1 \times 10^{-4}$ Pa, further preferably lower than or equal to $5 \times 10^{-15}$ Pa.

Metal Oxide

By changing the composition of elements contained in a metal oxide, a conductor, a semiconductor, and an insulator can be formed separately. The metal oxide having conductor properties is referred to as "conductive oxide" in some cases. The metal oxide having semiconductor properties is referred to as "oxide semiconductor" in some cases. The metal oxide having insulator properties is referred to as "insulating oxide" in some cases.

An oxide semiconductor, which is one kind of metal oxide, preferably contains indium or zinc. In particular, indium and zinc are preferably contained. Aluminum, gallium, yttrium, tin, or the like is preferably contained in addition to them. Furthermore, one or more kinds selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, magnesium, and the like. Note that a plurality of the above-described elements may be used in combination as the element M.

Note that in this specification and the like, a metal oxide containing nitrogen is also collectively referred to as a metal oxide in some cases. A metal oxide containing nitrogen may be referred to as a metal oxynitride.

Structure of Metal Oxide

Oxide semiconductors (metal oxides) are classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Furthermore, entry of impurities, formation of defects, or the like might decrease the crystallinity of a metal oxide, which means that the CAAC-OS is a metal oxide including few impurities and defects (e.g., oxygen vacancies). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that In—Ga—Zn oxide (hereinafter referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity as compared with the nc-OS and the CAAC-OS.

An oxide semiconductor (metal oxide) can have various structures that show different properties. An oxide semiconductor of one embodiment of the present invention may include two or more of the amorphous oxide semiconductor, the polycrystalline oxide semiconductor, the a-like OS, the nc-OS, and the CAAC-OS.

Transistor Including Metal Oxide

Next, the case where the above metal oxide is used in a channel formation region of a transistor is described.

When the above metal oxide is used in a channel formation region of a transistor, a transistor having high field-effect mobility can be achieved. In addition, the transistor having high reliability can be achieved.

Furthermore, a metal oxide with a low carrier density is preferably used as the transistor. In order to reduce the carrier density of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. For example, a metal oxide has a carrier density lower than $8 \times 10^{11}$ cm$^{-3}$, preferably lower than $1 \times 10^{11}$ cm$^{-3}$, further preferably lower than $1 \times 10^{10}$ cm$^{-3}$ and higher than or equal to $1 \times 10^{-9}$ cm$^{-3}$.

The highly purified intrinsic or substantially highly purified intrinsic metal oxide has a low density of defect states and accordingly has a low density of trap states in some cases.

Charges trapped by the trap states in the metal oxide take a long time to be released and may behave like fixed charges. Thus, a transistor whose channel formation region includes a metal oxide having a high density of trap states has unstable electrical characteristics in some cases.

Accordingly, in order to obtain stable electrical characteristics of the transistor, it is effective to reduce the impurity concentration in the metal oxide. In addition, in order to reduce the impurity concentration in the metal oxide, the impurity concentration in an adjacent film is also preferably reduced. Examples of impurities include hydrogen, nitrogen, an alkali metal, an alkaline earth metal, iron, nickel, and silicon.

Impurities

Here, the influence of each impurity in the metal oxide will be described.

When the metal oxide contains an alkali metal or an alkaline earth metal, defect states are formed and carriers are generated in some cases. Thus, a transistor using a metal oxide that contains an alkali metal or an alkaline earth metal in its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS is set lower than or equal to $1 \times 10^{18}$ atoms/cm$^3$, preferably lower than or equal to $2 \times 10^{16}$ atoms/cm$^3$.

Hydrogen contained in a metal oxide reacts with oxygen bonded to a metal atom to become water, and thus forms an oxygen vacancy in some cases. When the channel formation region in the metal oxide includes oxygen vacancies, the transistor tends to have normally-on characteristics. Entry of hydrogen into the oxygen vacancy generates an electron serving as a carrier in some cases. Furthermore, in some cases, bonding of part of hydrogen to oxygen bonded to a metal atom causes generation of an electron which is a carrier. Thus, a transistor using a metal oxide containing hydrogen is likely to have normally-on characteristics.

Accordingly, hydrogen in the metal oxide is preferably reduced as much as possible. Specifically, the hydrogen concentration of the metal oxide, which is obtained by SIMS, is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When a metal oxide in which impurities are sufficiently reduced is used in a channel formation region of a transistor, stable electrical characteristics can be given.

As a metal oxide used as a semiconductor of a transistor, a thin film having high crystallinity is preferably used. With use of the thin film, the stability or reliability of the transistor can be improved. Examples of the thin film include a thin film of a single-crystal metal oxide and a thin film of a polycrystalline metal oxide. However, to form the thin film of a single-crystal metal oxide or the thin film of a polycrystalline metal oxide over a substrate, a high-temperature process or a laser heating process is needed. Thus, manufacturing cost is increased, and throughput is decreased.

Non-Patent Document 1 and Non-Patent Document 2 have reported that an In—Ga—Zn oxide having a CAAC structure (referred to as CAAC-IGZO) was found in 2009. Here, it has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, an In—Ga—Zn oxide having an nc structure (referred to as nc-IGZO) was found in 2013 (see Non-Patent Document 3). Here, it has been reported that nc-IGZO has a periodic atomic arrangement in a microscopic region (e.g., a region within a size of 1 nm to 3 nm) and there is no regularity of crystal orientation between different regions.

Non-Patent Document 4 and Non-Patent Document 5 have shown changes in average crystal size due to electron beam irradiation to thin films of the above CAAC-IGZO, the above nc-IGZO, and IGZO having low crystallinity. In the thin film of IGZO having low crystallinity, crystalline IGZO with a size of approximately 1 nm was observed even before electron beam irradiation. Thus, here, it has been reported that the existence of a completely amorphous structure could not be observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used as the semiconductor of the transistor.

Non-Patent Document 6 shows that a transistor using a metal oxide has an extremely low leakage current in an off state, and specifically, the off-state current per micrometer of channel width of the transistor is on the order of yA/μm ($10^{-24}$ A/μm). For example, a low-power-consumption CPU applying a characteristic of low leakage current of the transistor using a metal oxide is disclosed (see Non-Patent Document 7).

Furthermore, application of a transistor using a metal oxide to a display device that utilizes the characteristic of low leakage current of the transistor has been reported (see Non-Patent Document 8). In the display device, a displayed image is changed several tens of times per second. The number of times images are changed in one second is referred to as a refresh rate. The refresh rate is also referred to as drive frequency. Such high-speed screen change that is hard for human eyes to recognize is considered as a cause of eyestrain. Accordingly, reducing the number of times of image rewriting by lowering the refresh rate of the display device is proposed. Moreover, driving with a lowered refresh rate can reduce the power consumption of the display device. Such a driving method is referred to as idling stop (IDS) driving.

The discovery of the CAAC structure and the nc structure has contributed to an improvement in electrical characteristics and reliability of a transistor using a metal oxide having the CAAC structure or the nc structure, a reduction in manufacturing cost, and an improvement in throughput. Furthermore, applications of the transistor to a display device and an LSI utilizing the characteristics of low leakage current of the transistor have been studied.

Deposition Method

An insulating material for forming the insulating layer, a conductive material for forming the conductive layer, or a semiconductor material for forming the semiconductor layer can be formed by a sputtering method, a spin coating method, a CVD (Chemical Vapor Deposition) method (including a thermal CVD method, an MOCVD (Metal Organic Chemical Vapor Deposition) method, a PECVD (Plasma Enhanced CVD) method, a high density plasma CVD method, an LPCVD (low pressure CVD) method, an APCVD (atmospheric pressure CVD) method, and the like), an ALD (Atomic Layer Deposition) method, an MBE (Molecular Beam Epitaxy) method, a PLD (Pulsed Laser Deposition) method, a dipping method, a spray coating method, a droplet discharging method (e.g., an inkjet method), or a printing method (e.g., screen printing or offset printing).

By a plasma CVD method, a high-quality film can be obtained at a relatively low temperature. With use of a deposition method that does not use plasma at the time of deposition, such as an MOCVD method, an ALD method, or a thermal CVD method, damage is not easily caused on a surface where the film is deposited. For example, a wiring, an electrode, an element (e.g., a transistor or a capacitor), or the like included in a memory device might be charged up by receiving charges from plasma. In that case, accumulated charges might break the wiring, electrode, element, or the like included in the memory device. By contrast, in the case of a film formation method not using plasma, such plasma damage is not caused; thus, the yield of memory devices can be increased. Moreover, since plasma damage during film formation is not caused, a film with few defects can be obtained.

In an ALD method, one atomic layer can be deposited at a time using self-regulating characteristics of atoms. Thus, an ALD method has advantages such as deposition of an extremely thin film, deposition on a component with a high aspect ratio, deposition of a film with a small number of defects such as pinholes, deposition with good coverage, and low-temperature deposition. Furthermore, an ALD method includes a PEALD (plasma enhanced ALD) method using plasma. The use of plasma is sometimes preferable because deposition at a lower temperature is possible. Note that a precursor used in an ALD method sometimes contains impurities such as carbon. Thus, in some cases, a film provided by an ALD method contains impurities such as carbon in a larger amount than a film provided by another deposition method. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object. Thus, a CVD method and an ALD method are deposition methods that enable favorable step coverage almost regardless of the shape of an object. In particular, an ALD method enables excellent step coverage and excellent thickness uniformity and thus is suitable for covering a surface of an opening portion with a high aspect ratio, for example. On the other hand, an ALD method has a relatively low deposition rate; hence, it is sometimes preferable to combine an ALD method with another deposition method with a high deposition rate, such as a CVD method.

A CVD method and an ALD method enable control of the composition of a film to be obtained with the flow rate ratio of the source gases. For example, by a CVD method or an ALD method, a film with a certain composition can be deposited depending on the flow rate ratio of the source gases. Moreover, by a CVD method or an ALD method, by changing the flow rate ratio of the source gases during the deposition, a film whose composition is continuously changed can be deposited. In the case of forming a film while changing the flow rate ratio of the source gases, as compared with the case of forming a film with use of a plurality of deposition chambers, the time taken for the film formation can be shortened because the time taken for transfer and pressure adjustment is omitted. Thus, memory devices can be manufactured with improved productivity in some cases.

This embodiment can be implemented in an appropriate combination with the structures described in the other embodiments and the like.

Embodiment 4

In this embodiment, a structure example of a transistor 200A and a transistor 200B that can be used as the transistor 200 will be described with reference to drawings.

Transistor Structure Example 1

A structure example of the transistor 200A is described with reference to FIG. 25A, FIG. 25B, and FIG. 25C. FIG. 25A is a top view of the transistor 200A. FIG. 25B is a cross-sectional view of a portion indicated by the dashed-dotted line L1-L2 in FIG. 25A. FIG. 25C is a cross-sectional view of a portion indicated by the dashed-dotted line W1-W2 in FIG. 25A. Note that for clarity of the drawing, some components are not illustrated in the top view of FIG. 25A.

FIG. 25A, FIG. 25B, and FIG. 25C illustrate the transistor 200A and the insulating layer 361, the insulating layer 362, the insulating layer 365, the insulating layer 366, the insulating layer 371, the insulating layer 380, the insulating layer 374, and the insulating layer 381, each of which functions as an interlayer insulating layer. In addition, a conductive layer 340 (a conductive layer 340a and a conductive layer 340b) that is electrically connected to the transistor 200A and functions as a contact plug is illustrated. Note that an insulating layer 341 (an insulating layer 341a and an insulating layer 341b) is provided in contact with a side surface of the conducting layer 340 functioning as a contact plug.

As the interlayer insulating layer, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or (Ba, $Sr)TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

The transistor 200A includes the conductive layer 360 (a conductive layer 360a and a conductive layer 360b) functioning as a first gate electrode; the conductive layer 305 functioning as a second gate electrode; the insulating layer 349 functioning as a first gate insulating film; the insulating layer 365 and the insulating layer 366 that function as a second gate insulating layer; the semiconductor layer 260 (a semiconductor layer 260a, a semiconductor layer 260b, and a semiconductor layer 260c) including a region where a channel is formed; the conductive layer 342a functioning as one of a source and a drain; the conductive layer 342b functioning as the other of the source and the drain; and the insulating layer 371.

Note that the semiconductor layer 260a, the semiconductor layer 260b, and the semiconductor layer 260c correspond respectively to the oxide layer 261a, the oxide layer 261b, and the oxide layer 261c illustrated in FIG. 5A and FIG. 5B. Thus, for example, the oxide layer 261c can be read as the semiconductor layer 260c. Part of the oxide layer 261c can be regarded as functioning as the semiconductor layer 260c. Part of the oxide layer 261c can be regarded as including the semiconductor layer 260c.

The conductive layer 305 is provided to be embedded in the insulating layer 362, and the insulating layer 365 is provided over the insulating layer 362 and the conductive layer 305. The insulating layer 366 is provided over the insulating layer 365. The semiconductor layer 260 is provided over the insulating layer 366. The insulating layer 349 is provided over the semiconductor layer 260, and the conductive layer 360 (the conductive layer 360a and the conductive layer 360b) is provided over the insulating layer 349.

The conductive layer 342a and the conductive layer 342b are provided in contact with part of the top surface of the semiconductor layer 260b. The insulating layer 371 is provided in contact with part of the top surface of the insulating layer 366, the side surface of the semiconductor layer 260a, the side surface of the semiconductor layer 260b, the side surface of the conductive layer 342a, the top surface of the conductive layer 342a, the side surface of the conductive layer 342b, and the top surface of the conductive layer 342b.

The insulating layer 341 is provided in contact with the inner wall of an opening formed in the insulating layer 380, the insulating layer 374, and the insulating layer 381. A first conductor of the conductive layer 340 is provided in contact with the side surface of the insulating layer 341, and a second conductor of the conductive layer 340 is provided on the inner side. Here, the height of the top surface of the conductive layer 340 and the height of the top surface of the insulating layer 381 can be substantially level with each other. Note that although the transistor 200A having a structure in which the first conductor of the conductive layer 340 and the second conductor of the conductive layer 340 are stacked is shown, the present invention is not limited thereto. For example, the conductive layer 340 may be provided as a single layer or a stacked-layer structure of three or more layers. In the case where a component has a stacked-layer structure, layers may be distinguished by ordinal numbers corresponding to the formation order.

The semiconductor layer 260 preferably includes the semiconductor layer 260a positioned over the insulating layer 366, the semiconductor layer 260b positioned over the semiconductor layer 260a, and the semiconductor layer 260c that is positioned over the semiconductor layer 260b and at least partly in contact with the top surface of the semiconductor layer 260b. When the semiconductor layer 260a is provided below the semiconductor layer 260b, impurities can be inhibited from diffusing into the semiconductor layer 260b from the components formed below the semiconductor layer 260a. When the semiconductor layer 260c is provided over the semiconductor layer 260b, impurities can be inhibited from diffusing into the semiconductor layer 260b from the components formed above the semiconductor layer 260c.

In the transistor 200A, an oxide semiconductor, which is a type of metal oxide, is preferably used for the semiconductor layer 260.

A transistor in which the oxide semiconductor is used in a semiconductor layer where the channel is formed exhibits an extremely low leakage current (off-state current) in the off state. Thus, a semiconductor device with reduced power consumption can be achieved. Since the oxide semiconductor can be formed by a sputtering method or the like, a highly integrated semiconductor device can be easily achieved.

For example, for the semiconductor layer 260, a metal oxide such as In-M-Zn oxide (the element M is one or more kinds selected from gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, gallium, yttrium, or tin is preferably used as the element M. Alternatively, an In-M oxide, an In—Zn oxide, or an M-Zn oxide may be used for the semiconductor layer 260.

Note that when an oxide semiconductor is used for the semiconductor layer 260, the semiconductor layer 260 preferably has a stacked-layer structure of oxides that differ in the atomic ratio of metal atoms. Specifically, the atomic proportion of the element M to the constituent elements in the metal oxide used for the semiconductor layer 260a is preferably greater than that in the metal oxide used for the semiconductor layer 260b. The atomic ratio of the element M to In in the metal oxide used for the semiconductor layer 260a is preferably greater than that in the metal oxide used for the semiconductor layer 260b. The atomic ratio of In to the element M in the metal oxide used for the semiconductor layer 260b is preferably greater than that in the metal oxide used for the semiconductor layer 260a. For the semiconductor layer 260c, a metal oxide that can be used for the semiconductor layer 260a or the semiconductor layer 260b can be used.

The semiconductor layer 260a, the semiconductor layer 260b, and the semiconductor layer 260c preferably have crystallinity, and in particular preferably use a CAAC-OS. An oxide having crystallinity, such as a CAAC-OS, has a dense structure with small amounts of impurities and defects (e.g., oxygen vacancies) and high crystallinity. This can inhibit oxygen extraction from the semiconductor layer 260b by the source electrode or the drain electrode. This can reduce oxygen extraction from the semiconductor layer 260b even when heat treatment is performed; hence, the transistor 200A is stable with respect to high temperatures in the manufacturing process (what is called thermal budget).

Note that one or both of the semiconductor layer 260a and the semiconductor layer 260c may be omitted. The semiconductor layer 260 may be a single layer of the semiconductor layer 260b. In the case where the semiconductor layer 260 is a stack of the semiconductor layer 260a, the semiconductor layer 260b, and the semiconductor layer 260c, the energy of the conduction band minimum of each of the semiconductor layer 260a and the semiconductor layer 260c is preferably higher than the energy of the conduction band minimum of the semiconductor layer 260b. In other words, the electron affinity of each of the semiconductor layer 260a and the semiconductor layer 260c is preferably lower than the electron affinity of the semiconductor layer 260b. In this case, a metal oxide that can be used for the semiconductor layer 260a is preferably used for the semiconductor layer 260c. Specifically, the atomic proportion of the element M to the constituent elements in the metal oxide used for the semiconductor layer 260c is preferably greater than that in the metal oxide used for the semiconductor layer 260b. The atomic ratio of the element M to In in the metal oxide used for the semiconductor layer 260c is preferably greater than that in the metal oxide used for the semiconductor layer 260b. The atomic ratio of In to the element M in the metal oxide used for the semiconductor layer 260b is preferably greater than that in the metal oxide used for the semiconductor layer 260c.

The energy level of the conduction band minimum gradually changes at the junction portions of the semiconductor layer 260a, the semiconductor layer 260b, and the semiconductor layer 260c. In other words, the energy level of the conduction band minimum at the junction portions of the semiconductor layer 260a, the semiconductor layer 260b, and the semiconductor layer 260c continuously changes or is continuously connected. To obtain this, the density of defect states in a mixed layer formed at the interface between the semiconductor layer 260a and the semiconductor layer 260b and the interface between the semiconductor layer 260b and the semiconductor layer 260c is preferably made low.

Specifically, when the semiconductor layer 260a and the semiconductor layer 260b or the semiconductor layer 260b and the semiconductor layer 260c contain the same element (as a main component) in addition to oxygen, a mixed layer with a low density of defect states can be formed. For example, when the semiconductor layer 260b is an In—Ga—Zn oxide, an In—Ga—Zn oxide, a Ga—Zn oxide, gallium oxide, or the like may be used for the semiconductor layer 260a and the semiconductor layer 260c. Furthermore, the semiconductor layer 260c may have a stacked-layer structure. For example, it is possible to employ a stacked-layer structure of an In—Ga—Zn oxide and a Ga—Zn oxide over the In—Ga—Zn oxide, or a stacked-layer structure of an In—Ga—Zn oxide and gallium oxide over the In—Ga—Zn oxide. In other words, a stacked-layer structure of an In—Ga—Zn oxide and an oxide that does not contain In may be employed as the semiconductor layer 260c.

Specifically, for the semiconductor layer 260a, a metal oxide having In:Ga:Zn=1:3:4 [atomic ratio] or 1:1:0.5 [atomic ratio] is used. For the semiconductor layer 260b, a metal oxide having In:Ga:Zn=4:2:3 [atomic ratio] or 3:1:2 [atomic ratio] is used. For the semiconductor layer 260c, a metal oxide having In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Specific examples of a stacked-layer structure of the semiconductor layer 260c include a stacked-layer structure of In:Ga:Zn=4:2:3 [atomic ratio] and Ga:Zn=2:1 [atomic ratio], a stacked-layer structure of In:Ga:Zn=4:2:3 [atomic ratio] and Ga:Zn=2:5 [atomic ratio], and a stacked-layer structure of In:Ga:Zn=4:2:3 [atomic ratio] and gallium oxide.

At this time, the semiconductor layer 260b serves as a main carrier path. When the semiconductor layer 260a and the semiconductor layer 260c have the above structure, the density of defect states at the interface between the semiconductor layer 260a and the semiconductor layer 260b and the interface between the semiconductor layer 260b and the semiconductor layer 260c can be made low. Thus, the influence of interface scattering on carrier conduction is small, and the transistor 200A can have high on-state current and high frequency characteristics. Note that in the case where the semiconductor layer 260c has a stacked-layer structure, in addition to the effect of reducing the density of defect states at the interface between the semiconductor layer 260b and the semiconductor layer 260c, inhibiting diffusion of the constituent elements of the semiconductor layer 260c to the insulating layer 349 side is expected. More specifically, since the semiconductor layer 260c has a stacked-layer structure in which an oxide that does not contain In is positioned in the upper layer, diffusion of In to the insulating layer 349 side can be inhibited. Since the insulating layer 349 functions as a gate insulator, In diffusion into the insulating layer 349 would cause poor characteristics of the transistor. Thus, when the semiconductor layer 260c has a stacked-layer structure, a highly reliable memory device can be provided.

For the semiconductor layer 260, a metal oxide functioning as an oxide semiconductor is preferably used. For example, it is preferable to use a metal oxide having a band gap of more than or equal to 2 eV, preferably more than or equal to 2.5 eV as the metal oxide to be the channel formation region of the semiconductor layer 260. With the use of a metal oxide having such a wide band gap, the off-state current of the transistor can be reduced. The use of such a transistor can provide a memory device with low power consumption.

In the transistor 200A, the conductive layer 360 functioning as the first gate (also referred to as top gate) electrode is formed in a self-aligned manner to fill an opening formed in the insulating layer 380 and the like. Forming the conductive layer 360 in this manner allows the conductive layer 360 to be surely positioned in a region between the conductive layer 342a and the conductive layer 342b without alignment.

The conductive layer 360 preferably includes the conductive layer 360a and the conductive layer 360b positioned over the conductive layer 360a. For example, the conductive layer 360a is preferably positioned so as to cover the bottom surface and the side surface of the conductive layer 360b. Moreover, as illustrated in FIG. 25B, the top surface of the conductive layer 360 is substantially aligned with the top surface of the insulating layer 349 and the top surface of the oxide 260c.

The conductive layer 305 sometimes functions as a second gate (also referred to as bottom gate) electrode. In that case, by changing a potential applied to the conductive layer 305 not in conjunction with but independently of a potential applied to the conductive layer 360, the threshold voltage (Vth) of the transistor 200A can be controlled. In particular, by applying a negative potential to the conductive layer 305, Vth of the transistor 200A can be higher than 0 V, and its off-state current can be reduced. Thus, drain current at the time when a potential applied to the conductive layer 360 is 0 V can be lower in the case where a negative potential is applied to the conductive layer 305 than in the case where a negative potential is not applied to the conductive layer 305.

For example, when voltage is applied to the conductive layer 305 and the conductive layer 360 that are provided to overlap with the channel formation region of the semiconductor layer 260 positioned therebetween, an electric field generated from the conductive layer 360 and an electric field generated from the conductive layer 305 are connected and can cover the channel formation region of the semiconductor layer 260.

In other words, the channel formation region can be electrically surrounded by the electric field of the conductive layer 360 having a function of the first gate electrode and the electric field of the conductive layer 305 having a function of the second gate electrode. In this specification and the like, the transistor structure in which the channel formation region is electrically surrounded by the electric fields of the first gate electrode and the second gate electrode is referred to as a surrounded channel (S-channel) structure.

The insulating layer 365 and the insulating layer 371 preferably have a function of inhibiting diffusion of hydrogen (e.g., at least one of a hydrogen atom, a hydrogen molecule, and the like). In addition, the insulating layer 365 and the insulating layer 371 preferably have a function of inhibiting diffusion of oxygen (e.g., at least one of an oxygen atom, an oxygen molecule, and the like). For example, the insulating layer 365 and the insulating layer 371 preferably have a function of inhibiting diffusion of one or both of hydrogen and oxygen as compared to the insulating layer 366. The insulating layer 365 and the insulating layer 371 preferably have a function of inhibiting diffusion of one or both of hydrogen and oxygen as compared to the insulating layer 349. The insulating layer 365 and the insulating layer 371 preferably have a function of inhibiting diffusion of one or both of hydrogen and oxygen as compared to the insulating layer 380.

Note that in this specification and the like, a film having a function of inhibiting diffusion of hydrogen or oxygen may be referred to as a film through which hydrogen or oxygen does not pass easily, a film having low permeability of hydrogen or oxygen, a film having a barrier property against hydrogen or oxygen, or a barrier film against hydrogen or oxygen, for example. A barrier film having conductivity is sometimes referred to as a conductive barrier film.

As illustrated in FIG. 25B, the insulating layer 371 is preferably in contact with the top surfaces of the conductive layer 342a and the conductive layer 342b, side surfaces of the conductive layer 342a and the conductive layer 342b other than their side surfaces facing each other, the side surfaces of the semiconductor layer 260a and the semiconductor layer 260b, and the part of the top surface of the insulating layer 366. Accordingly, the insulating layer 380 is isolated from the insulating layer 366, the semiconductor layer 260a, and the semiconductor layer 260b by the insulating layer 371. This can inhibit entry of impurities such as hydrogen contained in the insulating layer 380 and the like into the insulating layer 366, the semiconductor layer 260a, and the semiconductor layer 260b.

As illustrated in FIG. 25B, the transistor 200A has a structure in which the insulating layer 374 is in contact with the top surfaces of the conductive layer 360, the insulating layer 349, and the semiconductor layer 260c. With such a structure, impurities such as hydrogen contained in the insulating layer 381 and the like can be inhibited from entering the insulating layer 349. Thus, adverse effects on the electrical characteristics of the transistor and the reliability of the transistor can be suppressed.

With the above structure, a transistor having a high on-state current can be provided. Alternatively, a transistor having a low off-state current can be provided. Alternatively, a semiconductor device that has small variations in electrical characteristics, stable electrical characteristics, and high reliability can be provided.

Transistor Structure Example 2

Figure 26A:
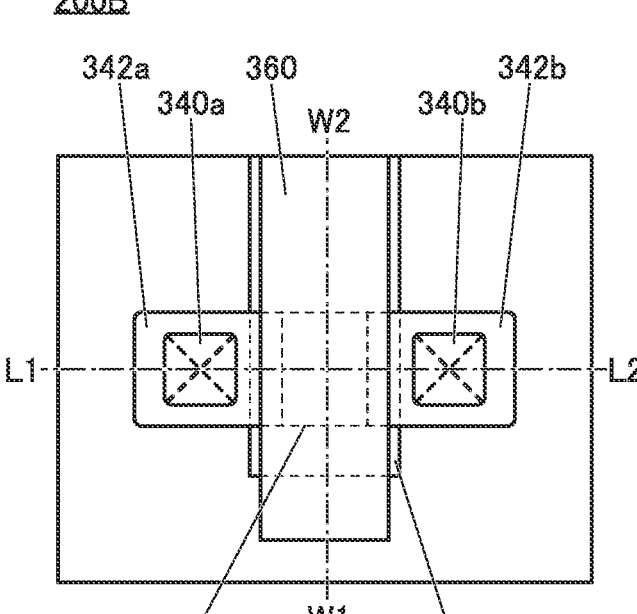
FIG. 26A to FIG. 26C are diagrams illustrating an example of a transistor.
Figure 26C:
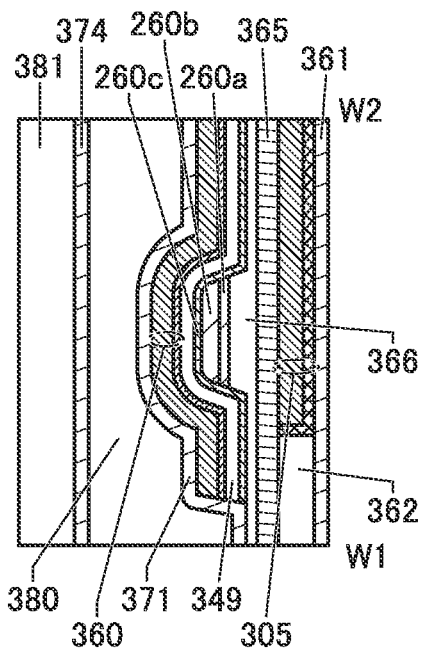
Figure 26B:
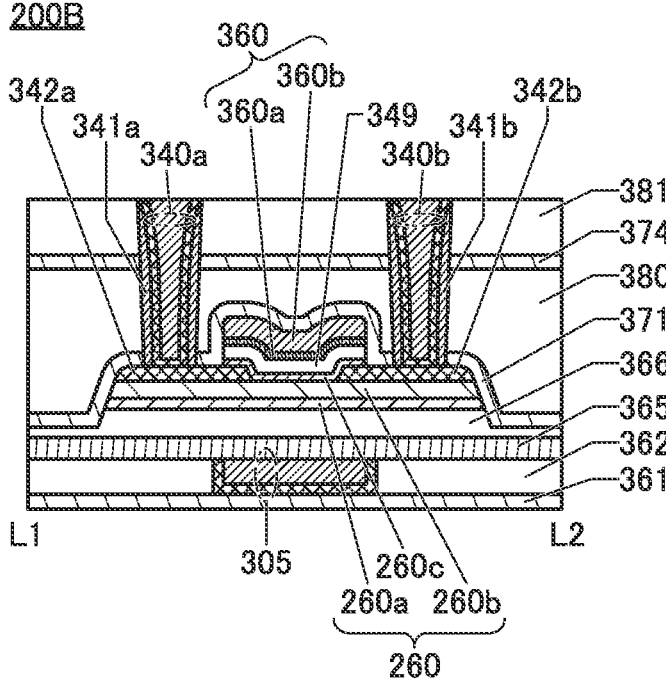

A structure example of the transistor 200B is described with reference to FIG. 26A, FIG. 26B, and FIG. 26C. FIG. 26A is a top view of the transistor 200B. FIG. 26B is a cross-sectional view of a portion indicated by the dashed-dotted line L1-L2 in FIG. 26A. FIG. 26C is a cross-sectional view of a portion indicated by the dashed-dotted line W1-W2 in FIG. 26A. Note that for clarity of the drawing, some components are not illustrated in the top view of FIG. 26A.

The transistor 200B is a variation example of the transistor 200A. Therefore, differences from the transistor 200A are mainly described to avoid repeated description.

The conductive layer 360 functioning as a first gate electrode includes the conductive layer 360a and the conductive layer 360b over the conductive layer 360a. The conductive layer 360a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductive layer 360a has a function of inhibiting oxygen diffusion, the range of choices for the material of the conductive layer 360b can be expanded. That is, the conductive layer 360a inhibits oxidation of the conductive layer 360b, thereby preventing the decrease in conductivity of the conductive layer 360b.

The insulating layer 371 is preferably provided to cover the top surface and the side surface of the conductive layer 360, the side surface of the insulating layer 349, and the side surface of the semiconductor layer 260c. For the insulating layer 371, an insulating material having a function of inhibiting diffusion of oxygen and impurities such as water and hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulating layer 371 can inhibit oxidation of the conductive layer 360. Moreover, the insulating layer 371 can inhibit diffusion of impurities such as water and hydrogen contained in the insulating layer 380 into the transistor 200B.

The transistor 200B has the conductive layer 360 overlapping part of the conductive layer 342a and part of the conductive layer 342b, and thus tends to have larger parasitic capacitance than the transistor 200A. Consequently, the transistor 200B tends to have a lower operating frequency than the transistor 200A. However, the transistor 200B does not require steps of providing an opening in the insulating layer 380 and the like and embedding the conductive layer 360, the insulating layer 349, and the like in the opening; hence, the productivity of the transistor 200B is higher than that of the transistor 200A.

This embodiment can be implemented in an appropriate combination with the structures described in the other embodiments and the like.

Embodiment 5

In this embodiment, electronic components and electronic devices in which the memory device or the semiconductor device according to one embodiment of the present invention can be employed will be described.

The memory device or the semiconductor device according to one embodiment of the present invention can be incorporated in a variety of electronic devices. In particular, the memory device or the semiconductor device according to one embodiment of the present invention can be used as a memory incorporated in an electronic device. Examples of electronic devices include a digital camera, a digital video camera, a digital photo frame, a mobile phone, a portable game console, a portable information terminal, and an audio reproducing device in addition to electronic devices provided with a relatively large screen, such as a television device, a desktop or laptop personal computer, a monitor for a computer and the like, digital signage, and a large game machine like a pachinko machine.

The electronic device of one embodiment of the present invention may include an antenna. When a signal is received by the antenna, the electronic device can display a video, data, or the like on a display portion. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Electronic Components

Figure 27A:
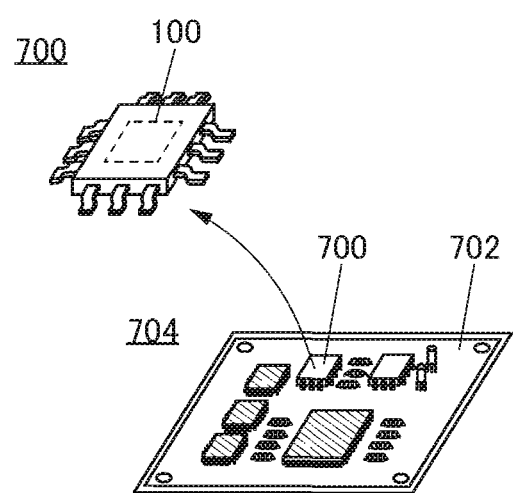
FIG. 27A and FIG. 27B are diagrams each illustrating an electronic component.
Figure 27B:
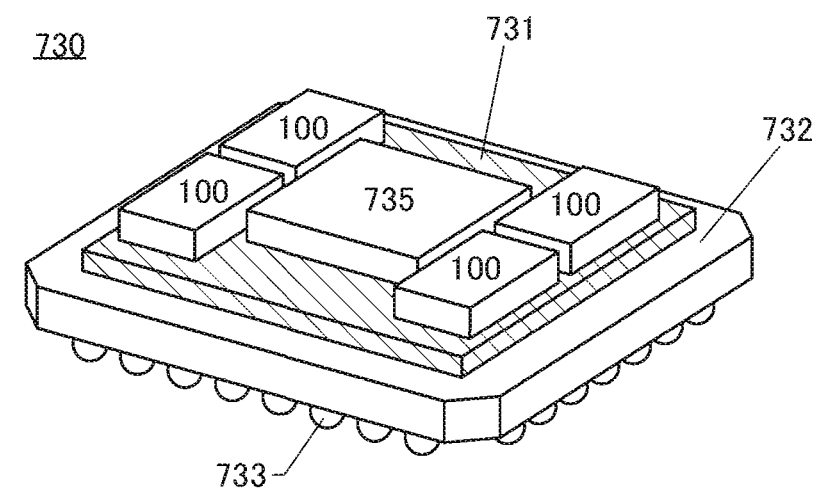

FIG. 27A and FIG. 27B illustrate examples of electronic components including the memory device 100.

FIG. 27A is a perspective view of an electronic component 700 and a substrate (a mounting board 704) on which the electronic component 700 is mounted. The electronic component 700 illustrated in FIG. 27A is an IC semiconductor device and includes a lead and a circuit portion. The electronic component 700 is mounted on a printed circuit board 702, for example. A plurality of such IC semiconductor devices are combined and electrically connected to each other on the printed circuit board 702, whereby the mounting board 704 is completed.

The memory device 100 described in the above embodiment is provided as the circuit portion of the electronic component 700. Although a QFP (Quad Flat Package) is used as the package of the electronic component 700 in FIG. 27A, the mode of the package is not limited thereto.

FIG. 27B is a perspective view of an electronic component 730. The electronic component 730 is an example of a SiP (System in package) or an MCM (Multi-Chip Module). In the electronic component 730, an interposer 731 is provided on a package substrate 732 (a printed circuit board), and a semiconductor device 735 and a plurality of memory devices 100 are provided on the interposer 731.

The electronic component 730 using the memory devices 100 as high bandwidth memory (HBM) is shown as an example. An integrated circuit such as a CPU, a GPU, or an FPGA (Field Programmable Gate Array) can be used as the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings are provided in a single layer or multiple layers. Moreover, the interposer 731 has a function of electrically connecting an integrated circuit provided on the interposer 731 to an electrode provided on the package substrate 732. Accordingly, the interposer is sometimes referred to as a "redistribution substrate" or an "intermediate substrate". A through electrode may be provided in the interposer 731 and used for electrically connecting an integrated circuit and the package substrate 732. For a silicon interposer, a TSV (Through Silicon Via) can also be used as the through electrode.

A silicon interposer is preferably used as the interposer 731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be used for HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, the decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5D mounting) in which a plurality of integrated circuits are arranged on an interposer.

A heat sink (a radiator plate) may be provided to overlap the electronic component 730. In the case of providing a heat sink, the heights of integrated circuits provided on the interposer 731 are preferably equal to each other. For example, in the electronic component 730 described in this embodiment, the heights of the memory device 100 and the semiconductor device 735 are preferably equal to each other.

To mount the electronic component 730 on another substrate, an electrode 733 may be provided on the bottom portion of the package substrate 732. FIG. 27B illustrates an example in which the electrode 733 is formed of a solder ball. When solder balls are provided in a matrix on the bottom portion of the package substrate 732, BGA (Ball Grid Array) mounting can be achieved. Alternatively, the electrode 733 may be formed of a conductive pin. When conductive pins are provided in a matrix on the bottom portion of the package substrate 732, PGA (Pin Grid Array) mounting can be achieved.

The electronic component 730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

Electronic Devices

Next, examples of electronic devices including the above electronic component will be described with reference to FIG. 28 to FIG. 31.

Figure 28:
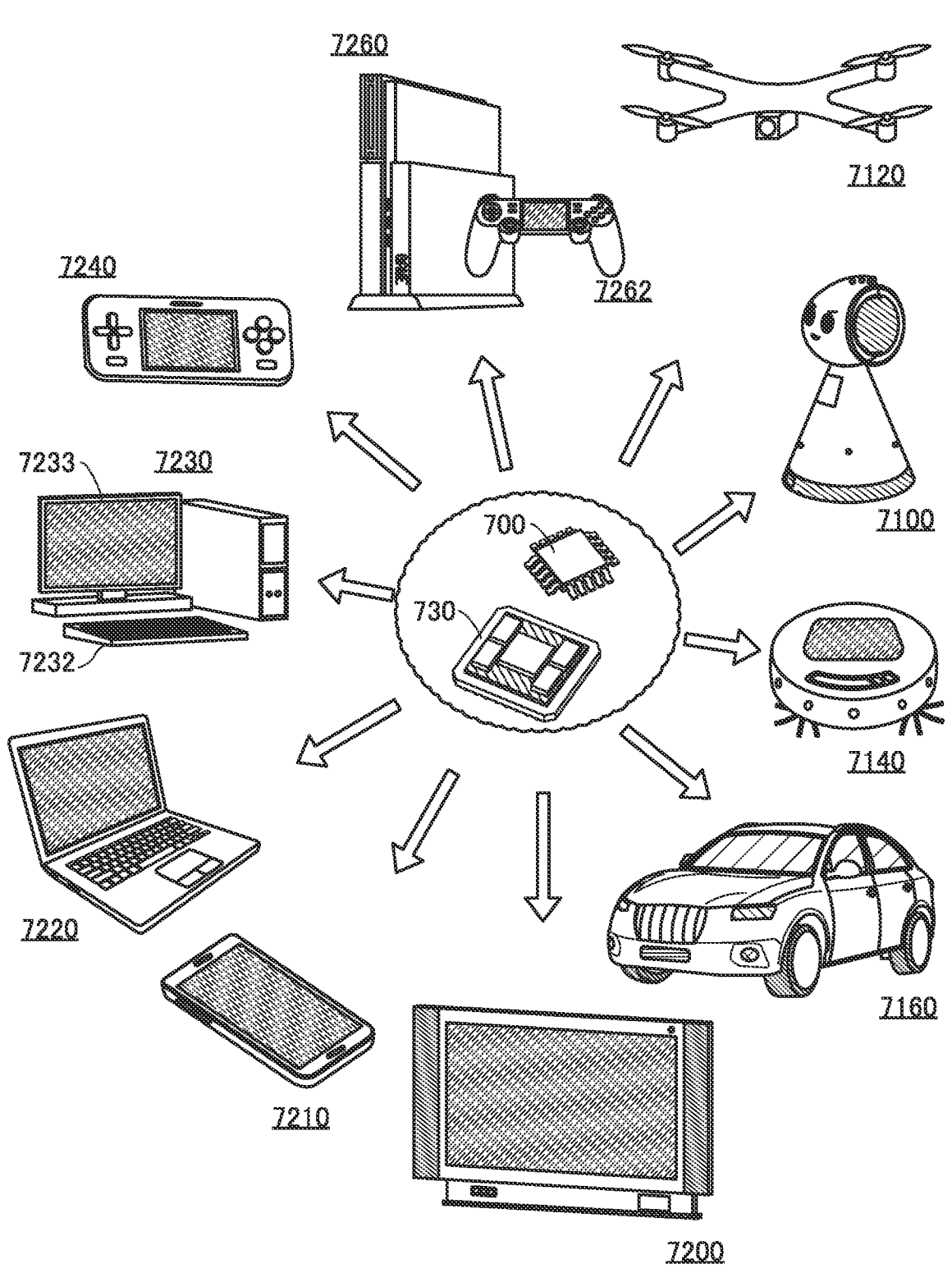
FIG. 28 is a diagram illustrating electronic devices.

A robot 7100 illustrated in FIG. 28 includes an illuminance sensor, a microphone, a camera, a speaker, a display, various kinds of sensors (e.g., an infrared ray sensor, an ultrasonic wave sensor, an acceleration sensor, a piezoelectric sensor, an optical sensor, and a gyro sensor), a moving mechanism, and the like. The electronic component 730 includes a processor or the like and has a function of controlling these peripheral devices. For example, the electronic component 700 has a function of storing data obtained by the sensors.

The microphone has a function of detecting acoustic signals of a speaking voice of a user, an environmental sound, and the like. The speaker has a function of outputting audio signals such as a voice and a warning beep. The robot 7100 can analyze an audio signal input via the microphone and output a necessary audio signal from the speaker. The robot 7100 can communicate with the user using the microphone and the speaker.

The camera has a function of taking images of the surroundings of the robot 7100. The robot 7100 has a function of moving with use of the moving mechanism. The robot 7100 can take images of the surroundings with use of the camera and analyze the images to sense whether there is an obstacle in the way of the movement.

A flying object 7120 includes propellers, a camera, a battery, and the like and has a function of flying autonomously. The electronic component 730 has a function of controlling these peripheral devices.

For example, image data taken by the camera is stored in the electronic component 700. The electronic component 730 can analyze the image data to sense whether there is an obstacle in the way of the movement. Moreover, the electronic component 730 can estimate the remaining battery level from a change in the power storage capacity of the battery.

A cleaning robot 7140 includes a display provided on the top surface, a plurality of cameras provided on the side surface, a brush, an operation button, various kinds of sensors, and the like. Although not illustrated, the cleaning robot 7140 is provided with a tire, an inlet, and the like. The cleaning robot 7140 can run autonomously, detect dust, and vacuum the dust through the inlet provided on the bottom surface.

For example, the electronic component 730 can analyze images taken by the cameras to judge whether there is an obstacle such as a wall, furniture, or a step. In the case where an object that is likely to be caught in the brush, such as a wire, is detected by image analysis, the rotation of the brush can be stopped.

An automobile 7160 is shown as an example of a moving object. The automobile 7160 includes an engine, tires, a brake, a steering gear, a camera, and the like. For example, the electronic component 730 performs control for optimizing the running state of the automobile 7160 on the basis of navigation information, the speed, the state of the engine, the gearshift state, the use frequency of the brake, and other data. For example, image data taken by the camera is stored in the electronic component 700.

Although an automobile is described above as an example of a moving vehicle, a moving vehicle is not limited to an automobile. Other examples of moving objects include a train, a monorail train, a ship, and a flying object (a helicopter, an unmanned aircraft (a drone), an airplane, and a rocket), and these moving objects can include a system utilizing artificial intelligence when equipped with the computer of one embodiment of the present invention.

The electronic component 700 and/or the electronic component 730 can be incorporated in a TV device 7200 (a television receiver), a smartphone 7210, a PC 7220 (a personal computer), a PC 7230, a game machine 7240, a game machine 7260, and the like.

For example, the electronic component 730 incorporated in the TV device 7200 can function as an image processing engine. The electronic component 730 performs, for example, image processing such as noise removal and resolution up-conversion.

The smartphone 7210 is an example of a portable information terminal. The smartphone 7210 includes a microphone, a camera, a speaker, various kinds of sensors, and a display portion. These peripheral devices are controlled by the electronic component 730.

The PC 7220 and the PC 7230 are examples of a laptop PC and a desktop PC. To the PC 7230, a keyboard 7232 and a monitor device 7233 can be connected with or without a wire.

The game machine 7240 is an example of a portable game machine. The game machine 7260 is an example of a home-use stationary game machine. To the game machine 7260, a controller 7262 is connected with or without a wire. The electronic component 700 and/or the electronic component 730 can be incorporated in the controller 7262.

A game machine in which the memory device or the semiconductor device of one embodiment of the present invention is used is not limited to these. Examples of game machines using the memory device or the semiconductor device of one embodiment of the present invention include an arcade game machine installed in entertainment facilities (a game center, an amusement park, and the like) and a throwing machine for batting practice installed in sports facilities.

The memory device or the semiconductor device of one embodiment of the present invention can be used for a variety of removable memory devices such as memory cards (e.g., SD cards), USB memories, and SSDs (solid state drives). FIG. 29 schematically shows some structure examples of removable memory devices. The memory device or the semiconductor device of one embodiment of the present invention can be used for a variety of storage devices and removable memory devices.

Figure 29A:
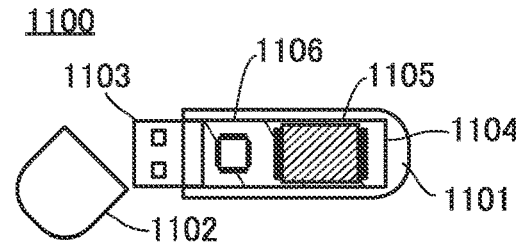
FIG. 29A to FIG. 29E are diagrams illustrating electronic devices.

FIG. 29A is a schematic diagram of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The memory device or the semiconductor device of one embodiment of the present invention can be incorporated into the memory chip 1105 or the like on the substrate 1104.

Figure 29B:
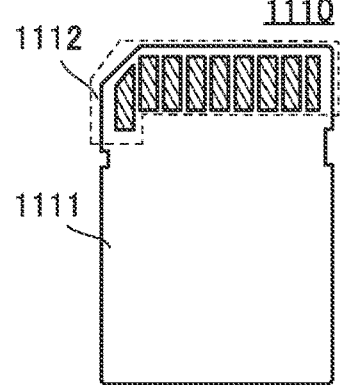
Figure 29C:
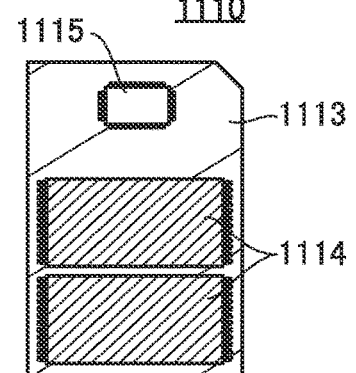

FIG. 29B is a schematic external diagram of an SD card, and FIG. 29C is a schematic diagram of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear surface side of the substrate 1113, the capacity of the SD card 1110 can be increased. In addition, a wireless chip with a radio communication function may be provided on the substrate 1113. With such a wireless chip, data can be read from and written to the memory chip 1114 by radio communication between a host device and the SD card 1110. The memory device or the semiconductor device described in the above embodiment can be incorporated in the memory chip 1114 or the like on the substrate 1113.

Figure 29D:
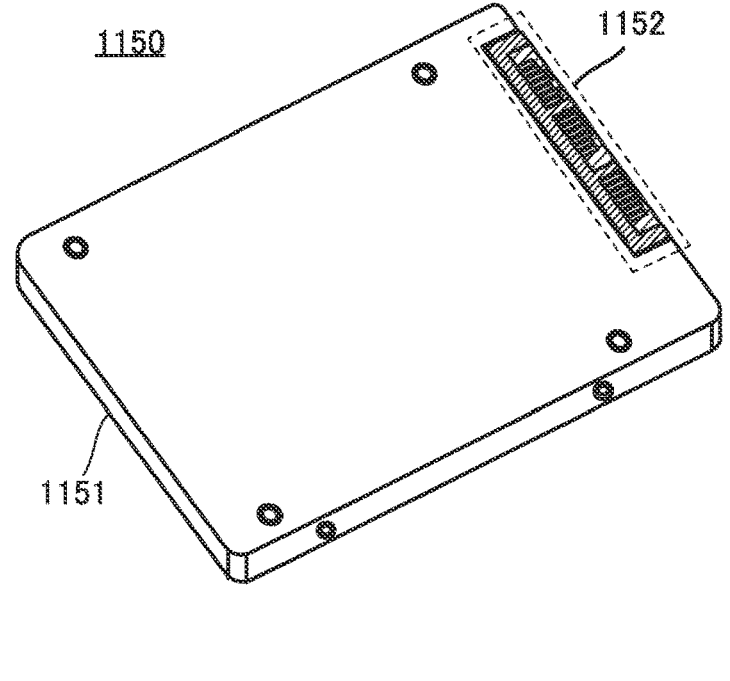
Figure 29E:
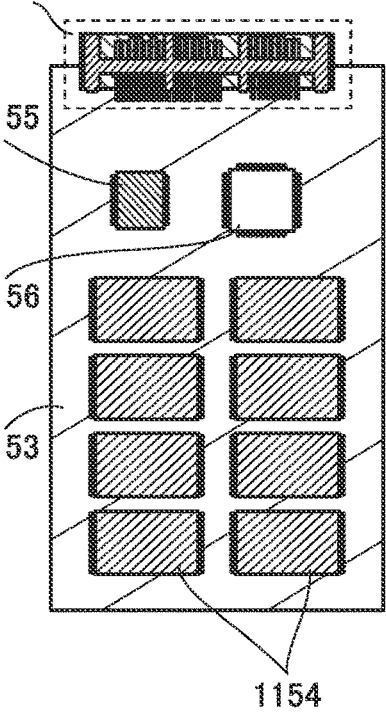

FIG. 29D is a schematic external diagram of an SSD, and FIG. 29E is a schematic diagram of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip may be used, for example. When the memory chip 1154 is also provided on the rear surface side of the substrate 1153, the capacity of the SSD 1150 can be increased. The memory device or the semiconductor device described in the above embodiment can be incorporated in the memory chip 1154 or the like on the substrate 1153.

Figure 30A:
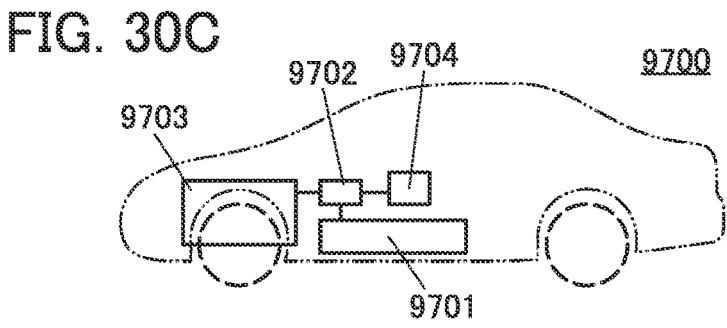

An alarm device 8100 illustrated in FIG. 30A is a residential fire alarm that includes a sensor portion and a semiconductor device 8101. With the use of the electronic component 700 and/or the electronic component 730 in the semiconductor device 8101, the power consumption of the alarm device 8100 can be reduced. In addition, stable operation can be performed even in a high-temperature environment. Thus, the reliability of the alarm device 8100 can be increased.

An air conditioner illustrated in FIG. 30A includes an indoor unit 8200 and an outdoor unit 8204. The indoor unit 8200 includes a housing 8201, an air outlet 8202, a semiconductor device 8203, and the like. Although FIG. 30A illustrates the case where the semiconductor device 8203 is provided in the indoor unit 8200, the semiconductor device 8203 maybe provided in the outdoor unit 8204. Alternatively, the semiconductor device 8203 maybe provided in both the indoor unit 8200 and the outdoor unit 8204. With the use of the electronic component 700 and/or the electronic component 730 in the semiconductor device 8203, the power consumption of the air conditioner can be reduced. In addition, stable operation can be performed even in a high-temperature environment. Thus, the reliability of the air conditioner can be increased.

An electric refrigerator-freezer 8300 illustrated in FIG. 30A includes a housing 8301, a refrigerator door 8302, a freezer door 8303, a semiconductor device 8304, and the like. The semiconductor device 8304 is provided in the housing 8301 in FIG. 30A. With the use of the electronic component 700 and/or the electronic component 730 in the semiconductor device 8304, the power consumption of the electric refrigerator-freezer 8300 can be reduced. In addition, stable operation can be performed even in a high-temperature environment. Thus, the reliability of the electric refrigerator-freezer 8300 can be increased.

Note that in this embodiment, the electric refrigerator-freezer and the air conditioner are described as examples of household appliances. The memory device or the semiconductor device of one embodiment of the present invention can also be used for other household appliances. Other examples of household appliances include a vacuum cleaner, a microwave oven, an electric oven, a rice cooker, a water heater, an IH cooker, a water server, a heating-cooling combination appliance (including an air conditioner), a washing machine, a drying machine, and an audio visual appliance.

FIG. 30B and FIG. 30C illustrate an example of an electric vehicle. An electric vehicle 9700 is equipped with a secondary battery 9701. The output of the electric power of the secondary battery 9701 is adjusted by a control circuit 9702, and the electric power is supplied to a driving device 9703. The control circuit 9702 is controlled by a processing device 9704 including a semiconductor device or the like that is not illustrated. When the electronic component 700 and/or the electronic component 730 are/is used in the control circuit 9702 or the processing device 9704, the power consumption of the electric vehicle 9700 can be reduced. In addition, stable operation can be performed even in a high-temperature environment. Thus, the reliability of the electric vehicle 9700 can be increased.

The driving device 9703 includes a DC motor or an AC motor either alone, or a combination of a motor and an internal-combustion engine. The processing device 9704 outputs a control signal to the control circuit 9702 on the basis of input data such as data on operation (e.g., acceleration, deceleration, and stop) by a driver and data during driving (e.g., data on uphills and downhills and data on a load on driving wheels) of the electric vehicle 9700. The control circuit 9702 adjusts the electric energy supplied from the secondary battery 9701 in accordance with the control signal of the processing device 9704 to control the output of the driving device 9703. In the case where the AC motor is mounted, although not illustrated, an inverter that converts a direct current into an alternate current is also incorporated.

Figure 31A:
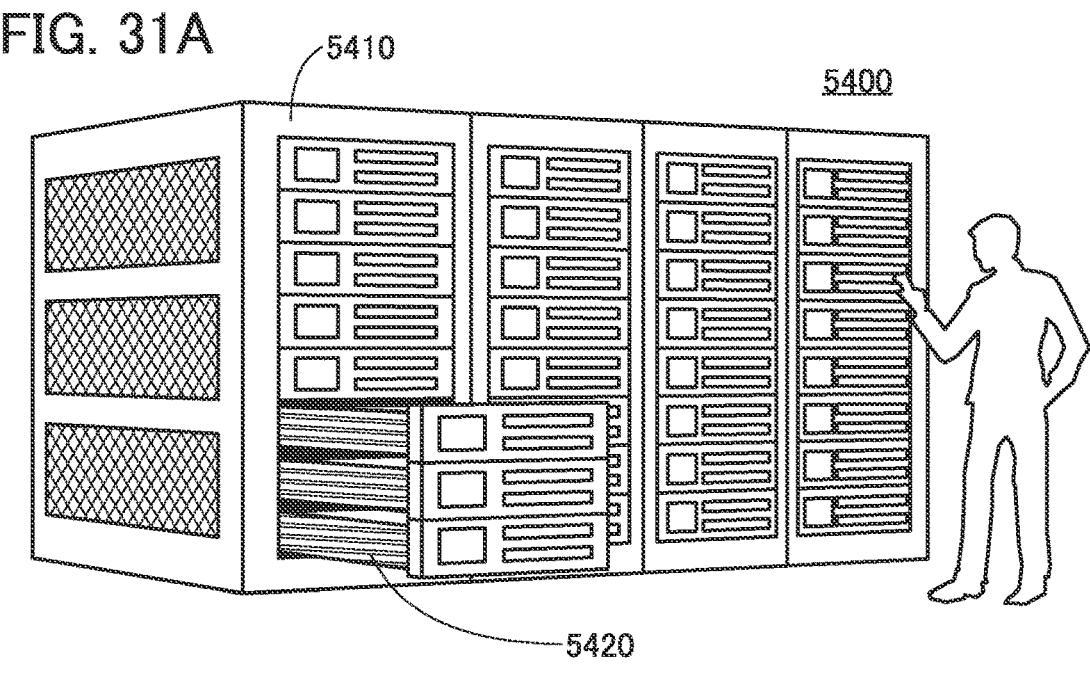
FIG. 31A to FIG. 31C are diagrams illustrating electronic devices.

A computer 5400 illustrated in FIG. 31A is an example of a large computer. In the computer 5400, a plurality of rack mount computers 5420 are stored in a rack 5410.

Figure 31B:
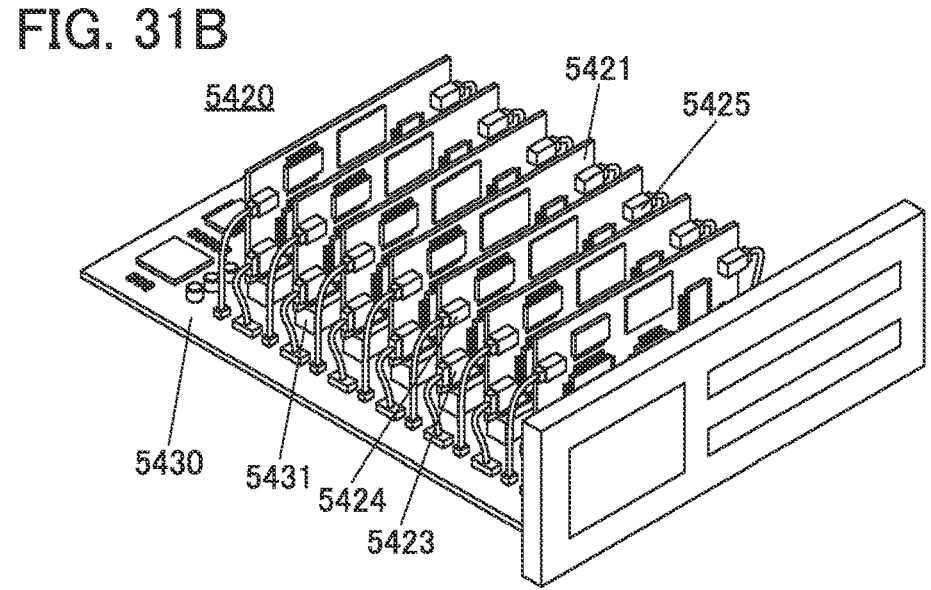

The computer 5420 can have a structure in a perspective view illustrated in FIG. 31B, for example. In FIG. 31B, the computer 5420 includes a motherboard 5430, and the motherboard includes a plurality of slots 5431, a plurality of connection terminals, and the like. A PC card 5421 is inserted in the slot 5431. In addition, the PC card 5421 includes a connection terminal 5423, a connection terminal 5424, and a connection terminal 5425, each of which is connected to the motherboard 5430.

Figure 31C:
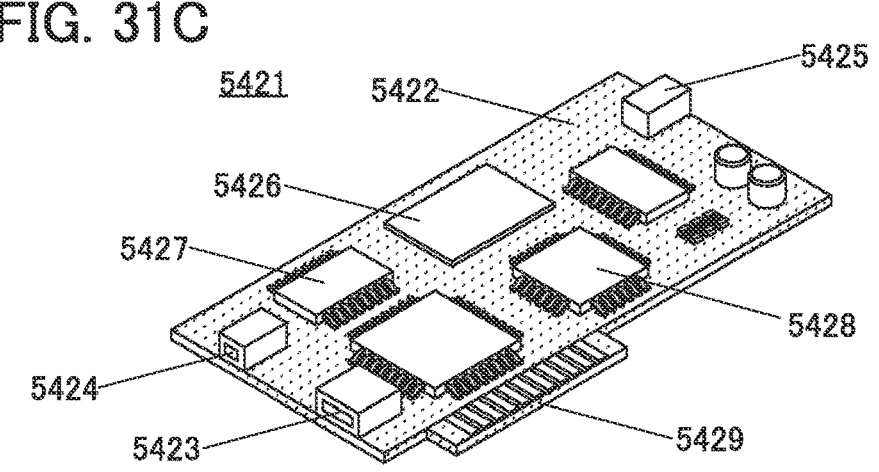

The PC card 5421 illustrated in FIG. 31C is an example of a processing board provided with a CPU, a GPU, a memory device, and the like. The PC card 5421 includes a board 5422. The board 5422 includes a connection terminal 5423, a connection terminal 5424, a connection terminal 5425, a semiconductor device 5426, a semiconductor device 5427, a semiconductor device 5428, and a connection terminal 5429. FIG. 31C also illustrates semiconductor devices other than the semiconductor device 5426, the semiconductor device 5427, and the semiconductor device 5428; the following description of the semiconductor device 5426, the semiconductor device 5427, and the semiconductor device 5428 can be referred to for these semiconductor devices.

The connection terminal 5429 has a shape with which the connection terminal 5429 can be inserted in the slot 5431 of the motherboard 5430, and the connection terminal 5429 functions as an interface for connecting the PC card 5421 and the motherboard 5430. An example of the standard for the connection terminal 5429 is PCIe.

The connection terminal 5423, the connection terminal 5424, and the connection terminal 5425 can serve, for example, as an interface for performing power supply, signal input, or the like to the PC card 5421. As another example, they can serve as an interface for outputting a signal calculated by the PC card 5421, for instance. Examples of the standard for each of the connection terminal 5423, the connection terminal 5424, and the connection terminal 5425 include USB (Universal Serial Bus), SATA (Serial ATA), and SCSI (Small Computer System Interface). In the case where video signals are output from the connection terminal 5423, the connection terminal 5424, and the connection terminal 5425, an example of the standard therefor is HDMI (registered trademark).

The semiconductor device 5426 includes a terminal (not illustrated) for inputting and outputting signals, and when the terminal is inserted in a socket (not illustrated) of the board 5422, the semiconductor device 5426 and the board 5422 can be electrically connected to each other.

The semiconductor device 5427 includes a plurality of terminals, and when the terminals are reflow-soldered, for example, to wirings of the board 5422, the semiconductor device 5427 and the board 5422 can be electrically connected to each other. Examples of the semiconductor device 5427 include an FPGA, a GPU, and a CPU. As the semiconductor device 5427, the electronic component 730 can be used.

The semiconductor device 5428 includes a plurality of terminals, and when the terminals are reflow-soldered, for example, to wirings of the board 5422, the semiconductor device 5428 and the board 5422 can be electrically connected to each other. An example of the semiconductor device 5428 is a memory device. As the semiconductor device 5428, the electronic component 700 can be used.

The computer 5400 can also function as a parallel computer. When the computer 5400 is used as a parallel computer, large-scale computation necessary for artificial intelligence learning and inference can be performed, for example.

The memory device or the semiconductor device of one embodiment of the present invention is used in a variety of electronic devices described above, whereby a reduction in size, an increase in speed, or a reduction in power consumption of the electronic devices can be achieved. Moreover, heat generation from a circuit can be reduced owing to low power consumption; thus, the influence of heat generation on the circuit, the peripheral circuit, and the module can be reduced. In addition, stable operation can be performed even in a high-temperature environment. Thus, the reliability of the electronic devices can be increased.

This embodiment can be implemented in an appropriate combination with the structures described in the other embodiments and the like.

REFERENCE NUMERALS

10: memory cell, 100: memory device, 110: electrode, 111: input/output circuit, 112: control circuit, 113: C receiver, 114: setting register, 115: LVDS circuit, 116: LVDS circuit, 117: decoder, 118: register, 119: register, 120: electrode, 127: sense amplifier, 130: insulating layer, 152: electrode, 153: electrode, 154: insulating layer, 156: insulating layer, 200: transistor, 210: memory block array, 211: memory block, 212: word line driver, 213: local sense amplifier driver, 214: local sense amplifier array, 215: global sense amplifier, 216: selector, 218: negative voltage generator circuit, 220: capacitor, 221: cell array, 223: sub cell array

The invention claimed is:

1. A memory device comprising a cell array, the cell array comprising:

a first sub cell array including a first memory cell and a second memory cell; and a second sub cell array including a third memory cell, wherein the first memory cell includes a first transistor, the second memory cell includes a second transistor, and the third memory cell includes a third transistor, wherein the second transistor is closest to the first transistor among the other transistors in the first sub cell array, and the third transistor is closest to the second transistor among the other transistors in the second sub cell array, wherein a shortest distance between a gate electrode of the second transistor and a gate electrode of the third transistor is larger than a shortest distance between a gate electrode of the first transistor and the gate electrode of the second transistor, wherein the first transistor, the second transistor, and the third transistor are connected to a same word line, and wherein the shortest distance between the gate electrode of the second transistor and the gate electrode of the third transistor is 3.5 μm or less.

2. The memory device according to claim 1, wherein each of the first transistor, the second transistor, and the third transistor includes a first oxide layer, a second oxide layer over the first oxide layer, a source electrode and a drain electrode over the second oxide layer, a third oxide layer between the source electrode and the drain electrode, a first insulating layer over the third oxide layer, and a first conductive layer over the first insulating layer.

3. The memory device according to claim 2, further comprising a second conductive layer below the first oxide layer.

4. The memory device according to claim 1, wherein a retention potential of each of the first memory cell, the second memory cell, and the third memory cell is 0.6 V or higher.

5. The memory device according to claim 1, wherein the shortest distance between the gate electrode of the first transistor and the gate electrode of the second transistor is 2.5 μm or less.

6. A memory device comprising a cell array, the cell array comprising:

a first sub cell array including a first memory cell and a second memory cell;

a second sub cell array including a third memory cell; and a dummy memory cell provided between the second memory cell and the third memory cell, wherein the first memory cell includes a first transistor, the second memory cell includes a second transistor, and the third memory cell includes a third transistor, wherein the second transistor is closest to the first transistor among the other transistors in the first sub cell array, and the third transistor is closest to the second transistor among the other transistors in the second sub cell array, wherein a shortest distance between a gate electrode of the second transistor and a gate electrode of the third transistor is larger than a shortest distance between a gate electrode of the first transistor and the gate electrode of the second transistor, wherein the first transistor, the second transistor, and the third transistor are connected to a same word line, and wherein the shortest distance between the gate electrode of the second transistor and the gate electrode of the third transistor is 3.5 μm or less.

7. The memory device according to claim 6, wherein each of the first transistor, the second transistor, and the third transistor includes a first oxide layer, a second oxide layer over the first oxide layer, a source electrode and a drain electrode over the second oxide layer, a third oxide layer between the source electrode and the drain electrode, a first insulating layer over the third oxide layer, and a first conductive layer over the first insulating layer.

8. The memory device according to claim 7, further comprising a second conductive layer below the first oxide layer.

9. The memory device according to claim 6, wherein a retention potential of each of the first memory cell, the second memory cell, and the third memory cell is 0.6 V or higher.

10. The memory device according to claim 6, wherein the shortest distance between the gate electrode of the first transistor and the gate electrode of the second transistor is 2.5 μm or less.

* * * * *